US012635195B2

(12) United States Patent
Tung et al.

(10) Patent No.: US 12,635,195 B2
(45) Date of Patent: May 19, 2026

(54) SEMICONDUCTOR STRUCTURE WITH DIELECTRIC WALL STRUCTURE AND METHOD FOR MANUFACTURING THE SAME

(71) Applicant: Taiwan Semiconductor Manufacturing Company, Ltd., Hsinchu (TW)

(72) Inventors: Yu-Lung Tung, Kaohsiung City (TW); Xiaodong Wang, Hsinchu City (TW); Jhon-Jhy Liaw, Zhudong Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 425 days.

(21) Appl. No.: 18/318,393

(22) Filed: May 16, 2023

(65) Prior Publication Data

US 2024/0387632 A1 Nov. 21, 2024

(51) Int. Cl.
| | |
|---|---|
| *H01L 29/06* | (2006.01) |
| *H01L 21/8238* | (2006.01) |
| *H01L 27/092* | (2006.01) |
| *H01L 29/423* | (2006.01) |
| *H01L 29/66* | (2006.01) |
| *H01L 29/775* | (2006.01) |

(Continued)

(52) U.S. Cl.
CPC ......... *H10D 62/121* (2025.01); *H10D 30/014* (2025.01); *H10D 30/43* (2025.01); *H10D 30/6735* (2025.01); *H10D 30/6757* (2025.01); *H10D 64/017* (2025.01); *H10D 84/0167*

(2025.01); *H10D 84/0188* (2025.01); *H10D 84/038* (2025.01); *H10D 84/85* (2025.01)

(58) Field of Classification Search
CPC .... H10D 62/121; H10D 30/014; H10D 30/43; H10D 30/6735; H10D 30/6757; H10D 64/017; H10D 84/0167; H10D 84/0188; H10D 84/038; H10D 84/85; H10D 84/0128; H10D 84/0151; H10D 84/83; H10D 84/8311
USPC ........................................................ 257/347
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |

(Continued)

*Primary Examiner* — Tong-Ho Kim
(74) *Attorney, Agent, or Firm* — Cooper Legal Group, LLC

(57) ABSTRACT

Semiconductor structures and methods for manufacturing the same are provided. The semiconductor structure includes a first well region, a second well region, a third well region, and a fourth well region. The semiconductor structure includes a dielectric wall structure formed over a boundary of the first well region and the second well region and longitudinally oriented along a first direction and first channel structures, second channel structures, third channel structures, and fourth channel structures vertically suspended. In addition, the first channel structures are attached to a first sidewall surface of the dielectric wall structure, and the second channel structures are attached to a second sidewall surface of the dielectric wall structure. Furthermore, the second channel structures have a second width in the second direction, the third channel structures have a third width in the second direction, and the second width is greater than the third width.

20 Claims, 58 Drawing Sheets

(51) Int. Cl.

| | |
|---|---|
| *H01L 29/786* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |
| *H10D 84/01* | (2025.01) |
| *H10D 84/03* | (2025.01) |
| *H10D 84/85* | (2025.01) |

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2021/0202465 A1* | 7/2021 | Wang | H10D 30/031 |
| 2021/0343600 A1* | 11/2021 | Chen | H10D 30/6757 |
| 2022/0238717 A1* | 7/2022 | Ju | H10D 64/667 |

* cited by examiner

SEMICONDUCTOR STRUCTURE WITH DIELECTRIC WALL STRUCTURE AND METHOD FOR MANUFACTURING THE SAME

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIG. 1D-1 illustrates a diagrammatic top view of the intermediate stage of manufacturing the semiconductor structure shown in FIG. 1D in accordance with some embodiments.

FIGS. 2A-1 to 2M-1 illustrate the cross-sectional views of the intermediate stages of manufacturing the semiconductor structure shown along lines $Y_{SD}$-$Y_{SD}$' in FIG. 1D-1 in accordance with some embodiments.

FIGS. 2A-2 to 2M-2 illustrate the cross-sectional views of the intermediate stages of manufacturing the semiconductor structure shown along lines $Y_{MG}$-$Y_{MG}$' in FIG. 1D-1 in accordance with some embodiments.

FIGS. 2A-3 to 2M-3 illustrate the cross-sectional views of the intermediate stages of manufacturing the semiconductor structure shown along lines $X_{104-1}$-$X_{104-1}$' in FIG. 1D-1 in accordance with some embodiments.

FIG. 2M-4 illustrates the top view of the semiconductor structure in accordance with some embodiments.

FIGS. 6A-1 to 6C-1 illustrate the top views of the intermediate stages of manufacturing a semiconductor structure in accordance with some embodiments.

FIGS. 6A-2 to 6C-2 illustrate the cross-sectional views of the intermediate stages of manufacturing the semiconductor structure shown along lines $X_{108'-1d-1}$-$X_{108'-1d-1}$' in FIGS. 6A-1 to 6C-1 in accordance with some embodiments.

FIG. 6C-3 illustrates the cross-sectional view of the semiconductor structure shown along lines $X_{108'-1d-2}$-$X_{108'-1d-2}$' in FIG. 6C-1 in accordance with some embodiments.

FIG. 6C-4 illustrates the cross-sectional view of the semiconductor structure shown along lines $X_{108'-3d-1}$-$X_{108'-3d-1}$' in FIG. 6C-1 in accordance with some embodiments.

FIG. 6C-5 illustrates the cross-sectional view of the semiconductor structure shown along lines $X_{108'-3d-2}$-$X_{108'-3d-2}$' in FIG. 6C-1 in accordance with some embodiments.

DETAILED DESCRIPTION

Figure 1A:
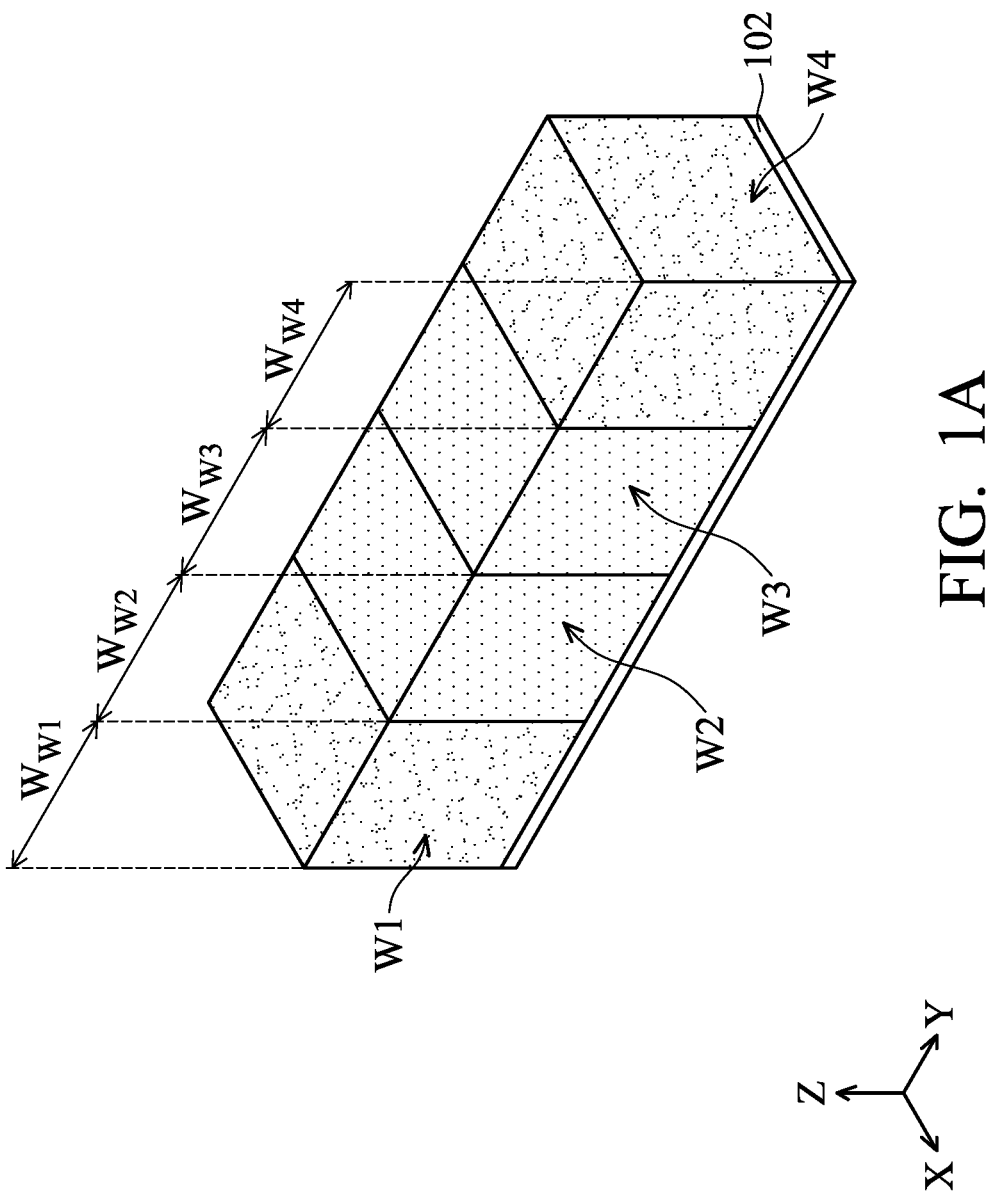
FIGS. 1A to 1D illustrate diagrammatic perspective views of the intermediate stages of manufacturing a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The nanostructure transistors (e.g. nanosheet transistors, nanowire transistors, multi-bridge channel transistors, nano-ribbon FET, forksheet structures, and gate all around (GAA) transistors) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructures.

Embodiments of semiconductor structures and methods for forming the same are provided. The semiconductor structures may include a first type of channel structures (e.g. forksheet structures) and a second type of channel structures (e.g. nanosheet structures). The first type of channel structures may be attached to dielectric wall structures as the isolation for the neighboring channel structures. Accordingly, the distance between the neighboring channel structures may be reduced, and therefore there may be greater spaces for forming the channel structures. The resulting transistors may therefore have an improved speed.

On the other hand, the second type of channel structures may not have dielectric wall structures to separate the neighboring channel structures. Therefore, the isolation structure formed between the channel structures of the second type of channel structures may be larger than that formed in the first type of channel structures, and the spaces for forming the channel structure may become smaller than that in the first type of channel structures. Meanwhile, since the channel structures in the second type of channel structures may be small, and the resulting transistors may require relatively low power consumption. Accordingly, by forming both the first type and the second type of channel structures in the same substrate, both of the transistors with greater speed and the transistors required lower power may be provided.

Figure 1B:
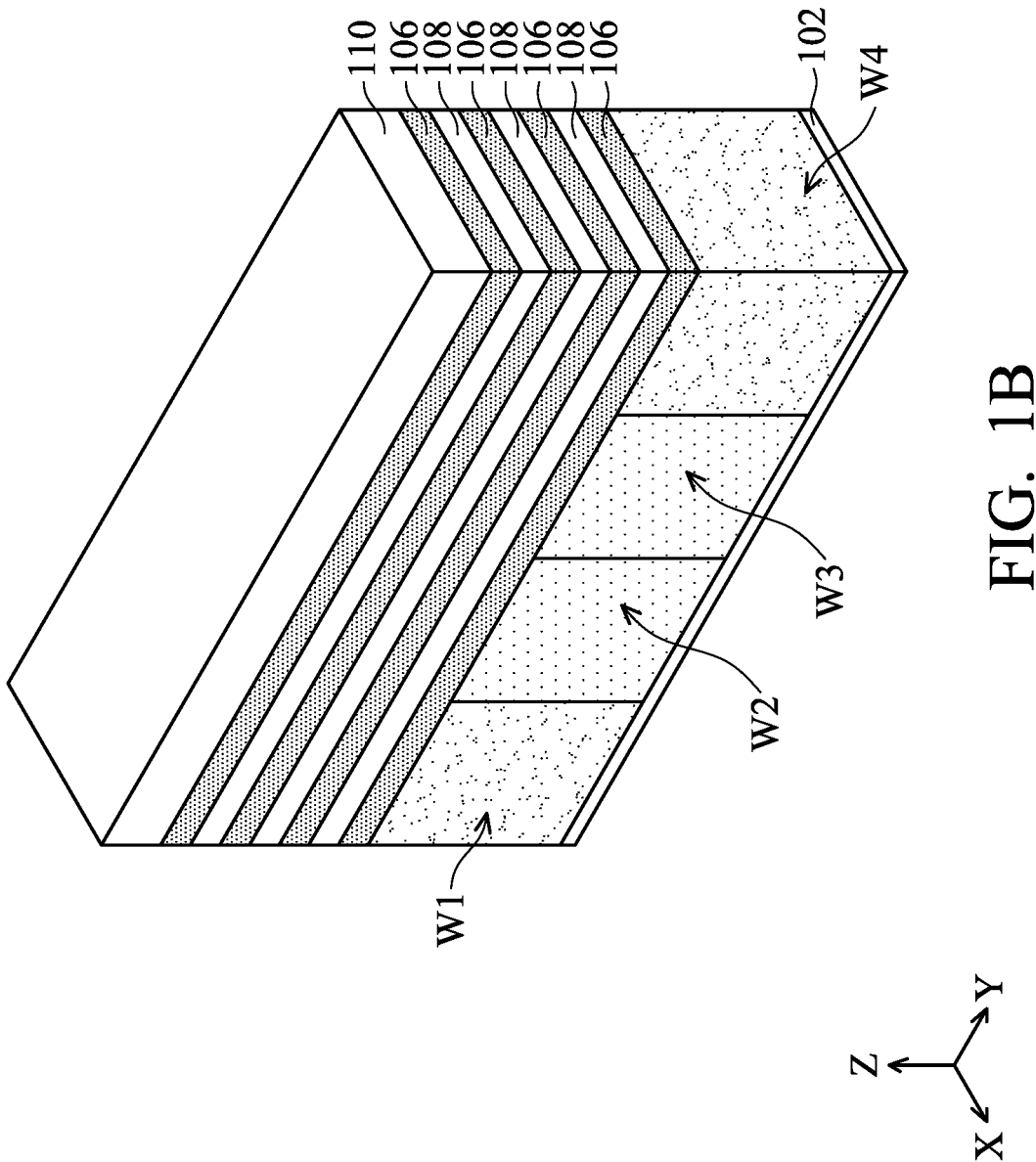
Figure 1C:
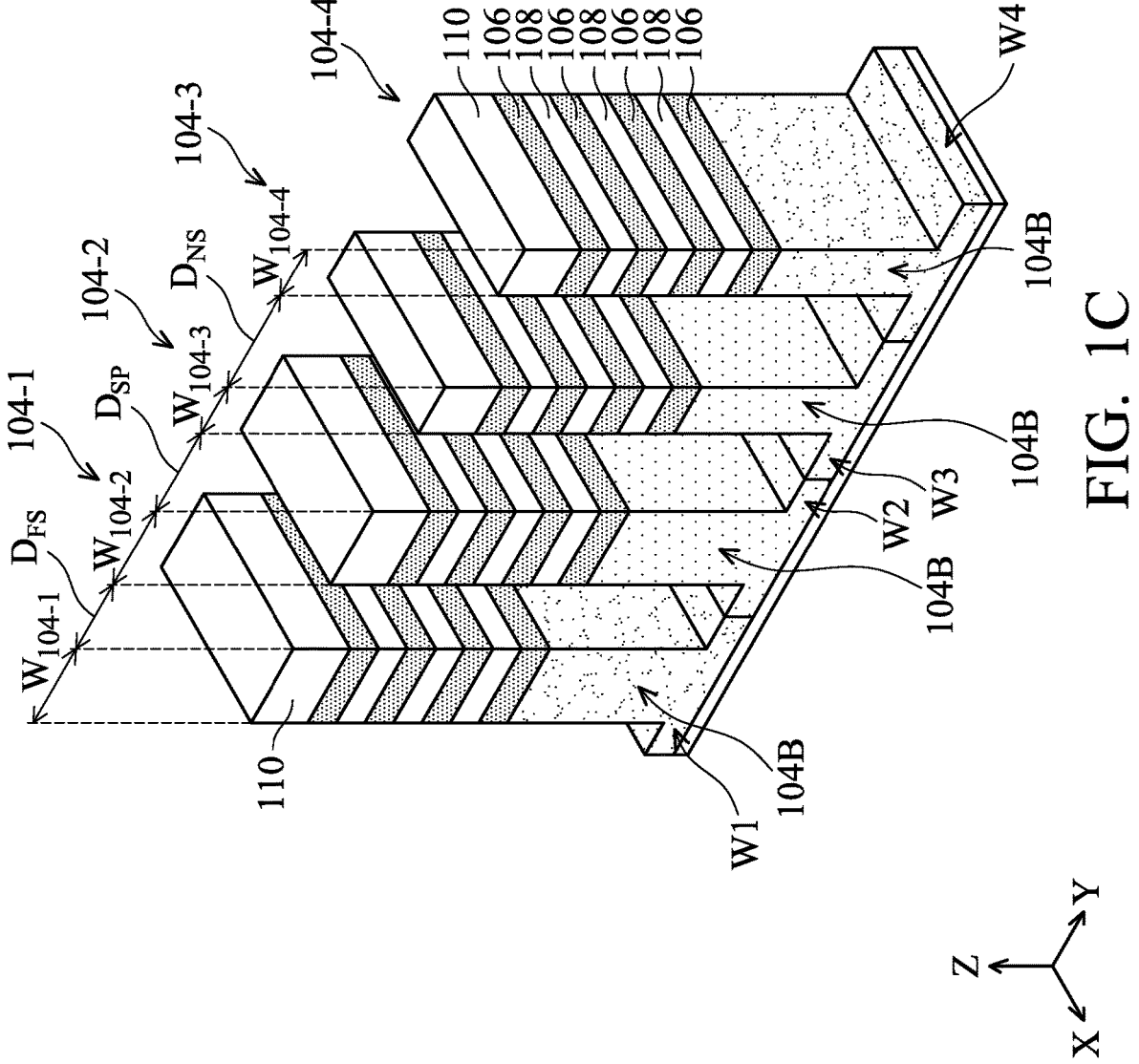
Figure 1D:
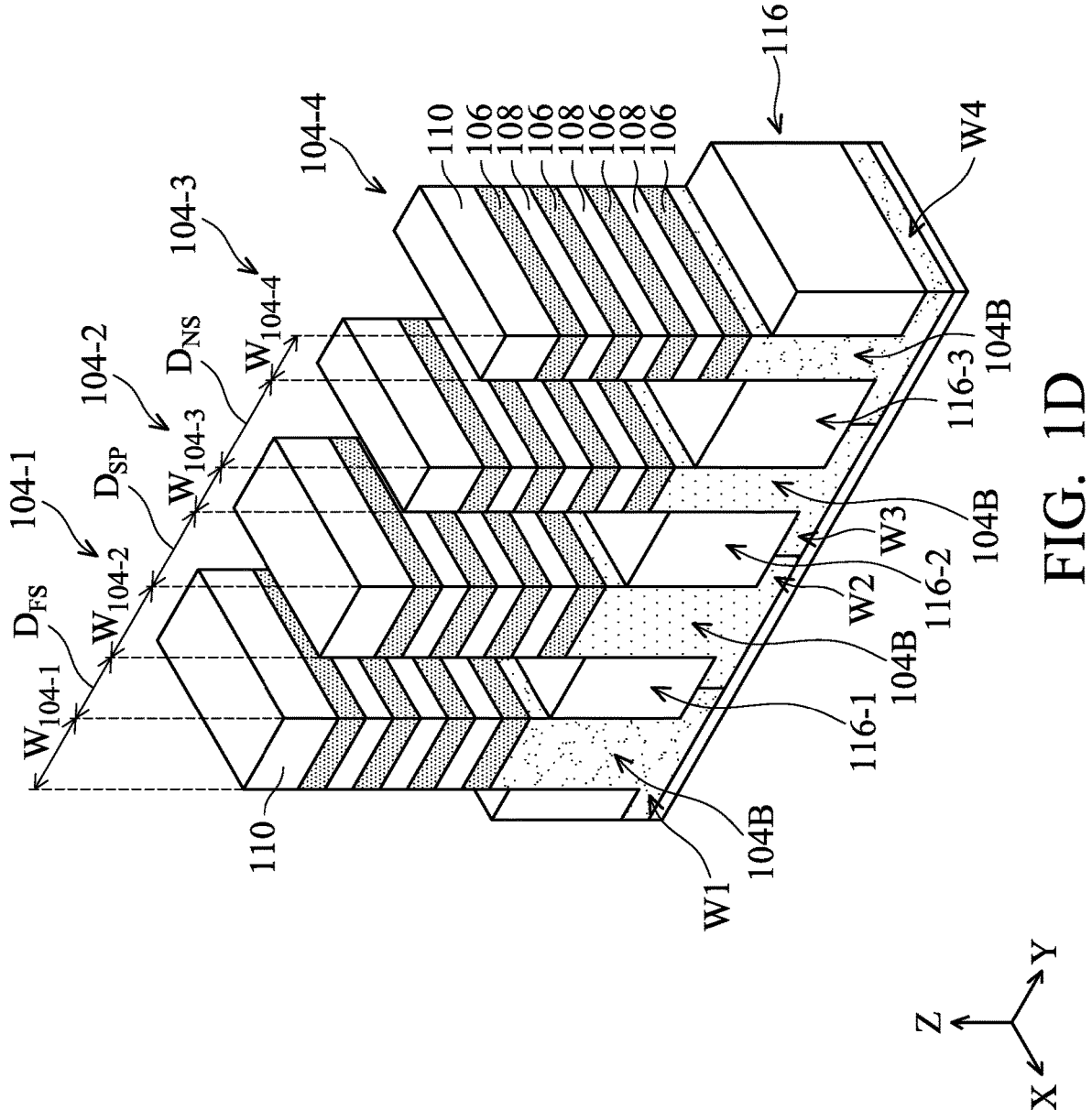
Figures 1, 1D:
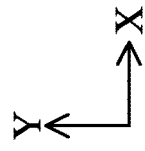

FIGS. 1A to 1D illustrate diagrammatic perspective views of the intermediate stages of manufacturing a semiconductor structure 100 in accordance with some embodiments. FIG. 1D-1 illustrates a diagrammatic top view of the intermediate stage of manufacturing the semiconductor structure 100 shown in FIG. 1D in accordance with some embodiments. FIGS. 2A-1, 2A-2, and 2A-3 illustrate the cross-sectional views of the intermediate stage of the semiconductor structure 100 shown in FIGS. 1D and 1D-1, and FIGS. 2B-1 to 2M-1, 2B-2 to 2M-2, and 2B-3 to 2M-3 illustrate the cross-sectional views of the intermediate stages of manufacturing the semiconductor structure 100 afterwards in accordance with some embodiments.

Figures 1, 2, 2A:
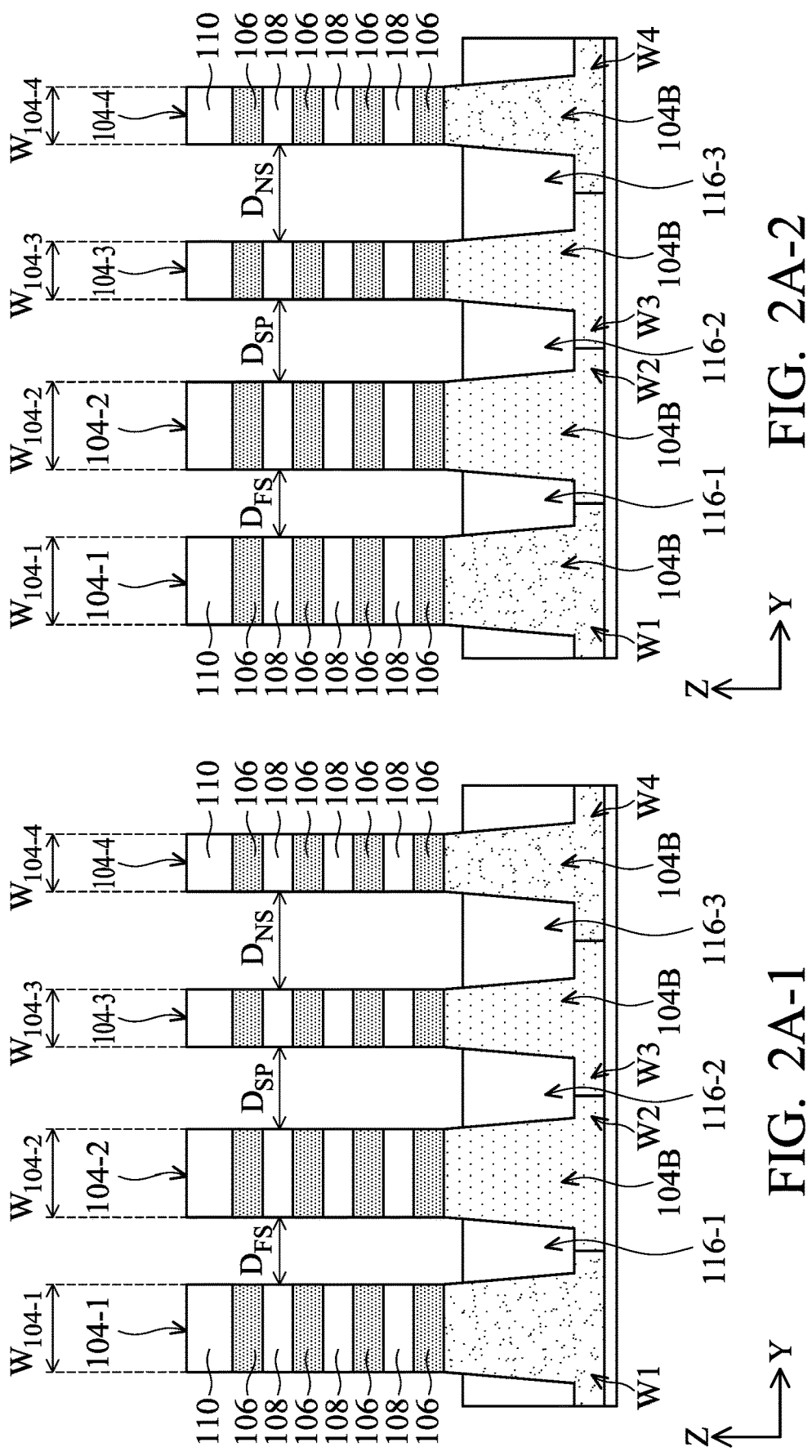
Figures 2, 2A, 3:
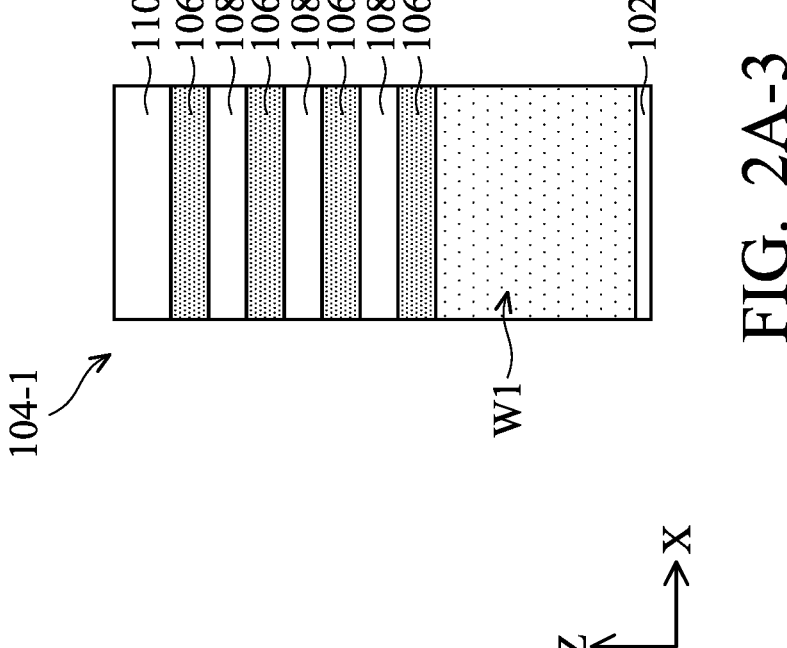
Figures 1, 2, 2B:
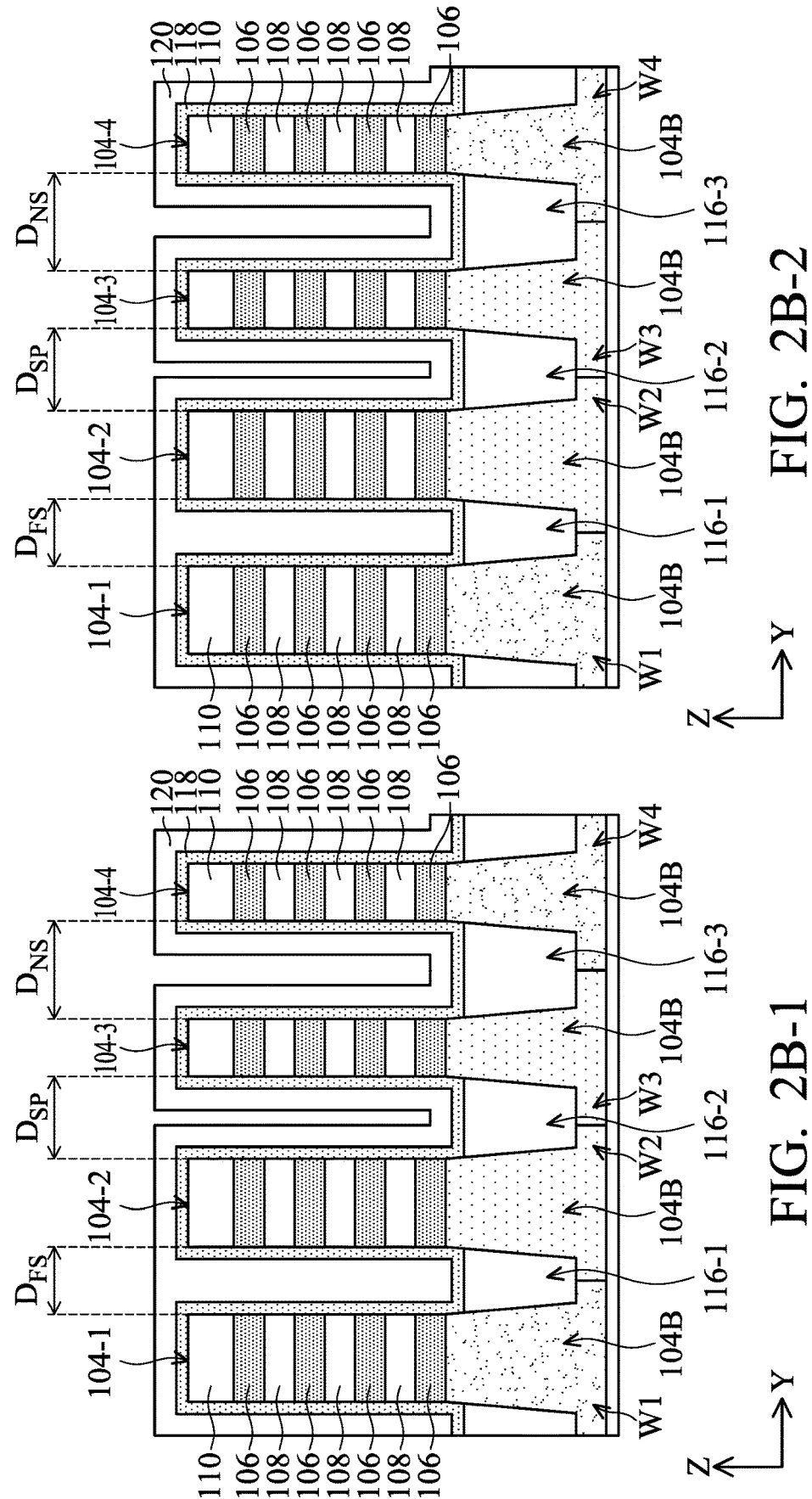
Figures 2, 2B, 3:
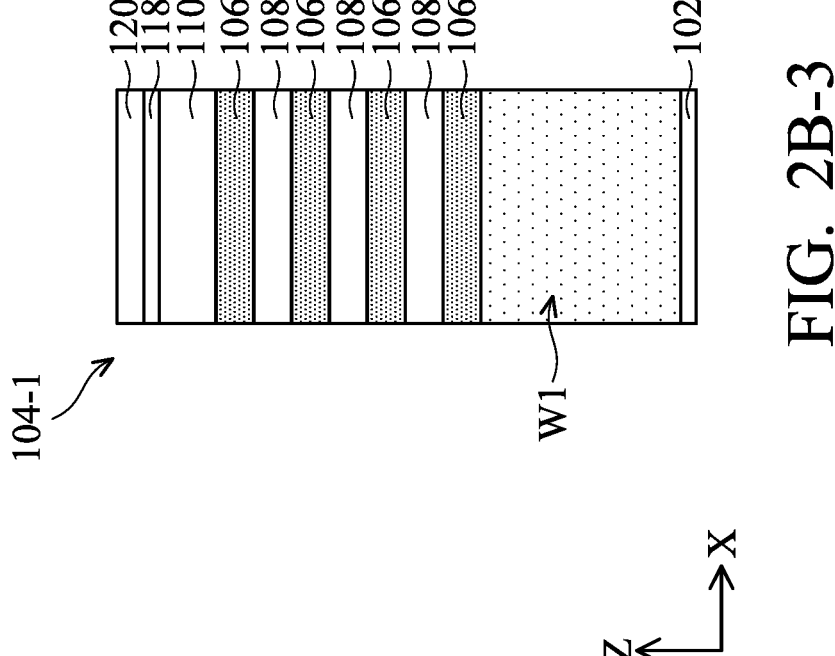
Figures 1, 2, 2C:
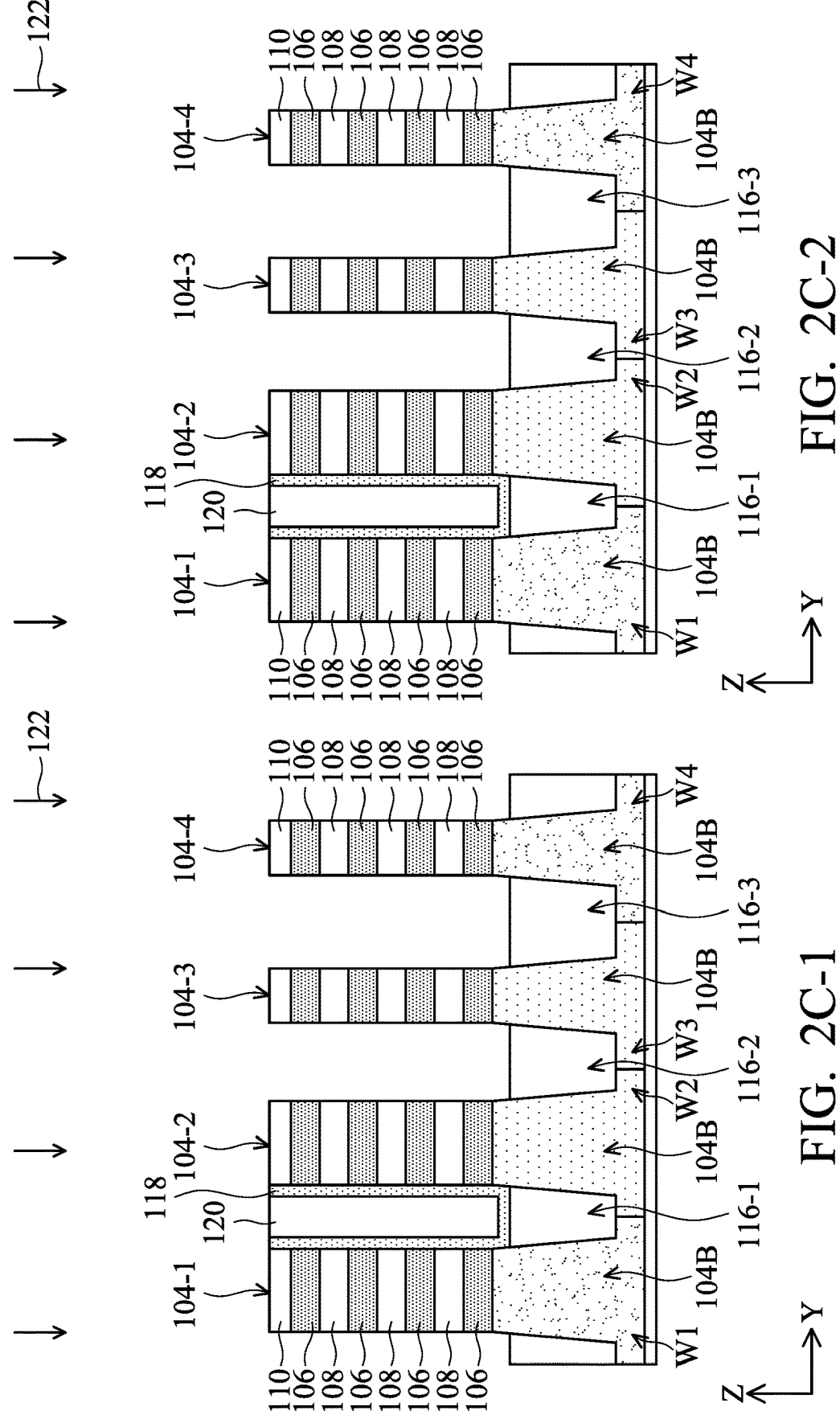
Figures 2, 2C, 3:
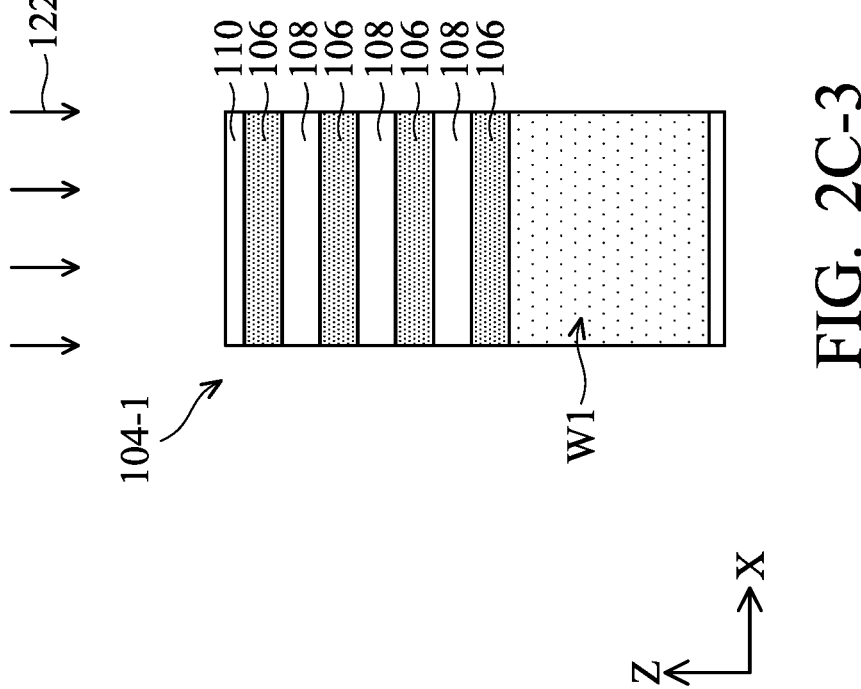
Figures 1, 2, 2D:
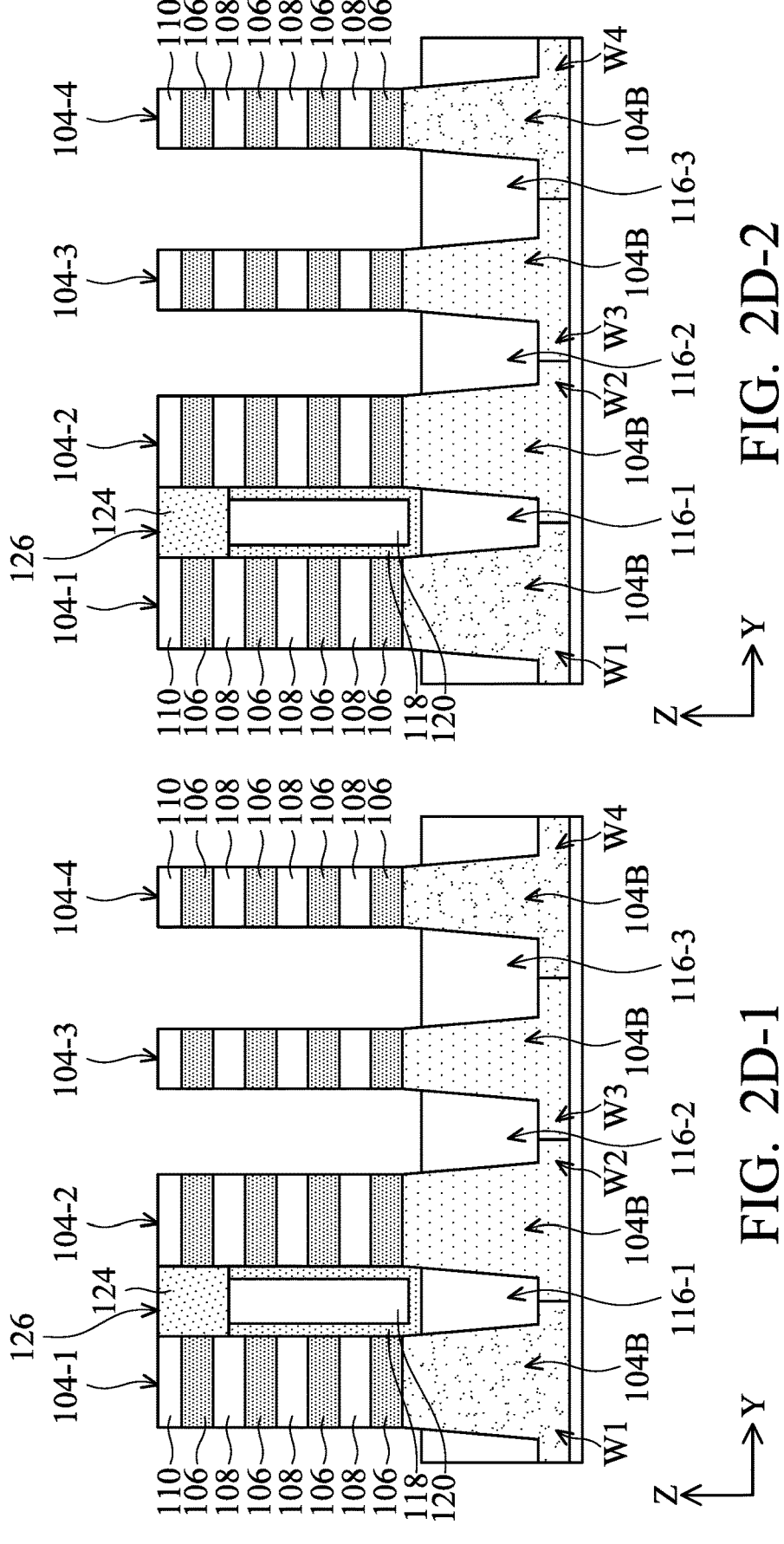
Figures 2, 2D, 3:
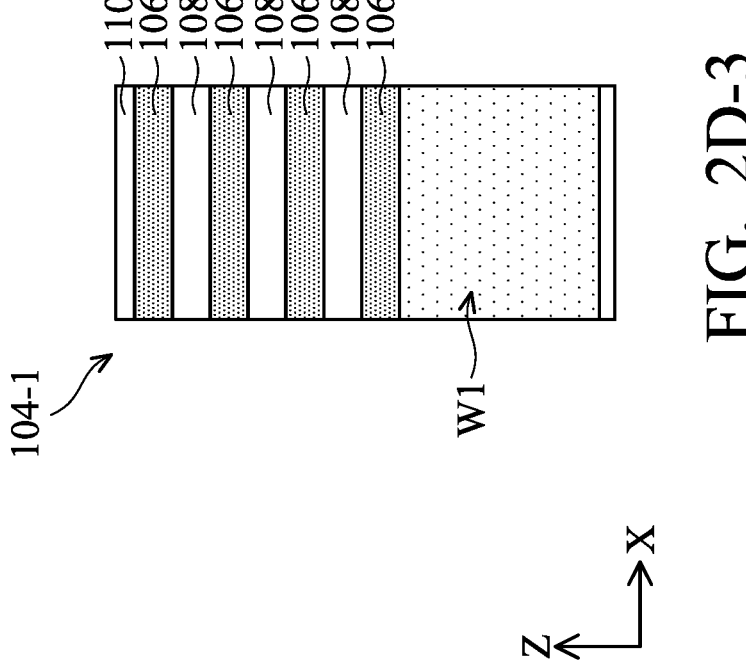
Figures 1, 2, 2E:
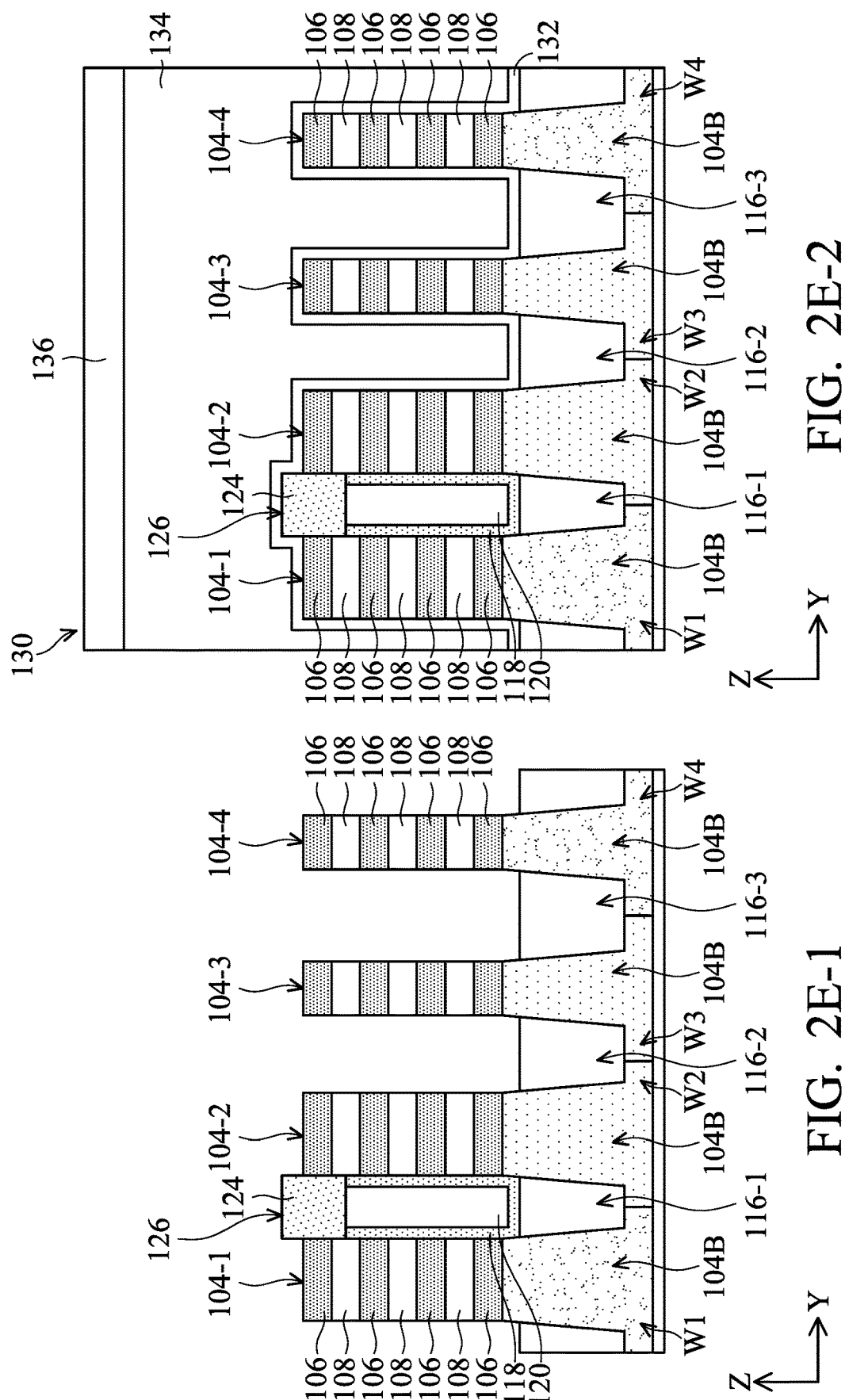
Figures 2, 2E, 3:
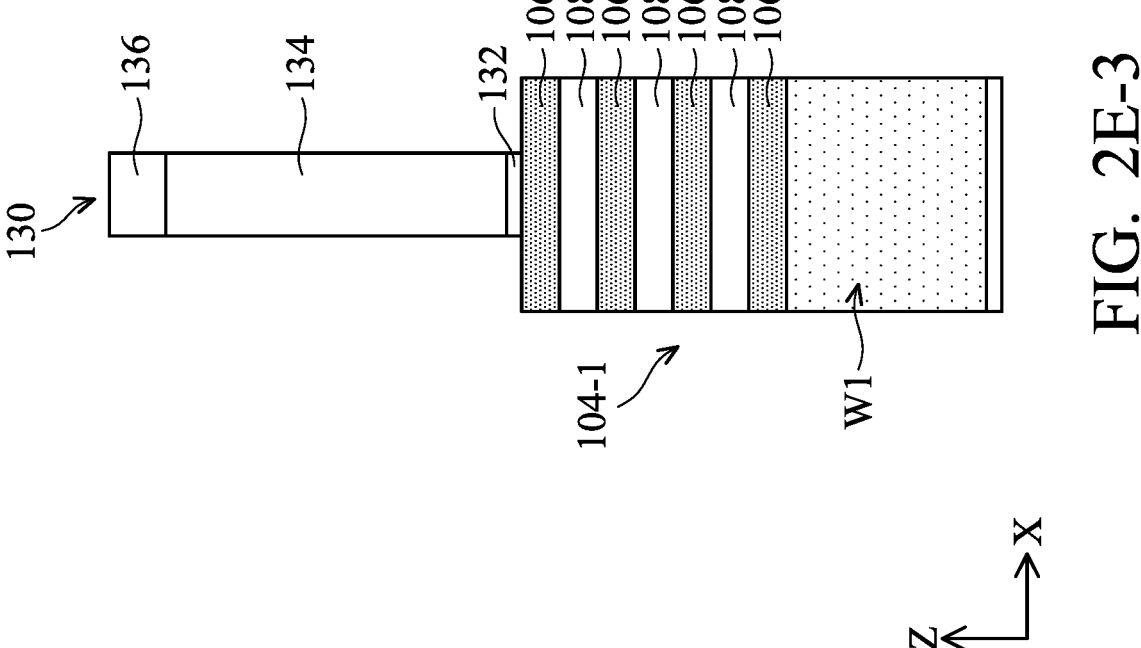
Figures 2, 2F:
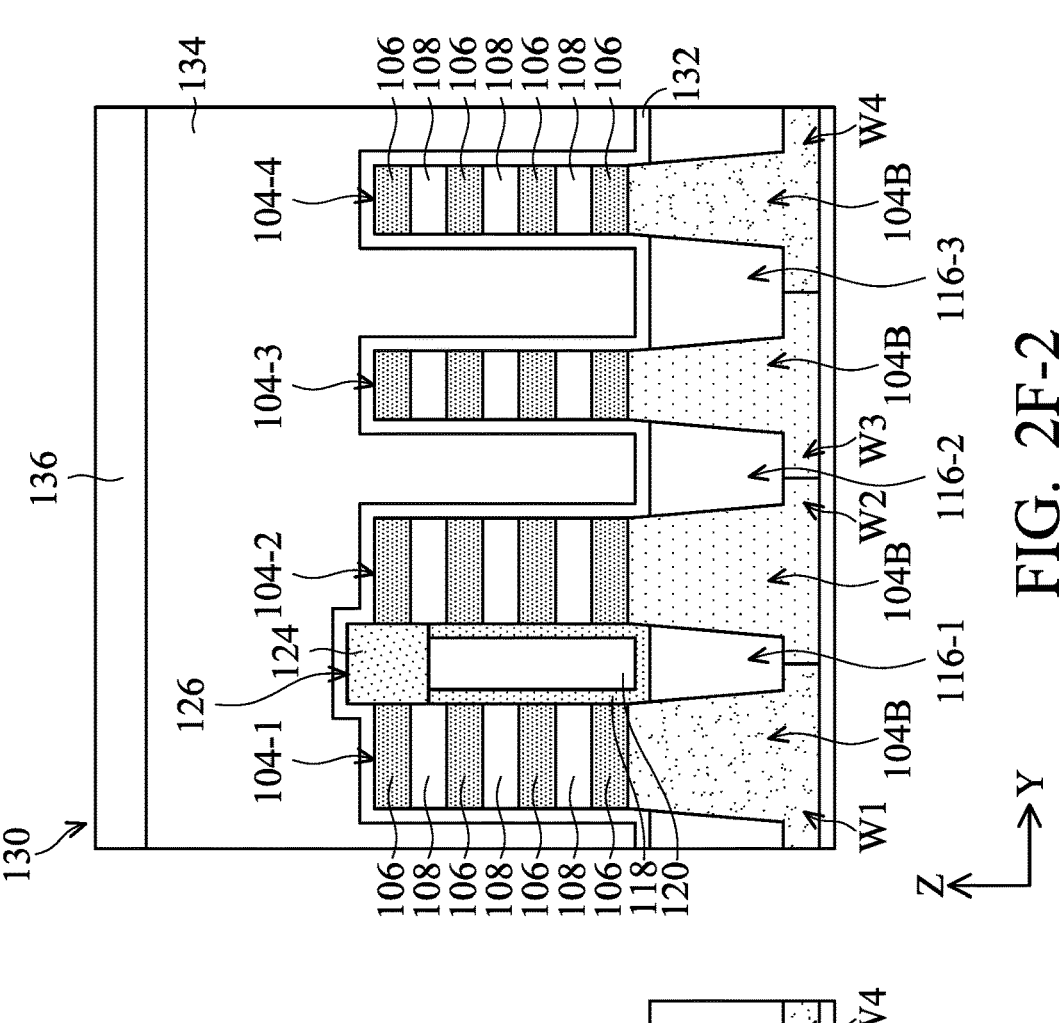
Figures 1, 2F:
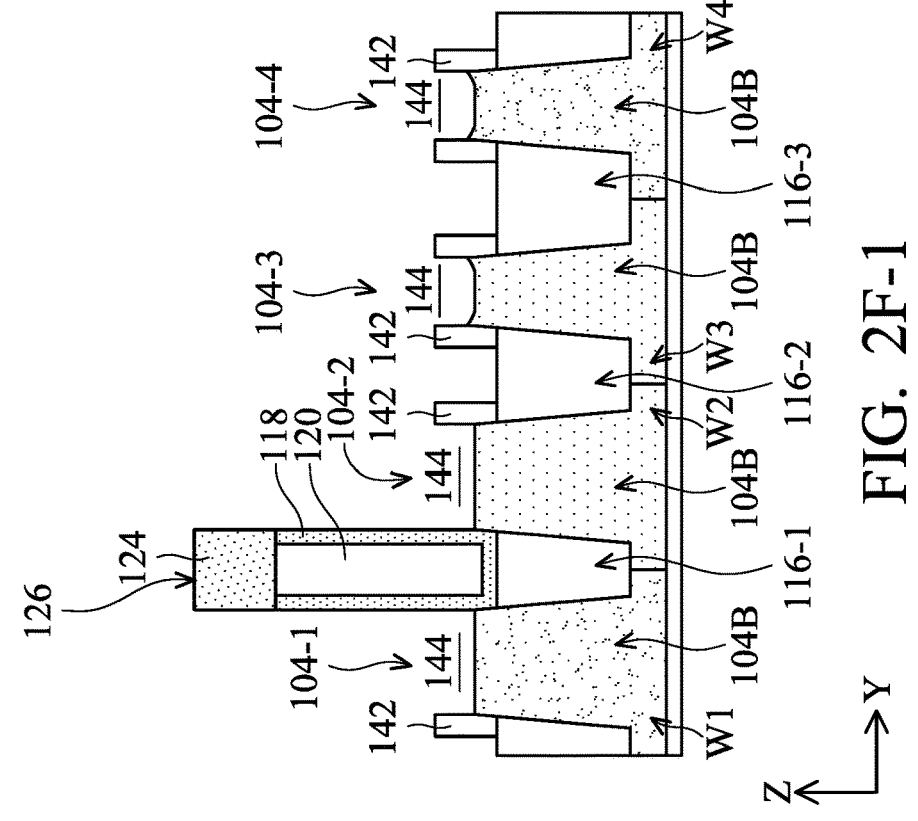
Figures 2, 2F, 3:
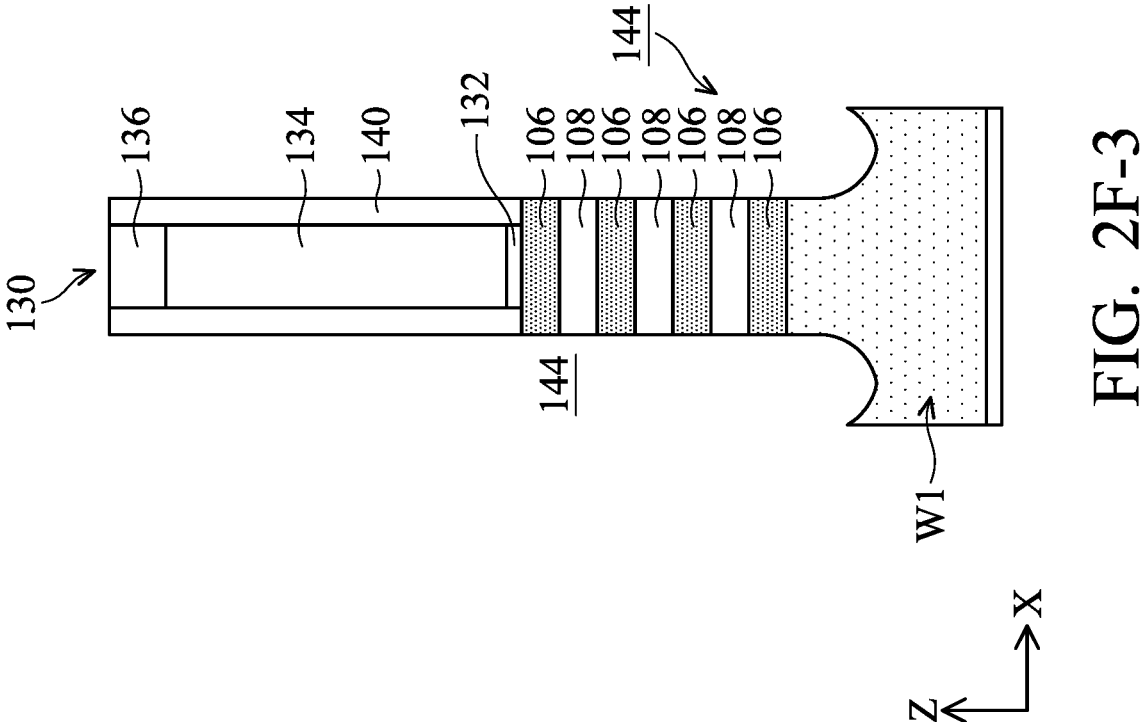
Figures 2, 2G:
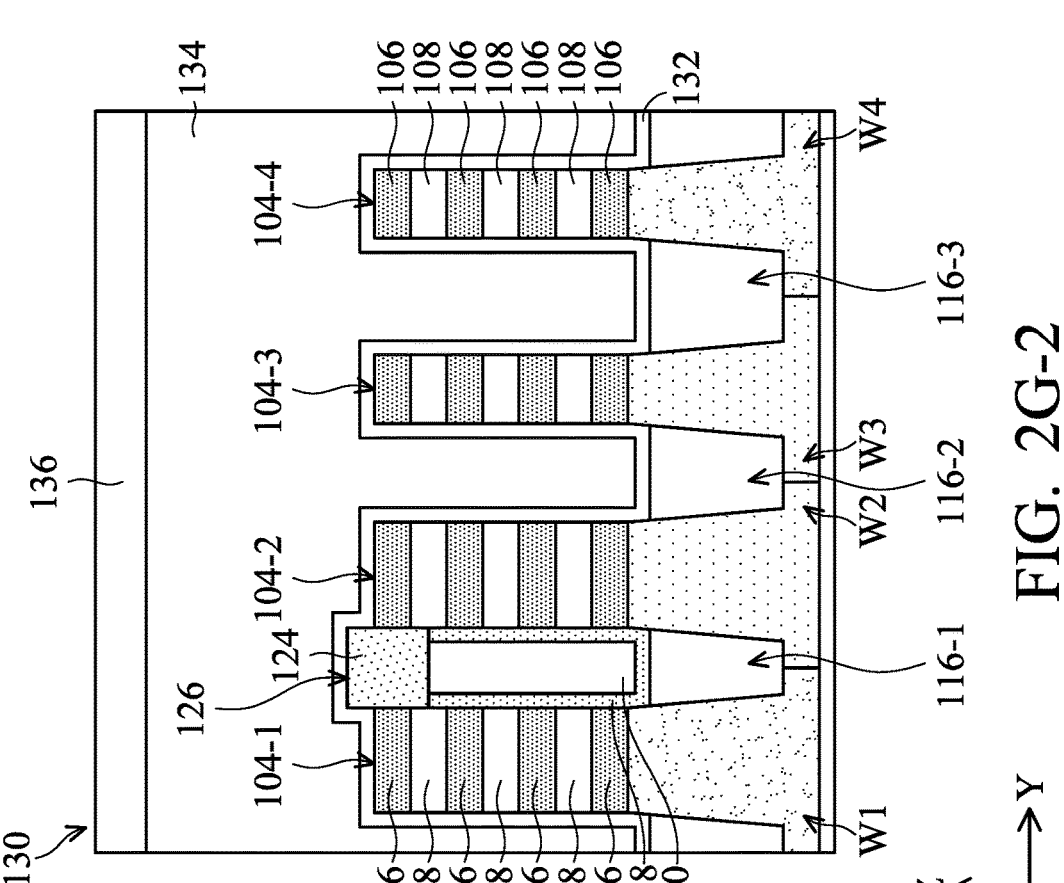
Figures 1, 2G:
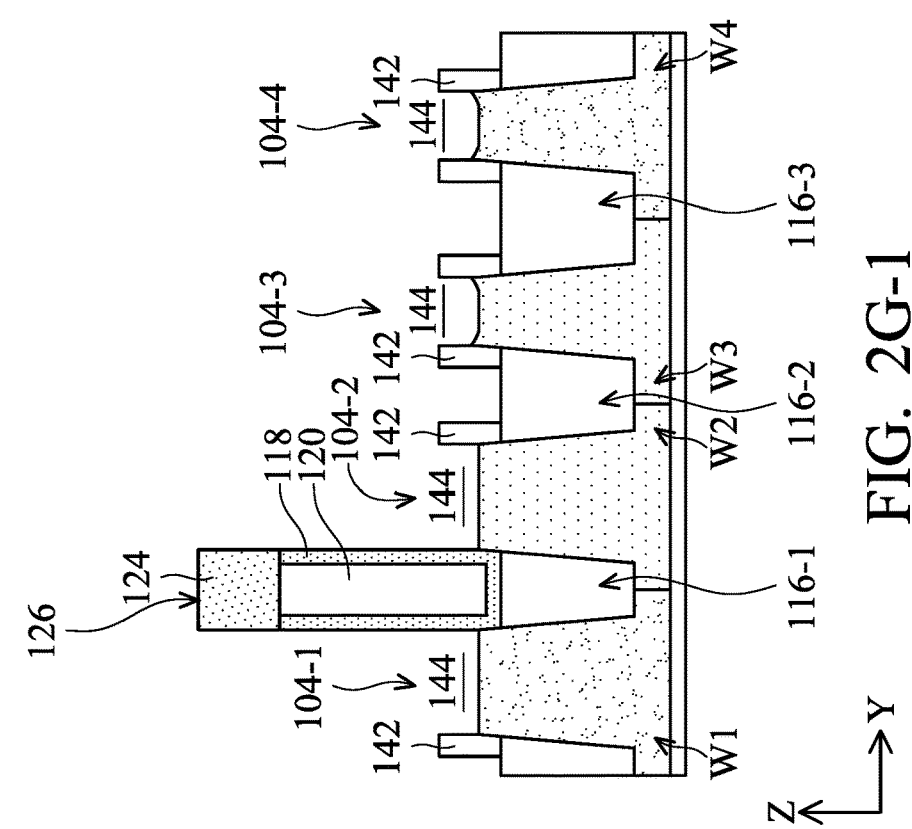
Figures 2, 2G, 3:
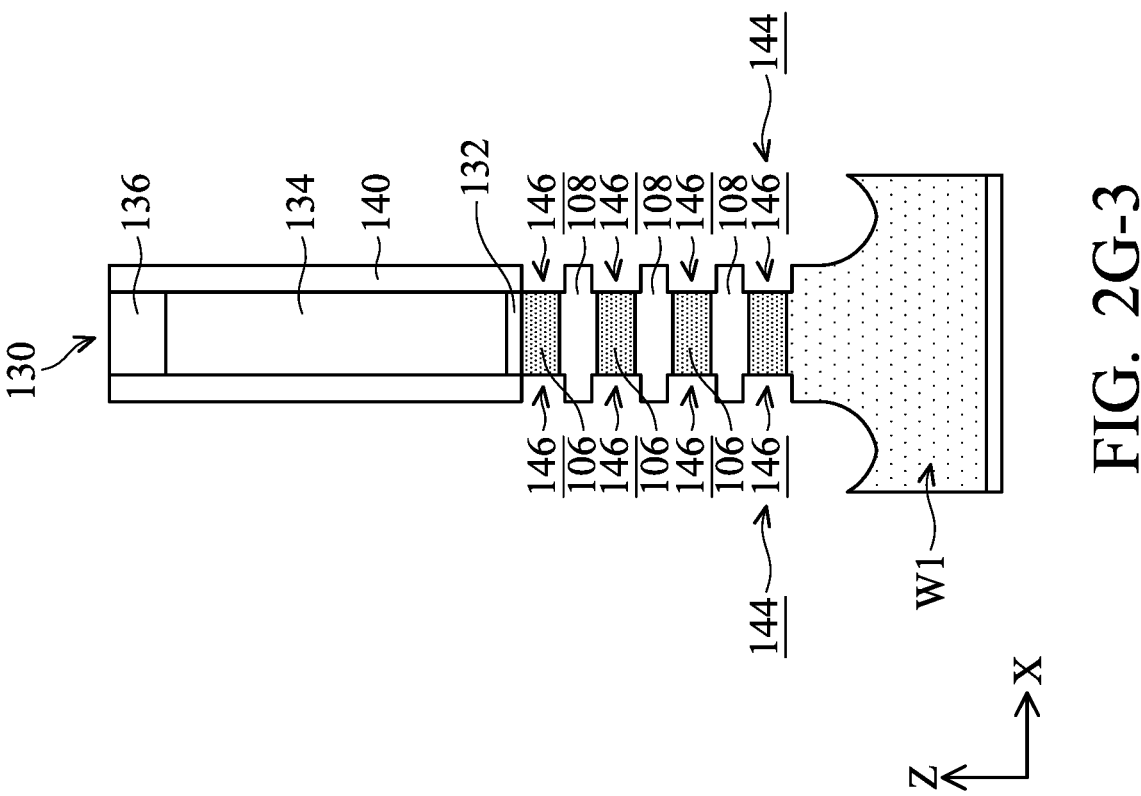
Figures 1, 2, 2H:
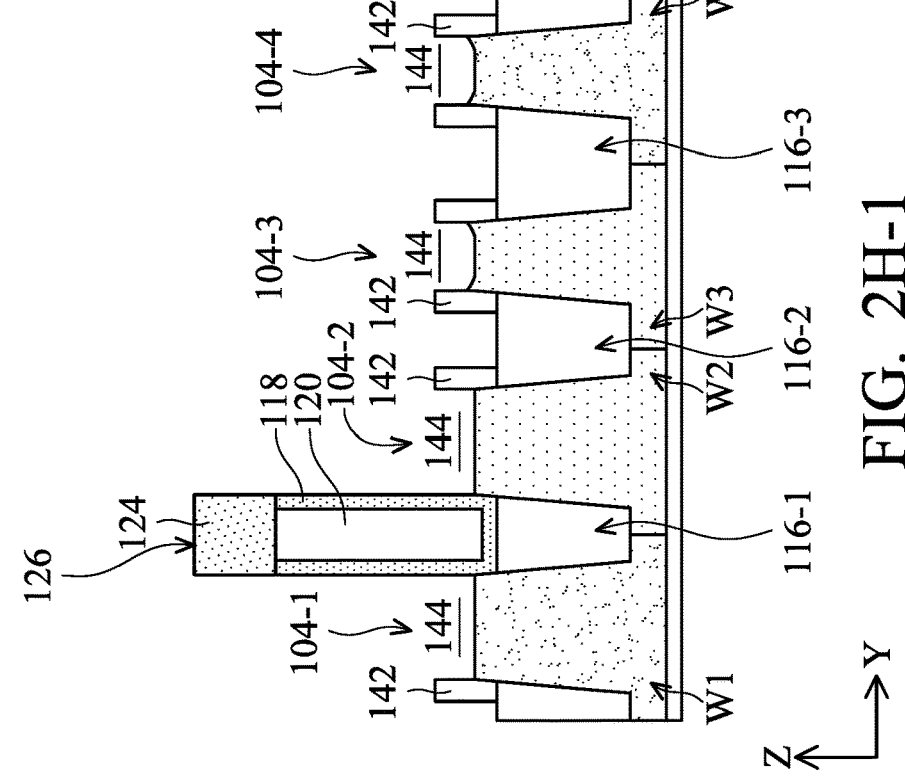
Figures 2, 2H, 3:
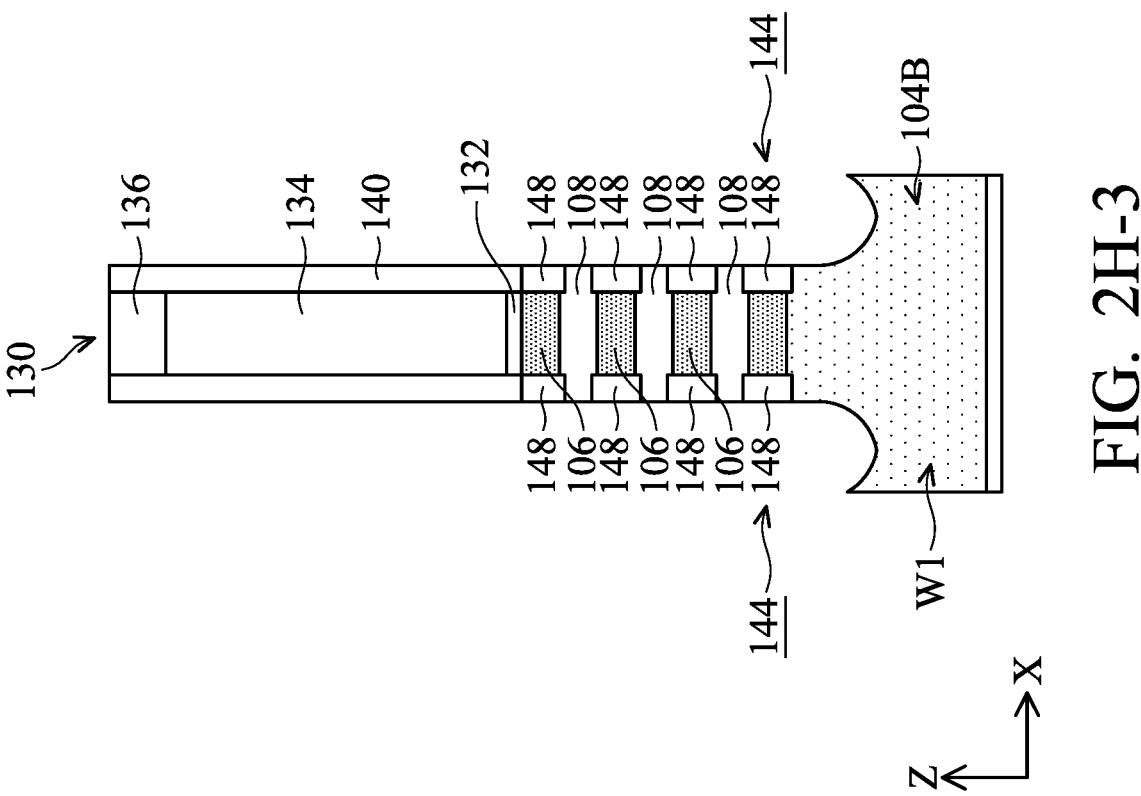
Figures 1, 2, 2I:
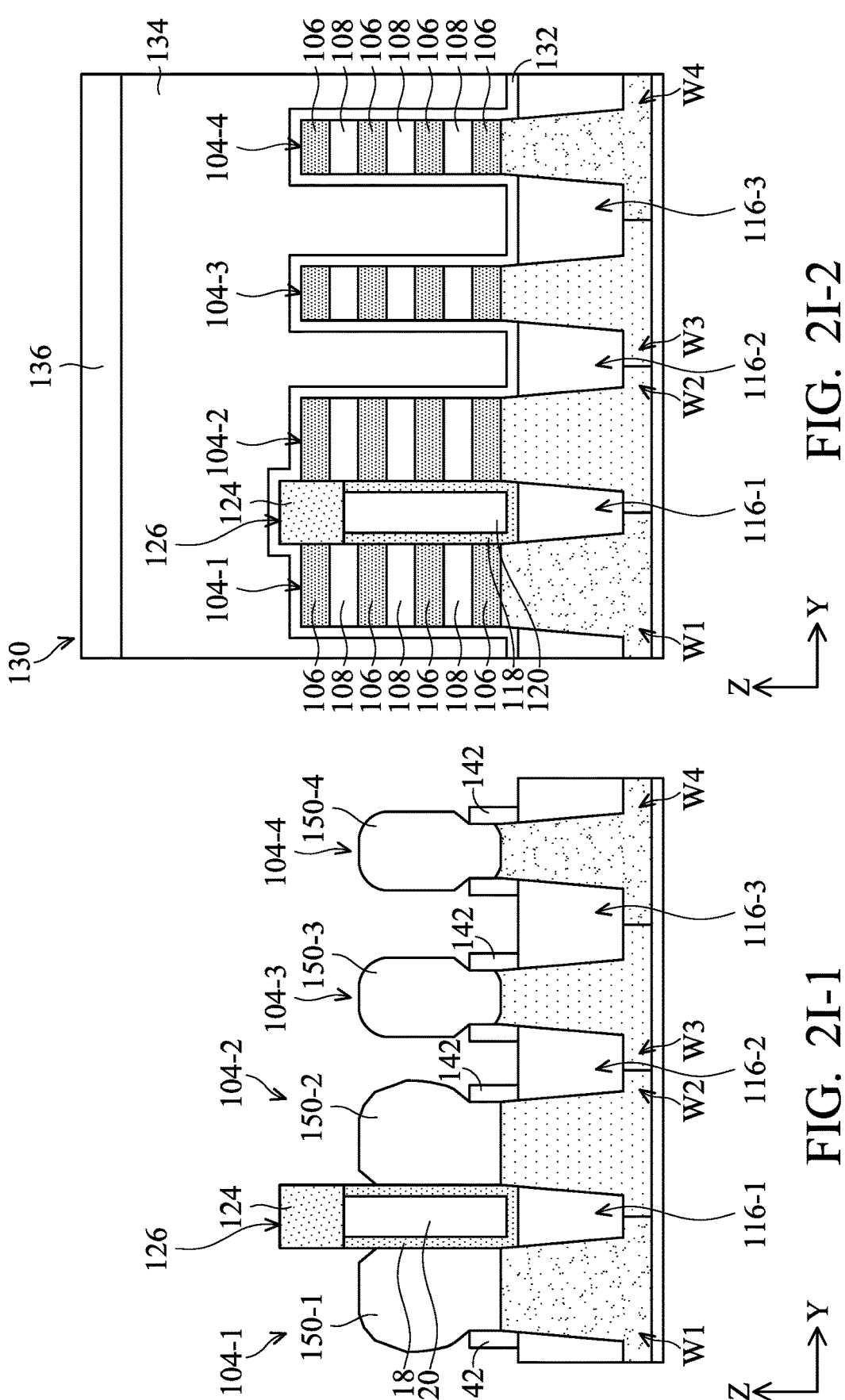
Figures 2, 2I, 3:
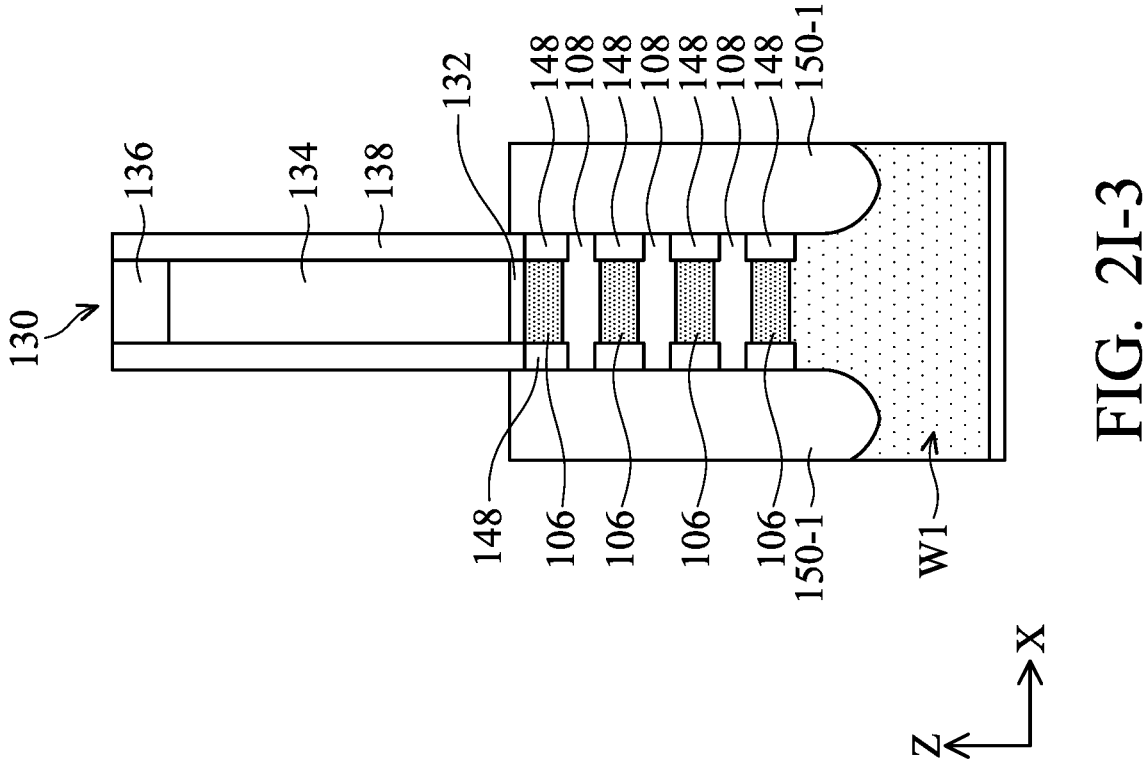
Figures 1, 2, 2J:
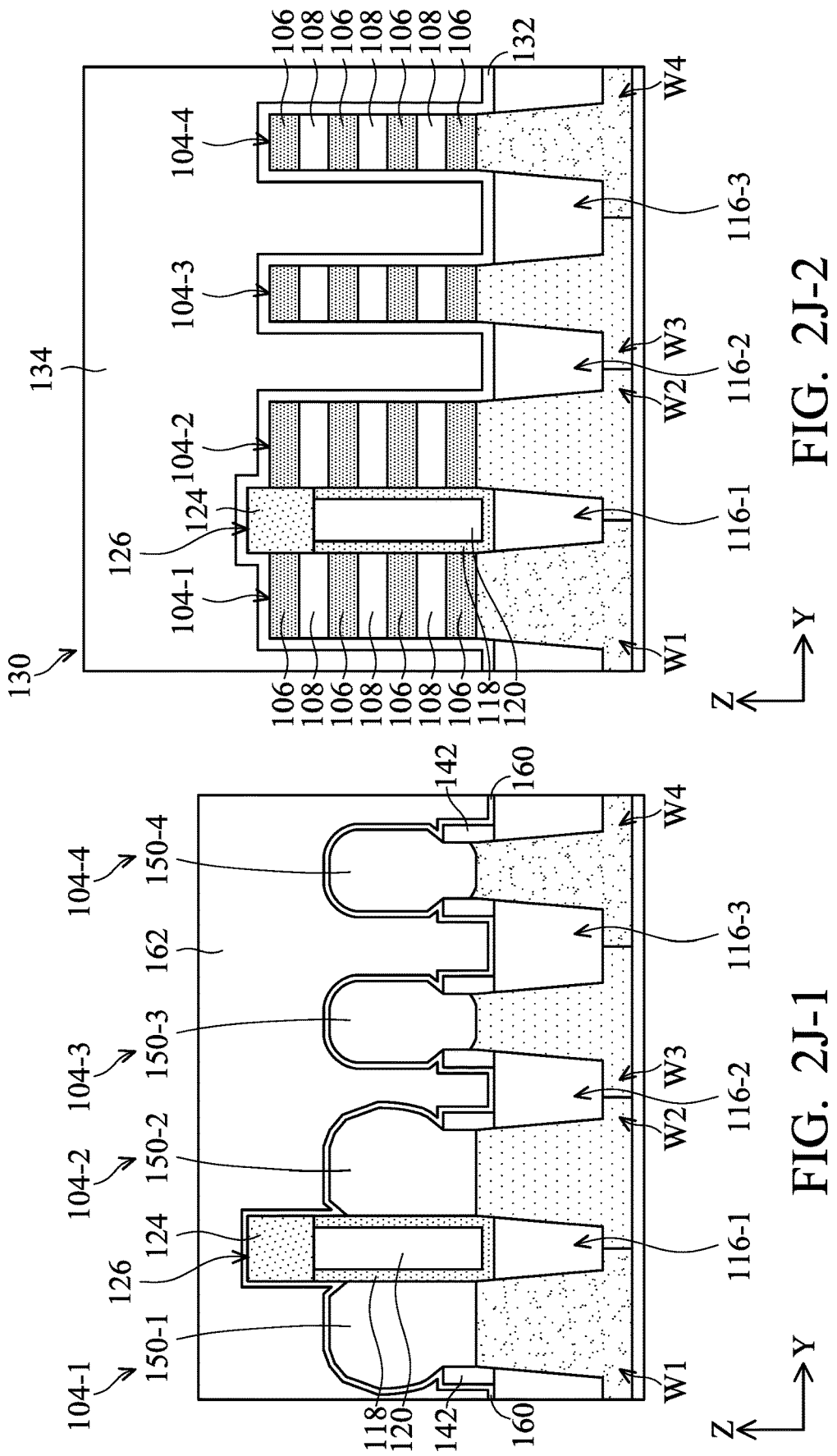
Figures 2, 2J, 3:
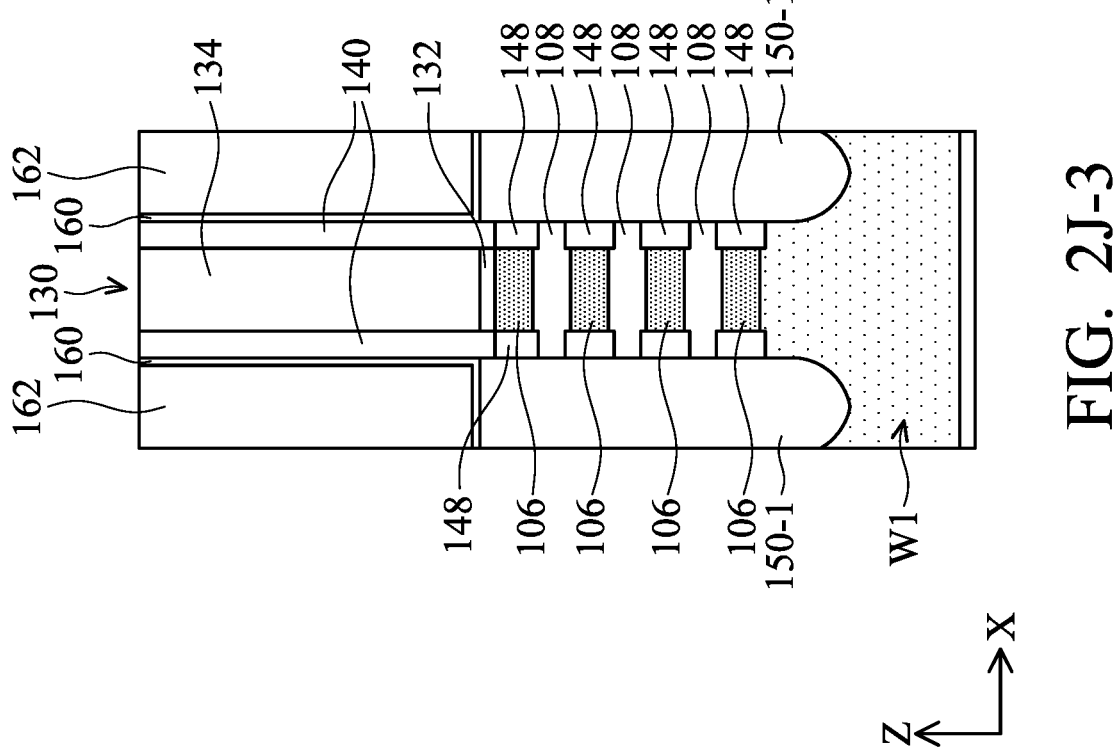
Figures 1, 2, 2K:
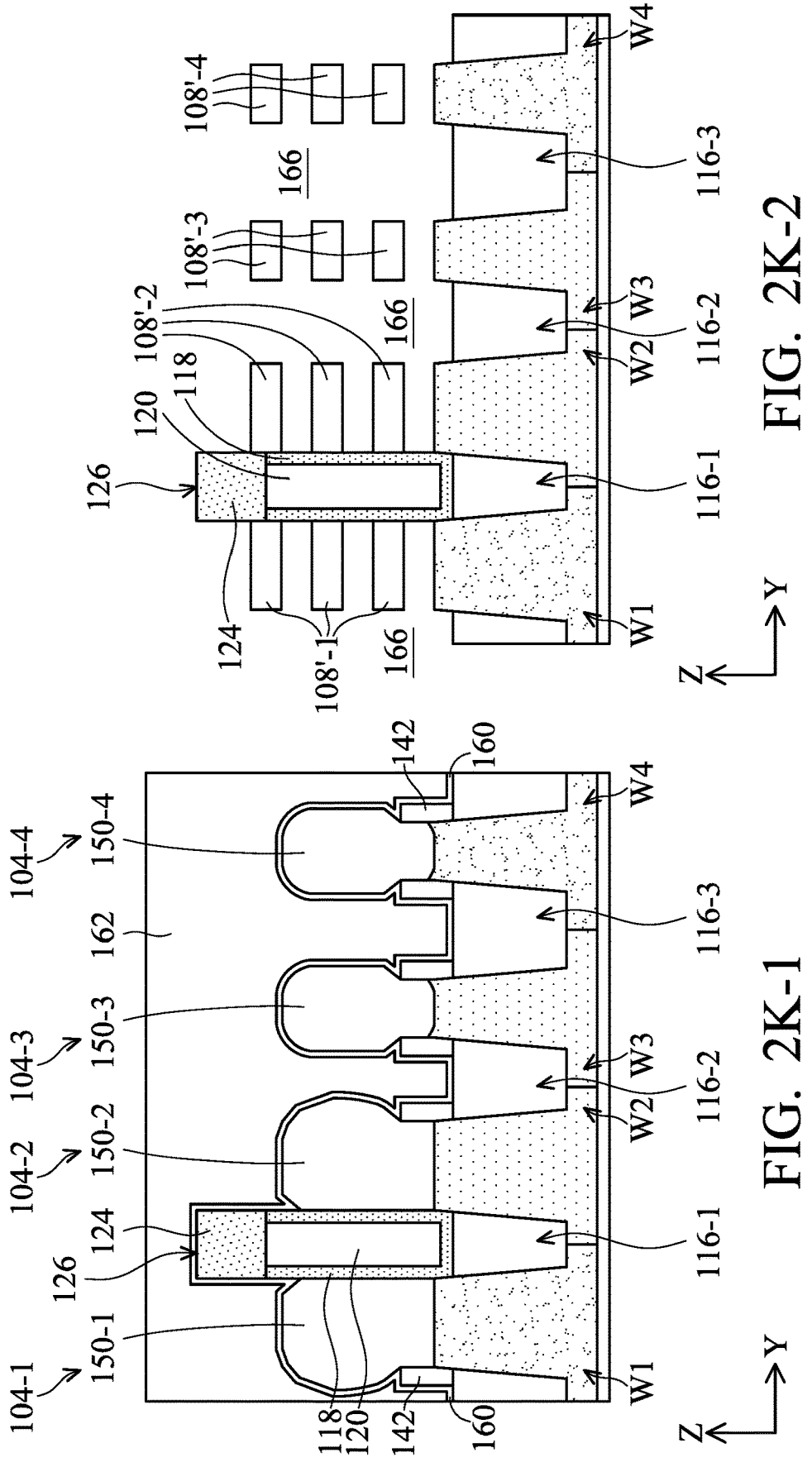
Figures 2, 2K, 3:
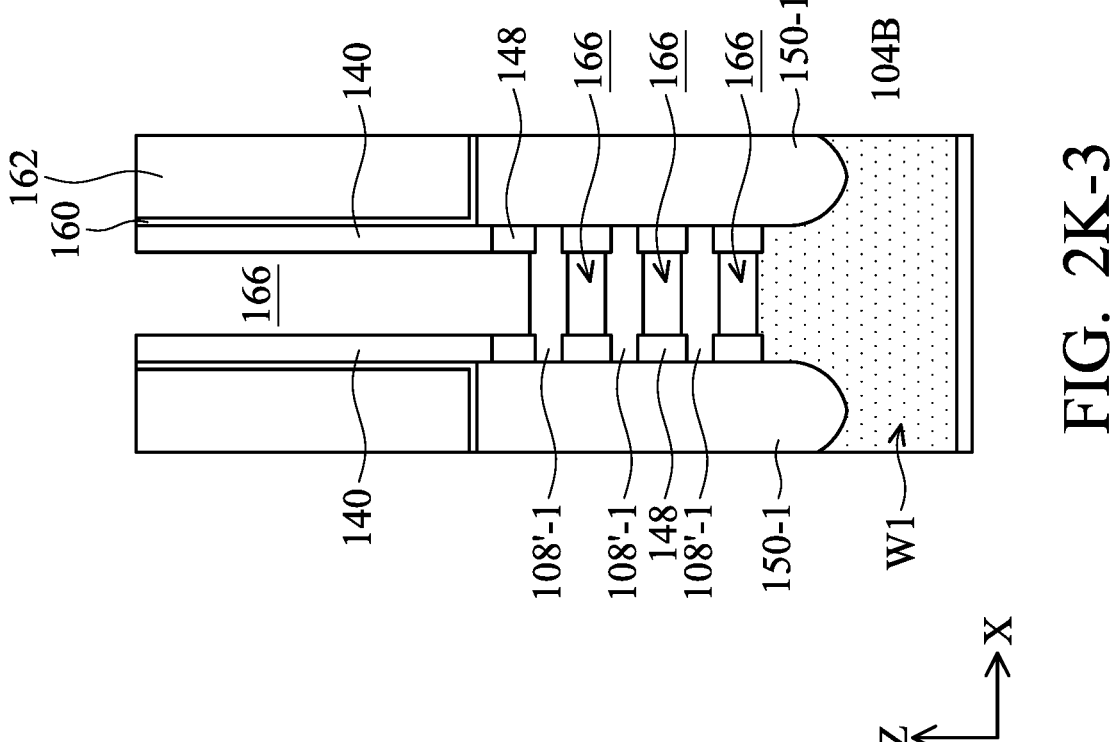
Figures 1, 2, 2L:
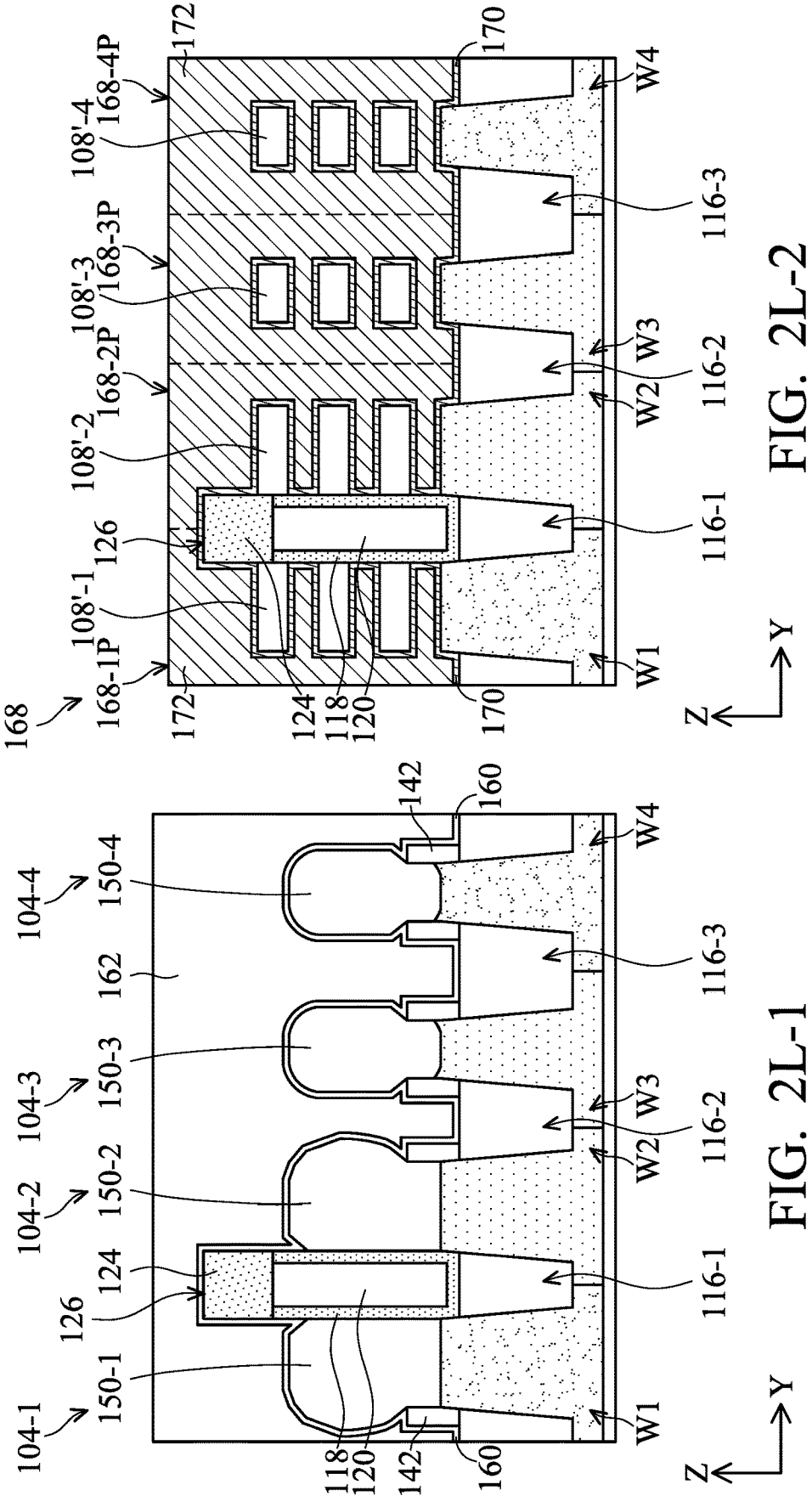
Figures 2, 2L, 3:
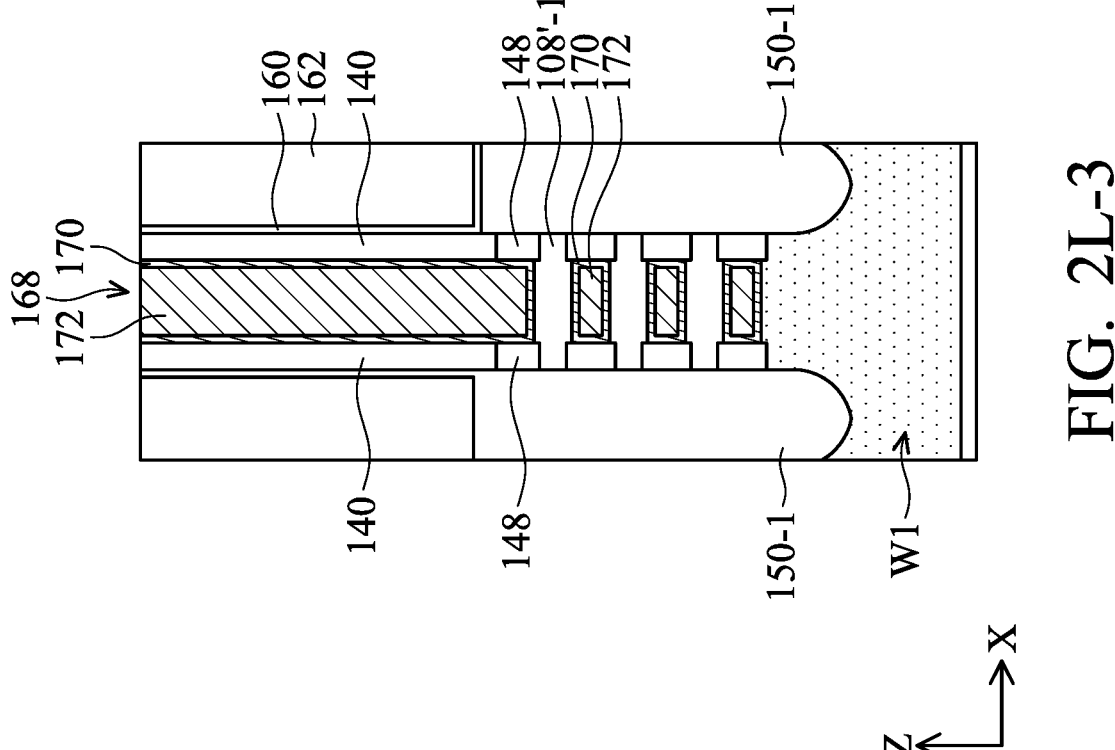
Figures 1, 2, 2M:
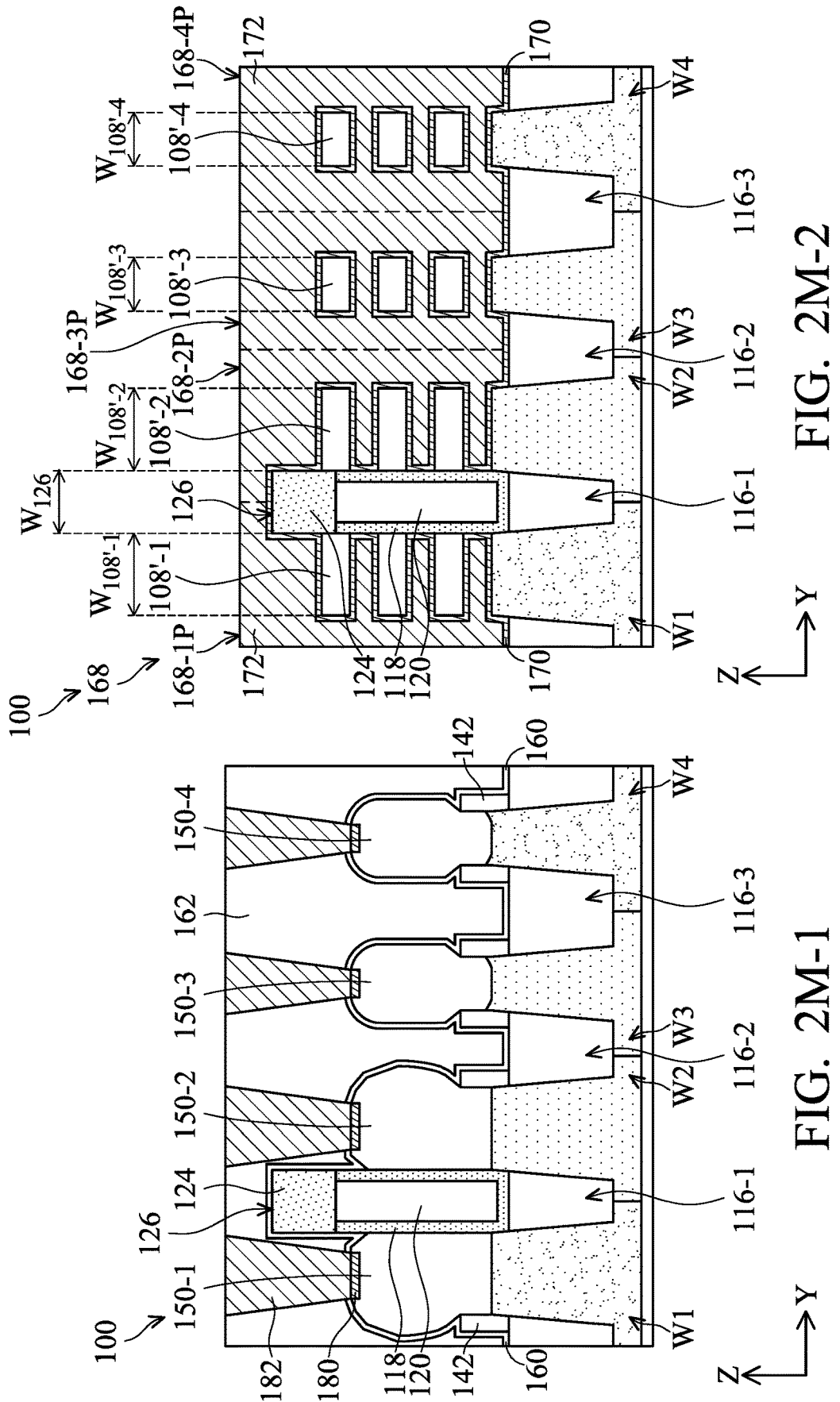
Figures 2, 2M, 3:
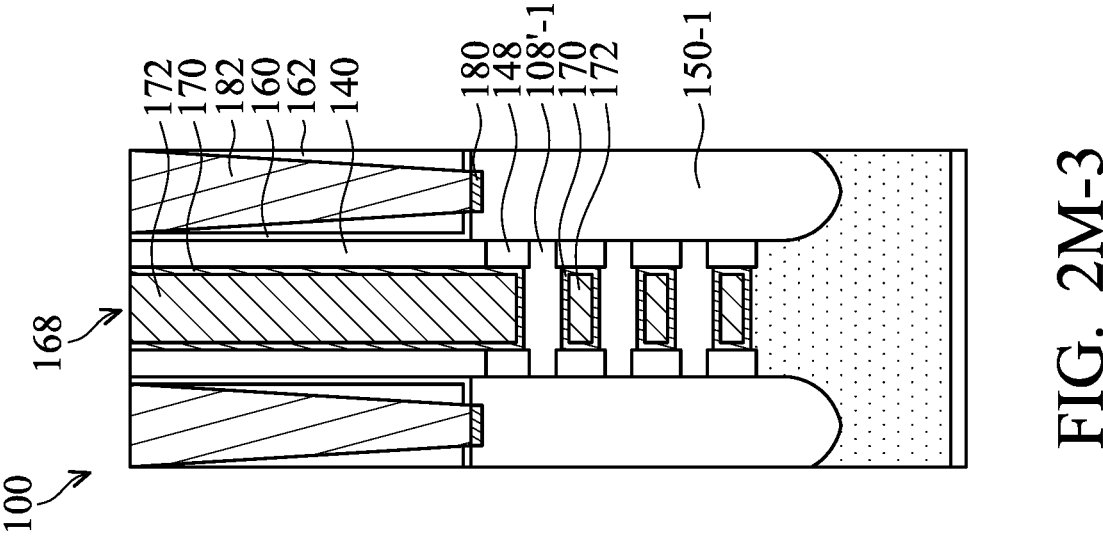

More specifically, FIGS. 2A-1 to 2M-1 illustrate the cross-sectional views of the intermediate stages of manufacturing the semiconductor structure 100 shown along lines $Y_{SD}$-$Y_{SD}$' (i.e. in the Y direction) in FIG. 1D-1 in accordance with some embodiments. FIGS. 2A-2 to 2M-2 illustrate the cross-sectional views of the intermediate stages of manufacturing the semiconductor structure 100 shown along lines $Y_{MG}$-$Y_{MG}$' (i.e. in the Y direction) in FIG. 1D-1 in accordance with some embodiments. FIGS. 2A-3 to 2M-3 illustrate the cross-sectional views of the intermediate stages of manufacturing the semiconductor structure 100 shown along lines $X_{104-1}$-$X_{104-1}$' (i.e. in the X direction) in FIG. 1D-1 in accordance with some embodiments.

The semiconductor structure 100 may include multi-gate devices and may be included in a microprocessor, a memory, or other IC devices. For example, the semiconductor structure 100 may be a portion of an IC chip that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other applicable components, or a combination thereof.

For a better understanding of the semiconductor structure 100, the X-Y-Z coordinate reference is provided in the figures. The X-axis and the Y-axis are generally orientated along the lateral (or horizontal) directions that are parallel to the main surface of a substrate 102. The Y-axis is transverse (e.g., substantially perpendicular/orthogonal) to the X-axis. The Z-axis is generally oriented along the vertical direction that is perpendicular to the main surface of the substrate 102 (or the X-Y plane).

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

A first well region W1, a second well region W2, a third well region W3, and a fourth well region W4 are formed in the substrate 102, as shown in FIG. 1A in accordance with some embodiments. In some embodiments, the first well region W1 and the fourth well region W4 include first dopants, and the second well region W2 and the third well region W3 include second dopants that have different conductive type with the first dopants. In some embodiments, the first well region W1 and the fourth well region W4 are N-type well regions doped with N-type dopants, and the second well region W2 and the third well region W3 are P-type well regions doped with P-type dopants. In some other embodiments, the first well region W1 and the fourth well region W4 are P-type well regions doped with P-type dopants, and the second well region W2 and the third well region W3 are N-type well regions doped with N-type dopants. In some embodiments, the N-type dopants include phosphorus, arsenic, other n-type dopants, or a combination thereof. In some embodiments, the P-type dopants include boron, indium, other p-type dopants, or a combination thereof. The P-type well region may be configured to have N-type transistors formed on it, and the N-type well region may be configured to have P-type transistors formed on it.

In some embodiments, the first well region W1, the second well region W2, the third well region W3, and the fourth well region W4 are formed by performing ion implantation processes, diffusion processes, and/or other suitable doping processes. Since the second well region W2 and the third well region W3 are doped with the same dopants, there may be no actual boundary (e.g. interface) between the second well region W2 and the third well region W3.

As shown in FIG. 1A, the first well region W1, the second well region W2, the third well region W3, and the fourth well region W4 are sequentially oriented in the Y direction and are longitudinally oriented in the X direction in accordance with some embodiments. A first unit cell C1 may be defined by the first well region W1 and the second well region W2, and a second unit cell C2 may be defined by the third well region W3 and the fourth well region W4. In some embodiments, the width $W_{W1}$ of the first well region W1, the width $W_{W2}$ of the second well region W2, the width $W_{W3}$ of the third well region W3, and the width $W_{W4}$ of the fourth well region W4 are substantially the same. In some other embodiments, the width $W_{W1}$ of the first well region W1, the width $W_{W2}$ of the second well region W2, the width $W_{W3}$ of the third well region W3, and the width $W_{W4}$ of the fourth well region W4 are different from each other.

After the first well region W1, the second well region W2, the third well region W3, and the fourth well region W4 are formed, a semiconductor stack including first semiconductor material layers 106 and second semiconductor material layers 108 is formed over the substrate 102, as shown in FIG. 1B in accordance with some embodiments.

In some embodiments, the first semiconductor material layers 106 and the second semiconductor material layers 108 are alternately stacked over the substrate 102. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although four first semiconductor material layers 106 and three second semiconductor material layers 108 are shown in FIG. 1B, the semiconductor stack may include less or more of the first semiconductor material layers 106 and the second semiconductor material layers 108 alternately stacked. For example, the semiconductor stack may include two to five of the first semiconductor material layers 106 and two to five of the second semiconductor material layers 108.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

After the first semiconductor material layers 106 and the second semiconductor material layers 108 are formed as the semiconductor stack over the substrate 102, the semiconductor stack and the substrate 102 are patterned to form fin structures 104-1, 104-2, 104-3, and 104-4, as shown in FIG. 1C in accordance with some embodiments.

The fin structures 104-1, 104-2, 104-3, and 104-4 are sequentially arranged in the Y direction and are longitudinally oriented along the X direction in accordance with some embodiments. More specifically, the fin structures 104-1, 104-2, 104-3, and 104-4 are respectively formed in the first well region W1, the second well region W2, the third well region W3, and the fourth well region W4 in accordance with some embodiments. In some embodiments, the fin structures 104-1, 104-2, 104-3, and 104-4 are formed in the central regions of the first well region W1, the second well region W2, the third well region W3, and the fourth well region W4 in the Y direction respectively. That is, the centrals (in the Y direction) of the fin structures 104-1, 104-2, 104-3, and 104-4 are coincidence with the centrals (in the Y direction) of the first well region W1, the second well region W2, the third well region W3, and the fourth well region W4 respectively.

In some embodiments, the width $W_{104-1}$ of the fin structure 104-1 in the Y direction is substantially equal to the width $W_{104-2}$ of the fin structure 104-2 in the Y direction, and the width $W_{104-3}$ of the fin structure 104-3 in the Y direction is substantially equal to the width $W_{104-4}$ of the fin structure 104-4 in the Y direction. In some embodiments, the width $W_{104-1}$ of the fin structure 104-1 is greater than the width $W_{104-3}$ of the fin structure 104-3.

In some embodiments, the distance $D_{FS}$ between the fin structures 104-1 and 104-2 in the Y direction is smaller than the distance $D_{NS}$ between the fin structures 104-3 and 104-4 in the Y direction. In some embodiments, the distance $D_{FS}$ between the fin structures 104-1 and 104-2 in the Y direction is smaller than the distance $D_{SP}$ between the fin structures 104-2 and 104-3 in the Y direction.

In some embodiments, the patterning process for forming the fin structures 104-1, 104-2, 104-3, and 104-4 includes forming a mask structure 110 over the semiconductor material stack, and etching the semiconductor material stack and the underlying substrate 102 through the mask structure 110. In some embodiments, the mask structure 110 is a multilayer structure including a pad oxide layer and a nitride layer formed over the pad oxide layer. The pad oxide layer may be made of silicon oxide, which is formed by thermal oxidation or CVD, and the nitride layer may be made of silicon nitride, which is formed by CVD, such as LPCVD or plasma-enhanced CVD (PECVD). In some embodiments, the fin structures 104-1, 104-2, 104-3, and 104-4 include base fin structures 104B and the semiconductor stacks, including the first semiconductor material layers 106 and the second semiconductor material layers 108 formed over the base fin structures 104B. Although not shown in the perspective views, the base fin structures 104B may have sloped sidewalls.

After the fin structures 104-1, 104-2, 104-3, and 104-4 are formed, isolation structures 116 are formed around the fin structures 104-1, 104-2, 104-3, and 104-4, as shown in FIGS. 1D, 1D-1, 2A-1, 2A-2, and 2A-3 in accordance with some embodiments. The isolation structures 116 are configured to electrically isolate active regions (e.g. the fin structures 104-1, 104-2, 104-3, and 104-4) of the semiconductor structure and are also referred to as shallow trench isolation (STI) feature in accordance with some embodiments.

In some embodiments, the isolation structures 116 include a first isolation structure 116-1 sandwiched between the fin structures 104-1 and 104-2, a second isolation structure 116-2 sandwiched between the fin structures 104-2 and 104-3, and a third isolation structure 116-3 sandwiched between the fin structures 104-3 and 104-4. In some embodiments, the width of the top surface of the first isolation structure 116-1 (i.e. $D_{FS}$) is smaller than the width the top surface of the second isolation structure 116-2 (i.e. $D_{SP}$) and the width the top surface of the third isolation structure 116-3 (i.e. $D_{NS}$) in the Y direction. In some embodiments, the first isolation structure 116-1 partially covers both the first well region W1 and the second well region W2, the second isolation structure 116-2 partially covers both the second well region W2 and the third well region W3, and the third isolation structure 116-3 partially covers both the third well region W3 and the fourth well region W4.

The isolation structures 116 may be formed by the follow processes. An insulating layer may be formed around and covering the fin structures 104-1, 104-2, 104-3, and 104-4, and the insulating layer may be recessed to form the isolation structures 116 with the fin structures 104-1, 104-2, 104-3, and 104-4 protruding from the top surface of the isolation structures 116. In some embodiments, the insulating layer is made of silicon oxide, silicon nitride, silicon oxynitride (SiON), another suitable insulating material, or a combination thereof. In addition, liner layers (not shown) may be formed before forming the insulating layer, and the liner layers may also be recessed with the insulating layer to form the isolation structures 116. In some embodiments, the liner layers include multiple dielectric material layers.

After the isolation structures 116 are formed, dielectric wall structures may be formed. More specifically, a dielectric shell layer 118 is conformally formed to cover the fin structures 104-1, 104-2, 104-3, and 104-4 and the isolation structures 116, and a core portion 120 is formed over the dielectric shell layer 118, as shown in FIGS. 2B-1, 2B-2, and 2B-3 in accordance with some embodiments.

The dielectric shell layer 118 is configured to protect the dielectric wall structure in subsequent etching process. In some embodiments, the dielectric shell layer 118 covers the sidewalls and the top surfaces of the fin structures 104-1, 104-2, 104-3, and 104-4 and the top surface of the isolation structures 116. In some embodiments, the dielectric shell layer 118 is made of a nitride base dielectric material such as SiN. In some embodiments, the dielectric shell layer 118 has a thickness in a range from about 3 nm to about 5 nm.

In some embodiments, the core portion 120 is made of a low k dielectric material, so that the capacitance of the resulting semiconductor device may be reduced. In some embodiments, the core portion 120 is made of an oxide base dielectric material, an oxynitride base dielectric material, or a flowable base dielectric material, such as $SiO_2$. In some embodiments, the core portion 120 and the isolation structures 116 are made of the same material. The dielectric shell layer 118 and the core portion 120 may be deposited using CVD, PVD, ALD, HDPCVD, MOCVD, RPCVD, PECVD, LPCVD, ALCVD, APCVD, other applicable methods, or a combination thereof.

As shown in FIGS. 2B-1 and 2B-2, since the distance $D_{FS}$ is smaller than the distance $D_{NS}$ and the distance $D_{SP}$, the space between the fin structures 104-1 and 104-2 may be substantially filled with the dielectric shell layer 118 and the core portion 120, while the space between the fin structures 104-2 and 104-3 and the space between the fin structures 104-3 and 104-4 are not completely filled with the dielectric shell layer 118 and the core portion 120 in accordance with some embodiments.

Next, an etching process 122 is performed, as shown in FIGS. 2C-1, 2C-2, and 2C-3 in accordance with some embodiments. In some embodiments, the etching process 122 is performed without using a mask structure. During the etching process 122, the removal of the core portion 120 and the dielectric shell layer 118 in the space between the fin structures 104-1 and 104-2 may be much slower than that in other regions, since the space between the fin structures 104-1 and 104-2 is completely filled by the core portion 120 and the dielectric shell layer 118 while the top and sidewall surfaces of the core portion 120 in other regions are largely exposed. In other words, the removal of the core portion 120 and the dielectric shell layer 118 in other regions (e.g. in the spaces between the fin structures 104-2 and 104-3 and the spaces between the fin structures 104-3 and 104-4) is faster than the removal of the core portion 120 and the dielectric shell layer 118 in the space between the fin structures 104-1 and 104-2. Therefore, the core portion 120 and the dielectric shell layer 118 formed in the wider spaces are completely removed, and the core portion 120 and the dielectric shell layer 118 formed in the space between the fin structures 104-1 and 104-2 are only partially removed during the etching process 122 in accordance with some embodiments. The remaining core portion 120 and the dielectric shell layer 118 form a bottom portion of the dielectric wall structure in accordance with some embodiments. In some other embodiments, the core portion 120 and the dielectric shell layer 118 are also partially etched during the etching process 122. In some embodiments, the mask structures 110 formed over the fin structures 104-1, 104-2, 104-3, and 104-4 are also partially etched during the etching process 122. Accordingly, the heights of the mask structures 110 are reduced after the etching process 122 is performed in accordance with some embodiments.

Next, the dielectric shell layer 118 and the core portion 120 are recessed to form a recess, and a cap layer 124 is formed in the recess, as shown in FIGS. 2D-1, 2D-2, and 2D-3 in accordance with some embodiments. In some embodiments, the dielectric shell layer 118 and the core portion 120 are recessed by performing an etching process. In some embodiments, the etching process is an isotropic etching such as dry chemical etching, remote plasma etching, wet chemical etching, other applicable technique, and/or a combination thereof. In some embodiments, the cap layer 124 is made of a high k dielectric material, such as $HfO_2$, $ZrO_2$, $HfAlO_x$, $HfSiO_x$, $Al_2O_3$, or the like.

In some embodiments, the bottom surface of the cap layer 124 is lower than the topmost surface of the second semiconductor material layers 108 and is higher than the bottom surface of the topmost layer of the second semiconductor material layers 108. In some other embodiments, the bottom surface of the cap layer 124 is substantially level with the topmost surface of the second semiconductor material layers 108. In some other embodiments, the bottom surface of the cap layer 124 is higher than the topmost surface of the second semiconductor material layers 108 and is lower than the topmost surface of the first semiconductor material layers 106.

A dielectric wall structure 126, including the dielectric shell layer 118, the core portion 120, and the cap layer 124, is formed between the fin structures 104-1 and 104-2, as shown in FIGS. 2D-1 and 2D-2 in accordance with some embodiments. More specifically, the dielectric wall structure 126 is sandwiched between the fin structures 104-1 and 104-2 and is longitudinally oriented along the X direction in accordance with some embodiments. In some embodiments, the dielectric wall structure 126 covers the top surface of the first isolation structure 116-1, while the top surfaces of the second isolation structure 116-2 and the third isolation structure 116-3 are exposed.

In some embodiments, the fin structures 104-1 and 104-2 are attached to and in contact with the first sidewall surface and the second sidewall surface of the dielectric wall structure 126. In some embodiments, the dielectric wall structure 126 is formed on the boundary between the first well region W1 and the second well region W2 and partially overlaps both the first well region W1 and the second well region W2.

Afterwards, the remaining mask structures 110 are removed, and a dummy gate structure 130 is formed, as shown in FIGS. 2E-1, 2E-2, and 2E-3 in accordance with some embodiments. More specifically, the dummy gate structure 130 is formed across the fin structures 104-1, 104-2, 104-3, and 104-4 and the dielectric wall structure 126 in accordance with some embodiments. The dummy gate structure 130 is configured to define the channel regions of the transistors in the resulting semiconductor structure 100.

In some embodiments, the dummy gate structure 130 includes a dummy gate dielectric layer 132 and a dummy gate electrode layer 134. In some embodiments, the dummy gate dielectric layer 132 is made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layer 132 is formed using thermal oxidation, CVD, ALD, physical vapor deposition (PVD), another suitable method, or a combination thereof.

In some embodiments, the dummy gate electrode layer 134 is made of conductive material includes polycrystalline-silicon (poly-Si), poly-crystalline silicon-germanium (poly-SiGe), or a combination thereof. In some embodiments, the dummy gate electrode layer 134 is formed using CVD, PVD, or a combination thereof.

In some embodiments, a hard mask layer 136 is formed over the dummy gate electrode layer 134. In some embodiments, the hard mask layer 136 includes multiple layers, such as an oxide layer and a nitride layer. In some embodiments, the oxide layer is silicon oxide, and the nitride layer is silicon nitride.

The formation of the dummy gate structure 130 may include conformally forming a dielectric material as the dummy gate dielectric layers 132. Afterwards, a conductive material may be formed over the dielectric material as the dummy gate electrode layers 134, and the hard mask layer 136 may be formed over the conductive material. Next, the dielectric material and the conductive material may be patterned through the hard mask layer 136 to form the dummy gate structure 130.

After the dummy gate structure 130 is formed, a spacer layer may be formed to cover the top surfaces and the sidewalls of the dummy gate structure 130 and the fin structures 104-1, 104-2, 104-3, and 104-4. Afterwards, an etching process is performed to form gate spacers 140 and fin spacers 142 with the spacer layer and to form source/drain recesses 144 in the fin structures 104-1, 104-2, 104-3, and 104-4, as shown in FIGS. 2F-1, 2F-2, and 2F-3 in accordance with some embodiments. The gate spacers 140 are configured to separate source/drain structures (formed afterwards) from the dummy gate structure 130, and the fin spacers 142 are configured to confine the growth of the source/drain structures formed therein.

In some embodiments, the spacer layer is made one or more dielectric materials. The dielectric materials may include silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. After the spacer layer is formed, the spacer layer is etched to form the gate spacers 140 on opposite sidewall surfaces of the dummy gate structure 130, and fin spacers 142 are formed on the opposite sidewall surfaces of the fin structures 104-1, 104-2, 104-3, and 104-4 by performing an etching process in accordance with some embodiments. In addition, the fin structures 104-1, 104-2, 104-3, and 104-4 not covered by the dummy gate structure 130 and the gate spacers 140 are further etched to form the source/drain recesses 144, as shown in FIGS. 2F-1 and 2F-3 in accordance with some embodiments. The etching process may be an anisotropic etching process, such as dry plasma etching, and the dummy gate structure 130 and the gate spacers 140 may be used as etching masks during the etching process. In some embodiments, the isolation structures 116 are also slightly etched during the etching process.

After the source/drain recesses 144 are formed, the first semiconductor material layers 106 exposed by the source/drain recesses 144 are laterally recessed to form notches 146, as shown in FIGS. 2G-1, 2G-2, and 2G-3 in accordance with some embodiments. In some embodiments, an etching process is performed to laterally recess the first semiconductor material layers 106 of the fin structure 104-1, 104-2, 104-3, and 104-4 from the source/drain recesses 144. In some embodiments, during the etching process, the first semiconductor material layers 106 have a greater etching rate (e.g. etching amount) than the second semiconductor material layers 108, thereby forming notches 146 between the adjacent second semiconductor material layers 108. In some embodiments, the second semiconductor material layers 108 are also slightly etched during the etching process, so that the portions of the second semiconductor material layers 108 exposed by the notches 146 become thinner than other portions, as shown in FIG. 2G-3 in accordance with some embodiments. In some embodiments, the etching process is an isotropic etching such as dry chemical etching, remote plasma etching, wet chemical etching, another suitable technique, and/or a combination thereof.

Next, inner spacers 148 are formed in the notches 146 between the second semiconductor material layers 108, as shown in FIGS. 2H-1, 2H-2, and 2H-3 in accordance with some embodiments. The inner spacers 148 may be configured to separate the source/drain structures and the gate structures formed in subsequent manufacturing processes. As described previously, since the second semiconductor material layers 108 are also partially etched when forming the notches 146, the inner spacers 148 formed in the notches 146 are thicker than the thicknesses of the first semiconductor material layers 106 in accordance with some embodiments. In addition, the inner spacers 148 may have curve sidewalls (not shown). In some embodiments, the inner spacers 148 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof.

After the inner spacers 148 are formed, source/drain structures 150-1, 150-2, 150-3, and 150-4 are formed in the source/drain recesses 144 of the fin structures 104-1, 104-2, 104-3, and 104-4 respectively, as shown in FIGS. 2I-1, 2I-2, and 2I-3 in accordance with some embodiments. The source/ drain structures described below may refer to a source or a drain, individually or collectively dependent upon the context.

In some embodiments, the source/drain structures 150-1 and 150-2 and the source/drain structures 150-3 and 150-4 have different shapes. More specifically, the source/drain structures 150-1 and 150-2 are formed over the fin structures 104-1 and 104-2 and are sandwiched between one fin spacer 142 and the dielectric wall structure 126 with the dielectric wall structure 126 being higher than the fin spacer 142 in accordance with some embodiments. Therefore, the source/drain structures 150-1 and 150-2 have asymmetrical shapes from a cross-sectional view in the Y-Z direction in accordance with some embodiments. Each of the source/drain structures 150-1 and 150-2 may have a first side and a second side opposite the first side and has a substantially straight sidewall at the second side and a curved sidewall at the first side in accordance with some embodiments. The substantially straight sidewall at the second side may be in direct contact with the dielectric wall structure 126, and the curved sidewall at the first side extends laterally outside the outer sidewall of the fin spacer 142 in accordance with some embodiments.

On the other hand, the source/drain structures 150-3 and 150-4 are formed over the fin structures 104-3 and 104-4 and are sandwiched between two fin spacers 142 in accordance with some embodiments. Since both sides of the source/drain structures 150-3 and 150-4 are confined by the fin spacers 142, the source/drain structures 150-3 and 150-4 have substantially symmetry shapes from a cross-sectional view along the Y-Z direction in accordance with some embodiments.

In some embodiments, the top surface of the dielectric wall structure 126 is higher than the topmost portions of the source/drain structures 150-1, 150-2, 150-3, and 150-4. In some embodiments, the topmost portions of the source/drain structures 150-3 and 150-4 are higher than the topmost portions of the source/drain structures 150-1 and 150-2. In some embodiments, the source/drain structures 150-1, 150-2, 150-3, and 150-4 have substantially the same height. In addition, since the fin structures 104-1 and 104-2 are wider than the fin structures 104-3 and 104-4, the source/drain structures 150-1 and 150-2 are also wider than the source/drain structures 150-3 and 150-4 in Y direction in accordance with some embodiments.

In some embodiments, the source/drain structures 150-1, 150-2, 150-3, and 150-4 are formed using an epitaxial growth process, such as MBE, MOCVD, VPE, other applicable epitaxial growth process, or a combination thereof. In some embodiments, the source/drain structures 150-1, 150-2, 150-3, and 150-4 are made of any applicable material, such as Ge, Si, GaAs, AlGaAs, SiGe, GaAsP, SiP, SiC, SiCP, or a combination thereof. In some embodiments, the source/drain structures 150-1, 150-2, 150-3, and 150-4 are in-situ doped during the epitaxial growth process. For example, the source/drain structures 150-1, 150-2, 150-3, and 150-4 may be the epitaxially grown SiGe doped with boron (B). For example, the source/drain structures 150-1, 150-2, 150-3, and 150-4 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the source/drain structures 150-1, 150-2, 150-3, and 150-4 are doped in one or more implantation processes after the epitaxial growth process.

After the source/drain structures 150-1, 150-2, 150-3, and 150-4 are formed, a contact etch stop layer (CESL) 160 is conformally formed to cover the source/drain structures 150-1, 150-2, 150-3, and 150-4, and an interlayer dielectric (ILD) layer 162 is formed over the contact etch stop layers 160, as shown in FIGS. 2J-1, 2J-2, and 2J-3 in accordance with some embodiments. In some embodiments, the contact etch stop layer 160 is in direct contact with the sidewalls of the dielectric shell layers 118 and the top surface of the cap layer 124 of the dielectric wall structures 126.

In some embodiments, the contact etch stop layer 160 is made of a dielectric materials, such as silicon nitride, silicon oxide, silicon oxynitride, another suitable dielectric material, or a combination thereof. The dielectric material for the contact etch stop layers 160 may be conformally deposited over the semiconductor structure by performing CVD, ALD, other application methods, or a combination thereof.

The interlayer dielectric layer 162 may include multilayers made of multiple dielectric materials, such as silicon oxide, silicon nitride, silicon oxynitride, phosphosilicate glass (PSG), borophosphosilicate glass (BPSG), or other applicable low-k dielectric materials. The interlayer dielectric layer 162 may be formed by chemical vapor deposition (CVD), physical vapor deposition, (PVD), atomic layer deposition (ALD), or other applicable processes.

After the contact etch stop layer 160 and the interlayer dielectric layer 162 are deposited, a planarization process such as CMP or an etch-back process is performed until the dummy gate electrode layer 134 is exposed, as shown in FIGS. 2J-2 and 2J-3 in accordance with some embodiments.

Next, the dummy gate structure 130 and the first semiconductor material layers 106 of the fin structures 104-1, 104-2, 104-3, and 104-4 are removed to form a gate trench 166, as shown in FIGS. 2K-1, 2K-2, and 2K-3 in accordance with some embodiments. More specifically, the dummy gate structure 130 and the first semiconductor material layers 106 are removed to form channel structures (e.g. nanostructures) 108'-1, 108'-2, 108'-3, and 108'-4 with the second semiconductor material layers 108 of the fin structures 104-1, 104-2, 104-3, and 104-4 respectively in accordance with some embodiments. Although not shown in the figures, the channel structures 108'-1, 108'-2, 108'-3, and 108'-4 and the base fin structures 104B may have rounded corners.

The removal process may include one or more etching processes. For example, the dummy gate electrode layer 134 may be made of polysilicon, and a wet etchant such as a tetramethylammonium hydroxide (TMAH) solution may be used to selectively remove the dummy gate electrode layer 134. Afterwards, the dummy gate dielectric layer 132 may be removed using a plasma dry etching, a dry chemical etching, and/or a wet etching. The first semiconductor material layers 106 may then be removed by performing a selective wet etching process, such as APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions.

As shown in FIG. 2K-2, the channel structures 108'-1, 108'-2, 108'-3, and 108'-4 are vertically suspended and spaced apart from each other in accordance with some embodiments. In addition, one sidewall of each of the channel structures 108'-1 and 108'-2 is laterally attached to the sidewall surfaces of the dielectric wall structure 126 and is not exposed by the gate trench 166 in accordance with some embodiments. Accordingly, three side surfaces of the first channel structures 108'-1 and three side surfaces of the second channel structures 108'-2 are exposed by the gate trench 166, and fourth side surfaces of the third channel structures 108'-3 and fourth side surfaces of the fourth channel structures 108'-4 are exposed by the gate trench 166 from a cross-sectional view shown in the Y-Z direction in accordance with some embodiments. More specifically, the top surface, the bottom surface, and the two sidewalls of each of the channel structures 108'-3 and 108'-4 in the channel region are fully exposed by the gate trench 166 in accordance with some embodiments. On the other hand, although the top surface and the bottom surface of each of the channel structures 108'-1 and 108'-2 are also exposed by the gate trench 166, only one sidewall of each of the channel structures 108'-1 and 108'-2 is exposed by the gate trench 166 from a cross-sectional view in the Y-Z direction in accordance with some embodiments. In some embodiments, the portions of the sidewall of the dielectric wall structure 126 not attached to the channel structures 108'-1 and 108'-2 are also exposed by the gate trench 166.

Next, a gate structure 168 is formed in the gate trench 166, as shown in FIGS. 2L-1, 2L-2, and 2L-3 in accordance with some embodiments. The gate structure 168 is longitudinally oriented along the Y direction in accordance with some embodiments. In some embodiments, the gate structure 168 includes a gate dielectric layer 170 and a gate stack 172. Interfacial layers (not shown) may also be formed around the channel structures 108'-1, 108'-2, 108'-3, and 108'-4 and on the exposed portions of the base fin structure 104B. In some embodiments, the interfacial layers are oxide layers formed by performing a thermal process.

In some embodiments, the gate dielectric layer 170 is conformally formed in the gate trench 166. In some embodiments, the gate dielectric layer 170 wraps around the channel structures 108'-1, 108'-2, 108'-3, and 108'-4 and cover the sidewalls of the dielectric shell layer 118 and the top surface of the cap layer 124 of the dielectric wall structure 126 in accordance with some embodiments.

In some embodiments, the gate dielectric layer 170 is made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$-$Al_2O_3$) alloy, other applicable high-k dielectric materials, or a combination thereof. In some embodiments, the gate dielectric layer 170 is formed using CVD, ALD, other applicable methods, or a combination thereof.

In some embodiments, the gate stacks 172 are formed over the gate dielectric layers 170. In some embodiments, the gate stacks 172 are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate stacks 172 are formed using CVD, ALD, electroplating, another applicable method, or a combination thereof.

In some embodiments, the gate structure 168 includes different conductive layers in different portions. For example, portions 168-1p, 168-2p, 168-3p, and 168-4p of the gate structure 168 are formed over the first well region W1, the second well region W2, the third well region W3, and the fourth well region W4 respectively. In some embodiments, the portions 168-1p and 168-4p of the gate structure 168 formed over the first well region W1 and the fourth well region W4 include a first type of work function metal layer, and the portions 168-2p and 168-3p of the gate structure 168 formed over the second well region W2 and the third well region W3 include a second type of work function metal layer.

In some embodiments, the portions 168-1p and 168-4p of the gate structure 168 over the first well region W1 and the fourth well region W4 include P-type metal layers, and the portions 168-2p and 168-3p of the gate structure 168 over the second well region W2 and the third well region W3 include N-type metal layers. For example, a first type of work function metal layer may first be formed in the gate trench 166, and then the portions of the first type of work function metal layer formed over the second well region W2 and the third well region W3 may be removed. Next, a second type of work function metal layer may be formed in the gate trench 166, and a gate electrode layer may be formed over the second type of work function metal layer. Afterwards, a planarization process, such as CMP, may be performed until the interlayer dielectric layer 162 is exposed, thereby forming the gate structure 168. In some other embodiments, the portions of the second type of work function metal layer over the first well region W1 and the fourth well region W4 are removed before forming the gate electrode layer. Since the portions 168-1p, 168-2p, 168-3p, and 168-4p are formed in the gate trench 166, they may be substantially aligned with each other.

After the gate structure 168 is formed, silicide layers 180 and source/drain contacts 182 are formed over the source/drain structures 150-1, 150-2, 150-3, and 150-4, as shown in FIGS. 2M-1, 2M-2, and 2M-3 in accordance with some embodiments. FIG. 2M-4 illustrates the top view of the semiconductor structure 100 in accordance with some embodiments.

More specifically, contact trenches may be formed through the contact etch stop layer 160 and the interlayer dielectric layer 162 to expose the source/drain structures 150-1, 150-2, 150-3, and 150-4. Afterwards, the silicide layers 180 are formed over the exposed portions of the source/drain structures 150-1, 150-2, 150-3, and 150-4, and the source/drain contacts 182 are formed in the contact trenches over the silicide layers 180, as shown in FIGS. 2M-1, 2M-3, and 2M-4 in accordance with some embodiments.

The silicide layers 180 may be formed by forming a metal layer over the top surface of the source/drain structures 150-1, 150-2, 150-3, and 150-4 and annealing the metal layer so the metal layer reacts with the source/drain structures 150-1, 150-2, 150-3, and 150-4 to form the silicide layers 180. The unreacted metal layer may be removed after the silicide layers 180 are formed.

In some embodiments, the source/drain contacts 182 are made of a conductive material including aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof.

The source/drain contacts 182 may further include a liner and/or a barrier layer. For example, a liner (not shown) may be formed on the sidewalls and bottom of the contact trench. The liner may be made of silicon nitride, although any other applicable dielectric may be used as an alternative. The liner may be formed using a plasma enhanced chemical vapor deposition (PECVD) process, although other applicable processes, such as physical vapor deposition or a thermal process, may be used as an alternative. The barrier layer (not shown) may be formed over the liner (if present) and may cover the sidewalls and bottom of the opening. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. The barrier layer may be made of tantalum nitride, although other materials, such as tantalum, titanium, titanium nitride, or the like, may also be used.

As described previously, the semiconductor structure 100 includes the first unit cell C1 and the second unit cell C2 in accordance with some embodiments. In some embodiments, the first unit cell C1 includes a transistor T1 formed over the first well region W1 and a transistor T2 formed over the second well region W2. In some embodiments, the second unit cell C2 includes a transistor T3 formed over the third well region W3 and a transistor T4 formed over the fourth well region W4.

As shown in FIG. 2M-4, the transistors T1 and T2 are forksheet structures, and the transistors T3 and T4 are nanosheet structures in accordance with some embodiments. In some embodiments, the dimension $D_{C1}$ of the first unit cell C1 in the Y direction is substantially equal to the dimension $D_{C2}$ of the second unit cell C2 in the Y direction. In addition, since the dielectric wall structure 126 is formed between the channel structures 108'-1 and 108'-2 as the isolation structure, the distance $D_{FS}$ can be smaller than the distance $D_{SP}$ and the distance $D_{NS}$. Therefore, the spaces for forming the channel structures 108'-1 and 108'-2 may be greater than the spaces for forming the channel structures 108'-3 and 108'-4. Accordingly, the channel structures 108'-1 and 108'-2 may be wider than the channel structures 108'-3 and 108'-4, and the speed of the transistors T1 and T2 may be greater than the of the transistors T3 and T4 in accordance with some embodiments. On the other hands, since the channel structures 108'-3 and 108'-4 may be narrower than the channel structures 108'-1 and 108'-2, and the power consumption of the transistors T3 and T4 may be lower than the of the transistors T1 and T2 in accordance with some embodiments.

As described above, the dielectric wall structure 126 is formed over the boundary of the first well region W1 and the second well region W2 and longitudinally oriented along the X direction in accordance with some embodiments. In some embodiments, the top surface of the dielectric wall structure 126 is higher than the topmost surface of the channel structures 108'-1 and the topmost surface of the channel structures 108'-2. In some embodiments, the bottom surface of the dielectric wall structure 126 is lower than the bottommost surface of the channel structures 108'-1 and the bottommost surface of the channel structures 108'-2 and is substantially level with the top surface of the isolation structures 116.

In some embodiments, the gate structure 168 is longitudinally oriented along the Y direction and wraps around the channel structures 108'-1, 108'-2, 108'-3, and 108'-4 and the dielectric wall structure 126. More specifically, the portions 168-1 and 168-2 of the gate structure 168 are in contact with three side surfaces of the channel structures 108'-1 and three side surfaces of the channel structures 108'-2 respectively in the Y-Z cross-sectional view in accordance with some embodiments. Meanwhile, the portions 168-3 and 168-4 of the gate structure 168 are in contact with four side surfaces of the channel structures 108'-3 and four side surfaces of the channel structures 108'-4 respectively in the Y-Z cross-sectional view in accordance with some embodiments.

Figure 3A:
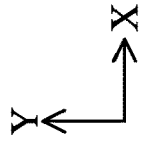
FIG. 3A illustrates a top view of a semiconductor structure in accordance with some embodiments.
Figures 3B, 3C:
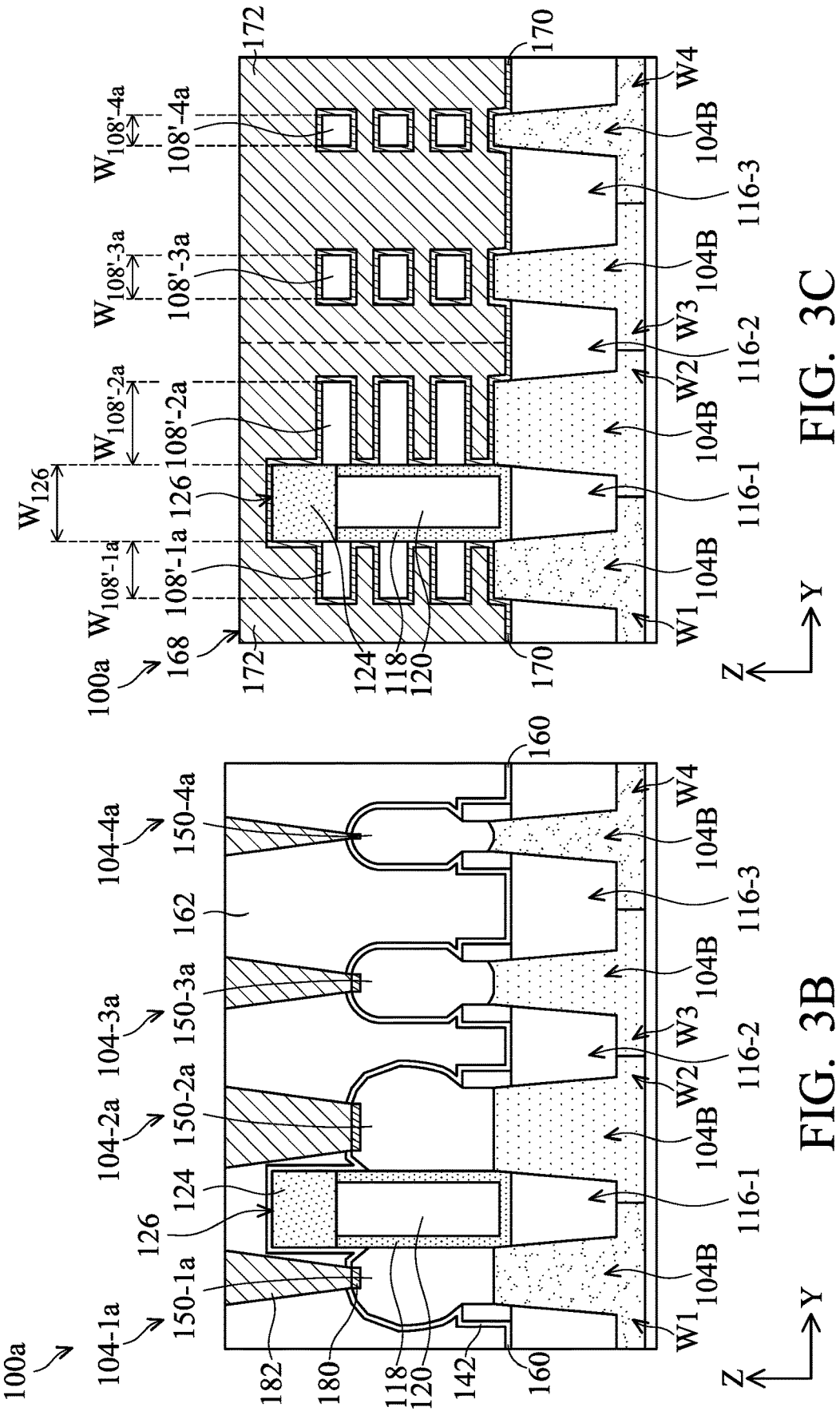
FIG. 3B illustrates the cross-sectional view of the semiconductor structure shown along lines $Y_{SDa}$-$Y_{1SDa}$' in FIG. 3A in accordance with some embodiments.
FIG. 3C illustrates the cross-sectional view of the semiconductor structure shown along lines $Y_{MGa}$-$Y_{MGa}$' in FIG. 3A in accordance with some embodiments.
Figure 3D:
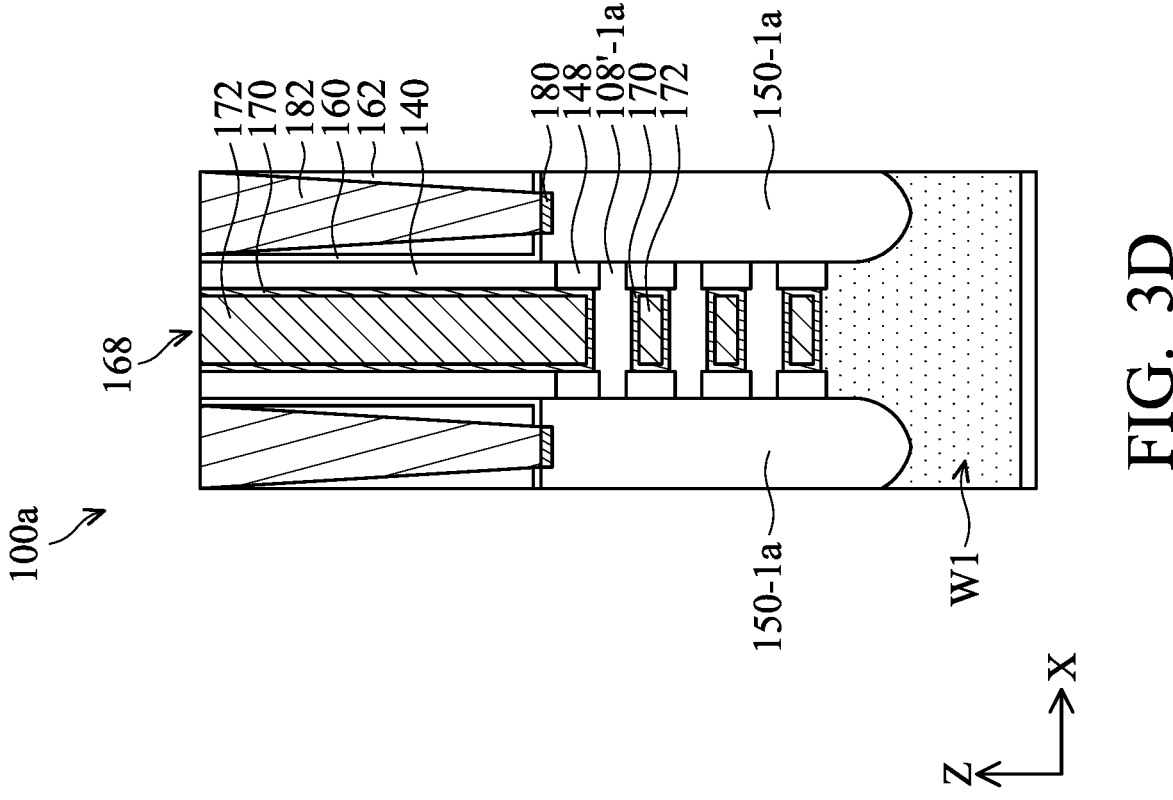
FIG. 3D illustrates the cross-sectional view of the semiconductor structure shown along lines $X_{108'-1a}$-$X_{108'-1a}$' in FIG. 3A in accordance with some embodiments.

FIG. 3A illustrates a top view of a semiconductor structure 100a in accordance with some embodiments. FIG. 3B illustrates the cross-sectional view of the semiconductor structure 100a shown along lines $Y_{SDa}$-$Y_{1SDa}$' (i.e. in the Y direction) in FIG. 3A in accordance with some embodiments. FIG. 3C illustrates the cross-sectional view the semiconductor structure 100a shown along lines $Y_{MGa}$-$Y_{MGa}$' (i.e. in the Y direction) in FIG. 3A in accordance with some embodiments. FIG. 3D illustrates the cross-sectional view of the semiconductor structure 100a shown along lines $X_{108'-1a}$-$X_{108'-1a}$' (i.e. in the X direction) in FIG. 3A in accordance with some embodiments. The semiconductor structure 100a may be similar to the semiconductor structure 100 described previously, except its channel structures have different widths in accordance with some embodiments.

More specifically, processes shown in FIGS. 1A to 1C are performed to form fin structures 104-1a, 104-2a, 104-3a, and 104-4a in accordance with some embodiments. In some embodiments, the fin structure 104-2a is wider than the fin structure 104-1a in the Y direction. In some embodiments, the fin structure 104-1a is wider than the fin structure 104-3a in the Y direction. In some embodiments, the fin structure 104-3a is wider than the fin structure 104-4a in the Y direction.

After the fin structures 104-1a, 104-2a, 104-3a, and 104-4a are formed, processes shown in FIGS. 2A-1 to 2M-1, 2A-2 to 2M-2, 2A-3 to 2M-3, and 2M-4 are performed to form the semiconductor structure 100a, as shown in FIGS. 3A to 3D in accordance with some embodiments. More specifically, the semiconductor structure 100a includes channel structures 108'-1a, 108'-2a, 108'-3a, and 108'-4a and source/drain structures 150-1a, 150-2a, 150-3a, and 150-4a attached to the channel structures 108'-1a, 108'-2a, 108'-3a, and 108'-4a in accordance with some embodiments.

Similar to the semiconductor structure 100, the semiconductor structure 100a also include the first unit cell C1 having the dimension $D_{C1}$ and the second unit cell C2 having the dimension $D_{C2}$. The first unit cell C1 includes the channel structures 108'-1a and 108'-2a having the forksheet structures and the second unit cell C2 includes the channel structures 108'-3a and 108'-4a having the nanosheet structures. In some embodiments, both of the channel structures 108'-1a and 108'-2a are wider than both of the channel structures 108'-3a and 108'-4a. That is, the transistors requiring a greater speed may be arranged in the first unit cell C1 to have forksheet structures. On the other hands, the transistors requiring a lower power consumption may be arranged in the second unit cell C2 to have nanosheet structures.

In some embodiments, the width $w_{108'-2a}$ of the channel structures 108'-2a is greater than the width $W_{108'-1a}$ of the channel structures 108'-1a in the Y direction. In some embodiments, the width $W_{108'-1a}$ of the channel structures 108'-1a is greater than the width $W_{108'-3a}$ of the channel structures 108'-3a in the Y direction. In some embodiments, the width $W_{108'-3a}$ of the channel structures 108'-3a is greater than the width $W_{108'-4a}$ of the channel structures 108'-4a in the Y direction. In some embodiments, the distance $D_{FSa}$ between the channel structures 108'-1a and 108'-2a is smaller than both the distance $D_{SPa}$ between the channel structures 108'-2a and 108'-3a and the distance $D_{NSa}$ between the channel structures 108'-3a and 108'-4a.

Processes and materials for forming the semiconductor structure 100a may be similar to, or the same as, those for forming the semiconductor structure 100 described previously and are not repeated herein. For example, the processes and materials for forming the channel structures 108'-1$a$, 108'-2$a$, 108'-3$a$, and 108'-4$a$, the fin structures 104-1$a$, 104-2$a$, 104-3$a$, and 104-4$a$, and the source/drain structures 150-1$a$, 150-2$a$, 150-3$a$, and 150-4$a$ may be similar to, or the same as, those for forming the channel structures 108'-1, 108'-2, 108'-3, and 108'-4, the fin structures 104-1, 104-2, 104-3, and 104-4, and the source/drain structures 150-1, 150-2, 150-3, and 150-4 described previously.

Figure 4A:
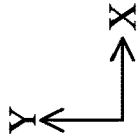
FIG. 4A illustrates a top view a semiconductor structure in accordance with some embodiments.
Figures 4B, 4C:
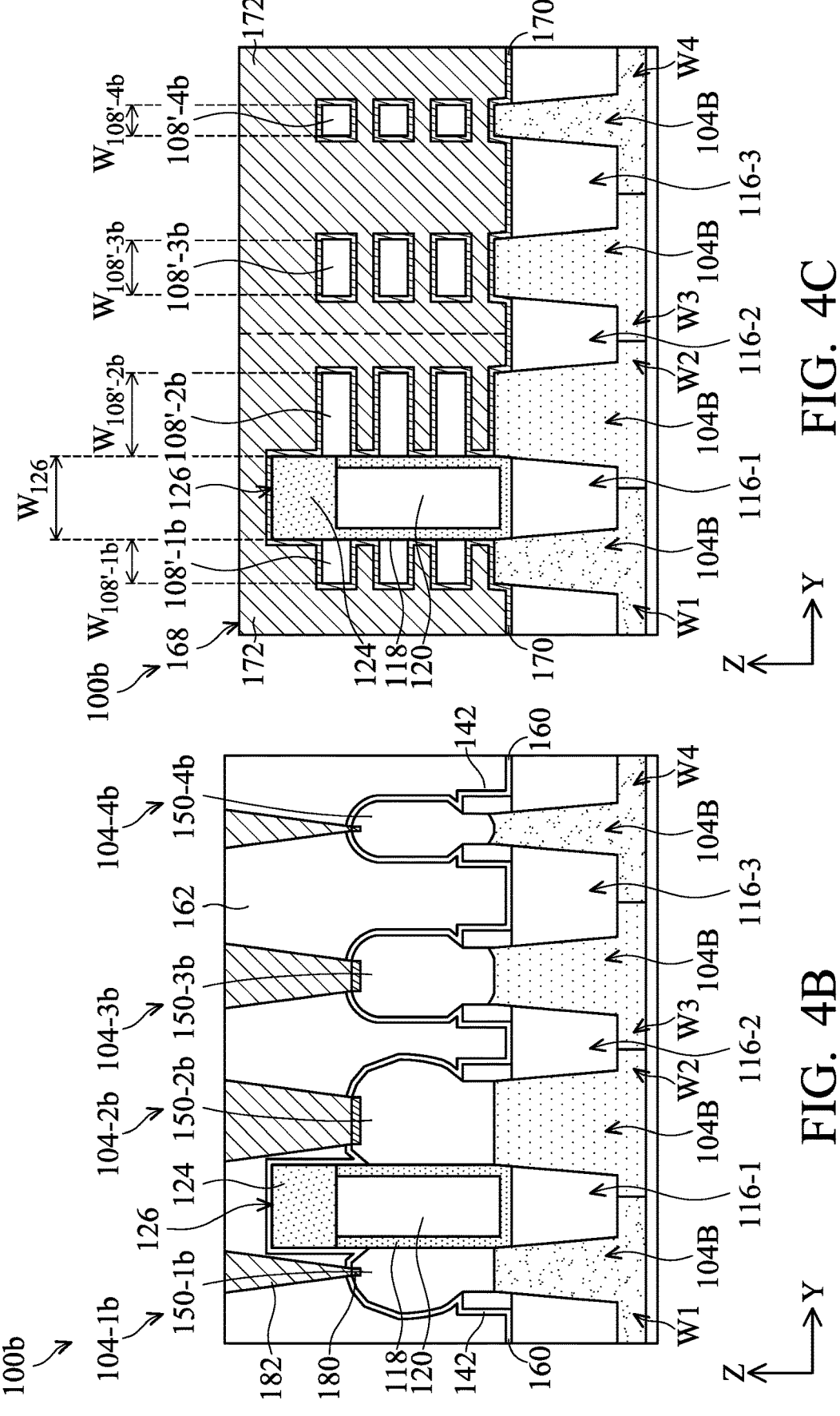
FIG. 4B illustrates the cross-sectional view of the semiconductor structure shown along lines $Y_{SDb}$-$Y_{1SDb}$' in FIG. 4A in accordance with some embodiments.
FIG. 4C illustrates the cross-sectional view of the semiconductor structure shown along lines $Y_{MGb}$-$Y_{MGb}$' in FIG. 4A in accordance with some embodiments.
Figure 4D:
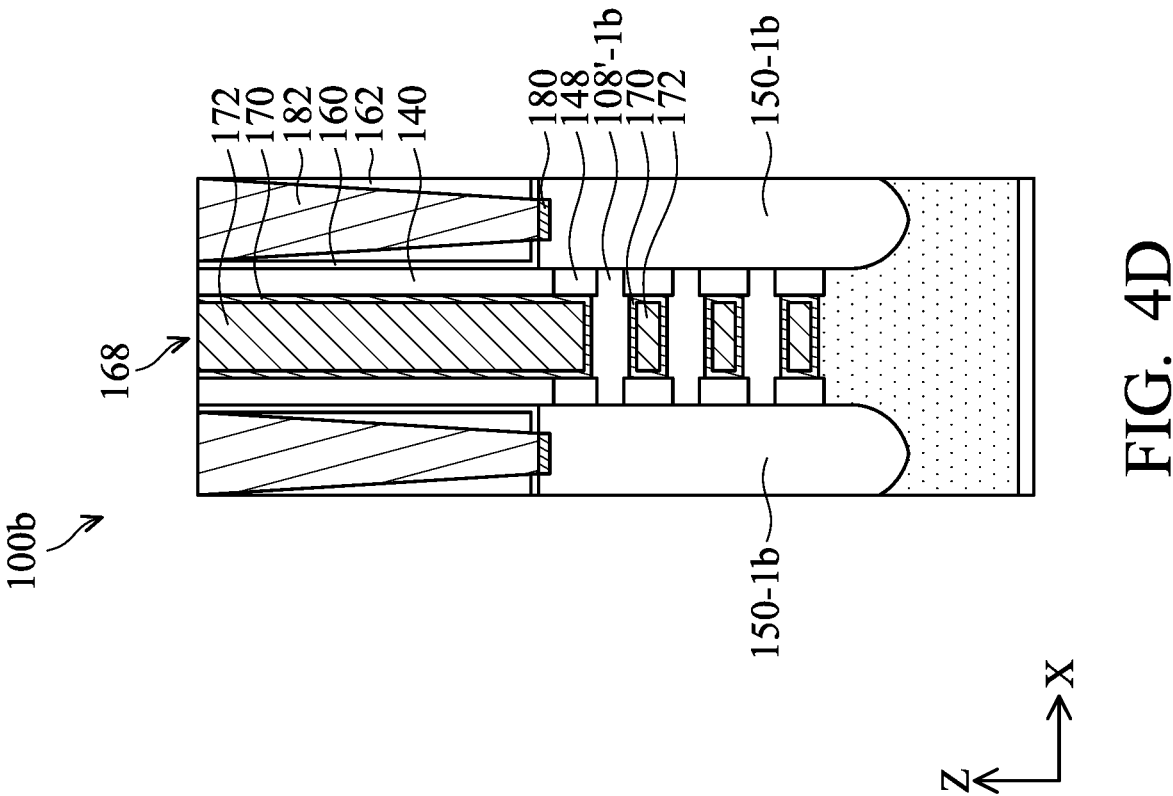
FIG. 4D illustrates the cross-sectional view of the semiconductor structure shown along lines $X_{108'-1b}$-$X_{108'-1b}$' in FIG. 4A in accordance with some embodiments.

FIG. 4A illustrates a top view of a semiconductor structure 100$b$ in accordance with some embodiments. FIG. 4B illustrates the cross-sectional view of the semiconductor structure 100$b$ shown along lines $Y_{SDb}$-$Y_{1SDb}$' (i.e. in the Y direction) in FIG. 4A in accordance with some embodiments. FIG. 4C illustrates the cross-sectional view of the semiconductor structure 100$b$ shown along lines $Y_{MGb}$-$Y_{MGb}$' (i.e. in the Y direction) in FIG. 4A in accordance with some embodiments. FIG. 4D illustrates the cross-sectional view of the semiconductor structure 100$b$ shown along lines $X_{108'-1b}$-$X_{108'-1b}$' (i.e. in the X direction) in FIG. 4A in accordance with some embodiments. The semiconductor structure 100$b$ may be similar to the semiconductor structure 100 described previously, except its channel structures have different widths in accordance with some embodiments.

More specifically, processes shown in FIGS. 1A to 1C are performed to form fin structures 104-1$b$, 104-2$b$, 104-3$b$, and 104-4$b$ in accordance with some embodiments. In some embodiments, the fin structure 104-2$b$ is wider than the fin structure 104-3$b$ in the Y direction. In some embodiments, the fin structure 104-3$b$ is wider than the fin structure 104-1$b$ in the Y direction. In some embodiments, the fin structure 104-1$b$ is wider than the fin structure 104-4$b$ in the Y direction.

After the fin structures 104-1$b$, 104-2$b$, 104-3$b$, and 104-4$b$ are formed, processes shown in FIGS. 2A-1 to 2M-1, 2A-2 to 2M-2, 2A-3 to 2M-3, and 2M-4 are performed to form the semiconductor structure 100$b$, as shown in FIGS. 4A to 4D in accordance with some embodiments. More specifically, the semiconductor structure 100$b$ includes channel structures 108'-1$b$, 108'-2$b$, 108'-3$b$, and 108'-4$b$ and source/drain structures 150-1$b$, 150-2$b$, 150-3$b$, and 150-4$b$ attached to the channel structures 108'-1$b$, 108'-2$b$, 108'-3$b$, and 108'-4$b$ in accordance with some embodiments.

Similar to the semiconductor structure 100, the semiconductor structure 100$b$ also include the first unit cell C1 having the dimension $D_{C1}$ and the second unit cell C2 having the dimension $D_{C2}$. The first unit cell C1 includes the channel structures 108'-1$b$ and 108'-2$b$ having the forksheet structures and the second unit cell C2 includes the channel structures 108'-3$b$ and 108'-4$b$ having the nanosheet structures. In some embodiments, the width $W_{108'-2b}$ of the channel structures 108'-2$b$ is greater than the width $W_{108'-3b}$ of the channel structures 108'-3$b$ in the Y direction. In some embodiments, the width $W_{108'-3b}$ of the channel structures 108'-3$b$ is greater than the width $W_{108'-1b}$ of the channel structures 108'-1$b$ in the Y direction. In some embodiments, the width $W_{108'-1b}$ of the channel structures 108'-1$b$ is greater than the width $W_{108'-4b}$ of the channel structures 108'-4$b$ in the Y direction. In some embodiments, the distance $D_{FSb}$ between the channel structures 108'-1$b$ and 108'-2$b$ is smaller than both the distance $D_{SPb}$ between the channel structures 108'-2$b$ and 108'-3$b$ and the distance $D_{NSb}$ between the channel structures 108'-3$b$ and 108'-4$b$.

Processes and materials for forming the semiconductor structure 100$b$ may be similar to, or the same as, those for forming the semiconductor structure 100 described previously and are not repeated herein. For example, the processes and materials for forming the channel structures 108'-1$b$, 108'-2$b$, 108'-3$b$, and 108'-4$b$, the fin structures 104-1$b$, 104-2$b$, 104-3$b$, and 104-4$b$, and the source/drain structures 150-1$b$, 150-2$b$, 150-3$b$, and 150-4$b$ may be similar to, or the same as, those for forming the channel structures 108'-1, 108'-2, 108'-3, and 108'-4, the fin structures 104-1, 104-2, 104-3, and 104-4, and the source/drain structures 150-1, 150-2, 150-3, and 150-4 described previously.

Figure 5A:
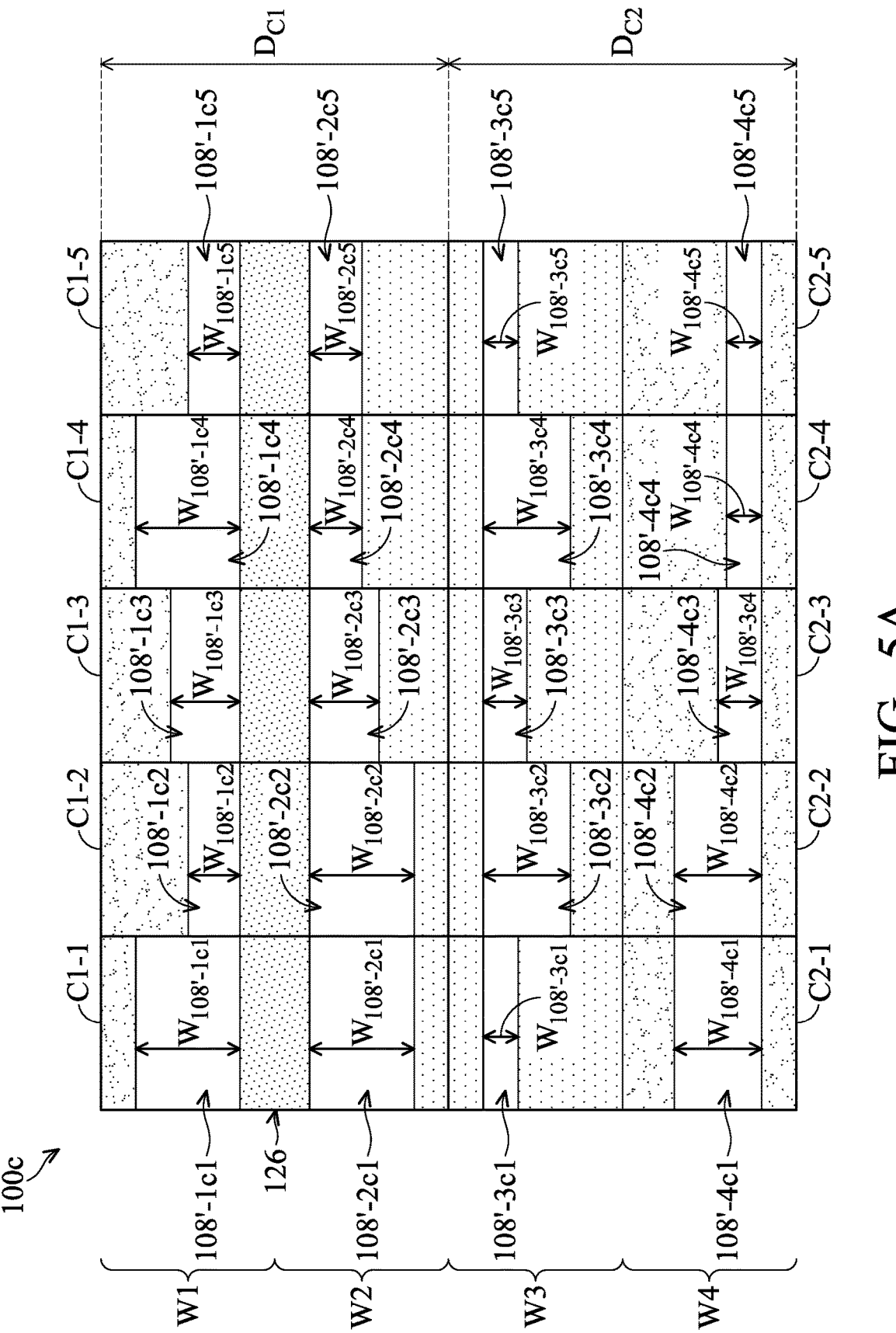
FIG. 5A illustrates a simplified top view of a semiconductor structure in accordance with some embodiments.
Figure 5B:
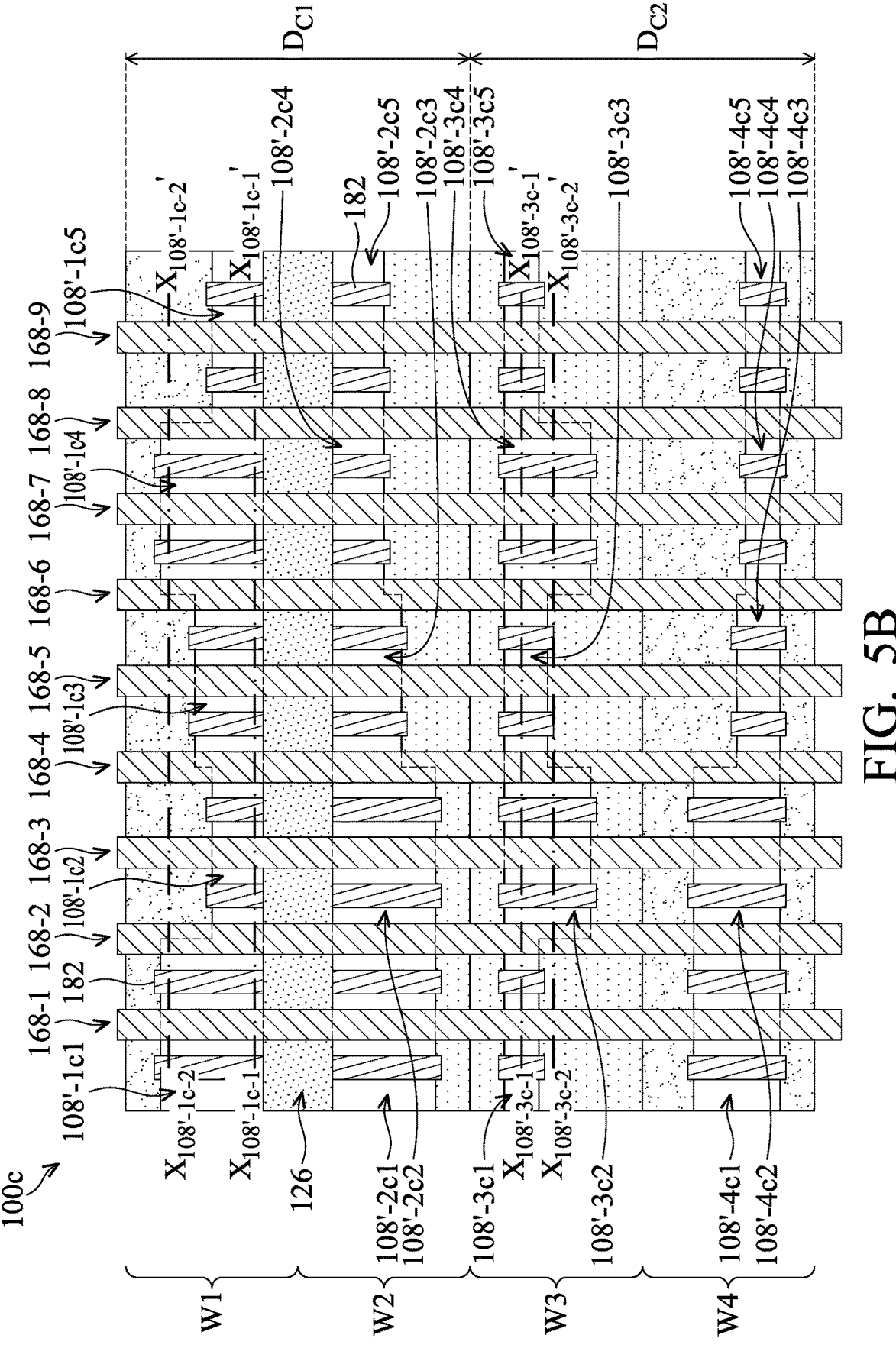
FIG. 5B illustrates a top view of the semiconductor structure with more elements shown in the figure in accordance with some embodiments.
Figure 5C:
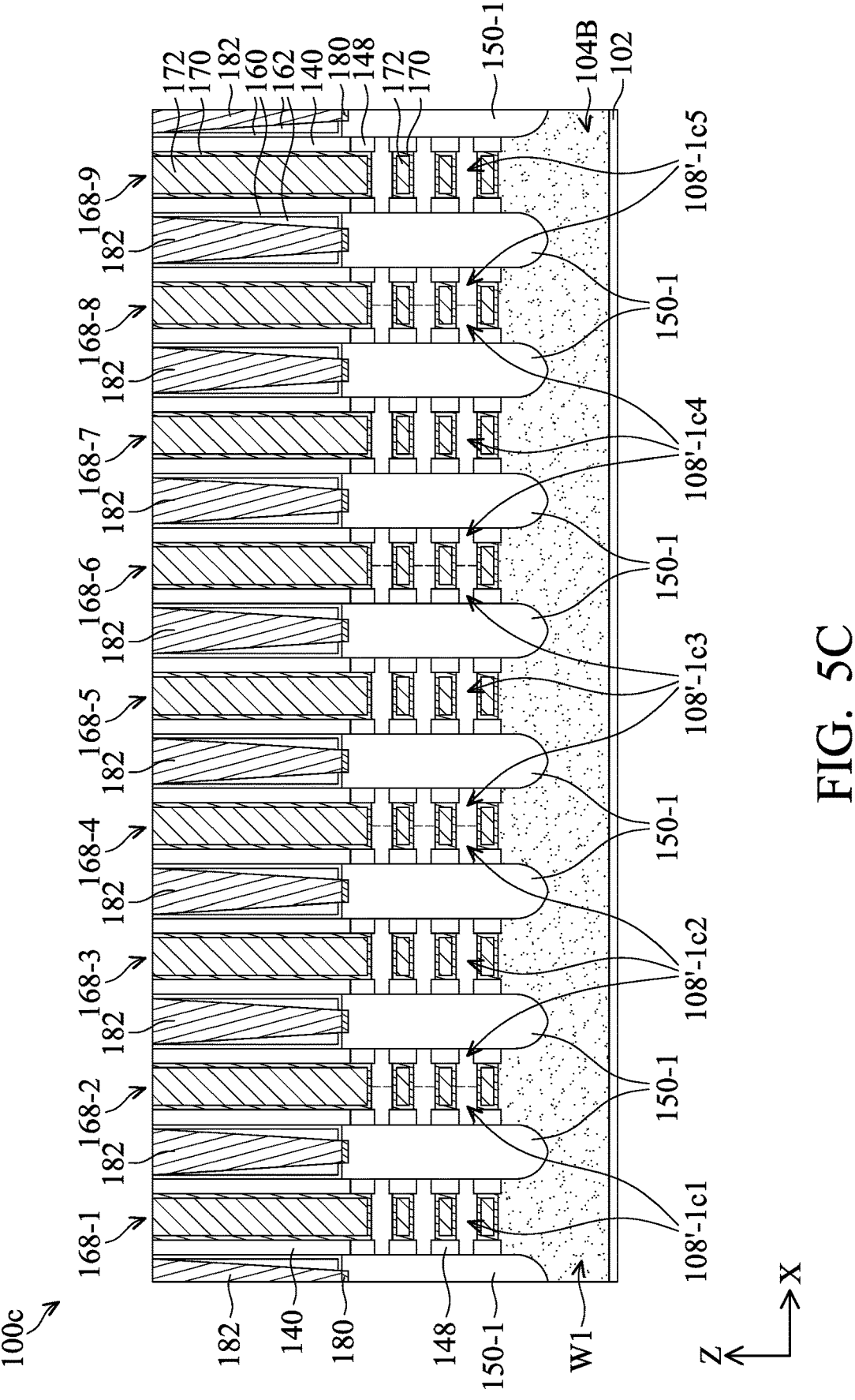
FIG. 5C illustrates the cross-sectional view of the semiconductor structure shown along lines $X_{108'-1c-1}$-$X_{108'-1c-1}$' in FIG. 5B in accordance with some embodiments.
Figure 5D:
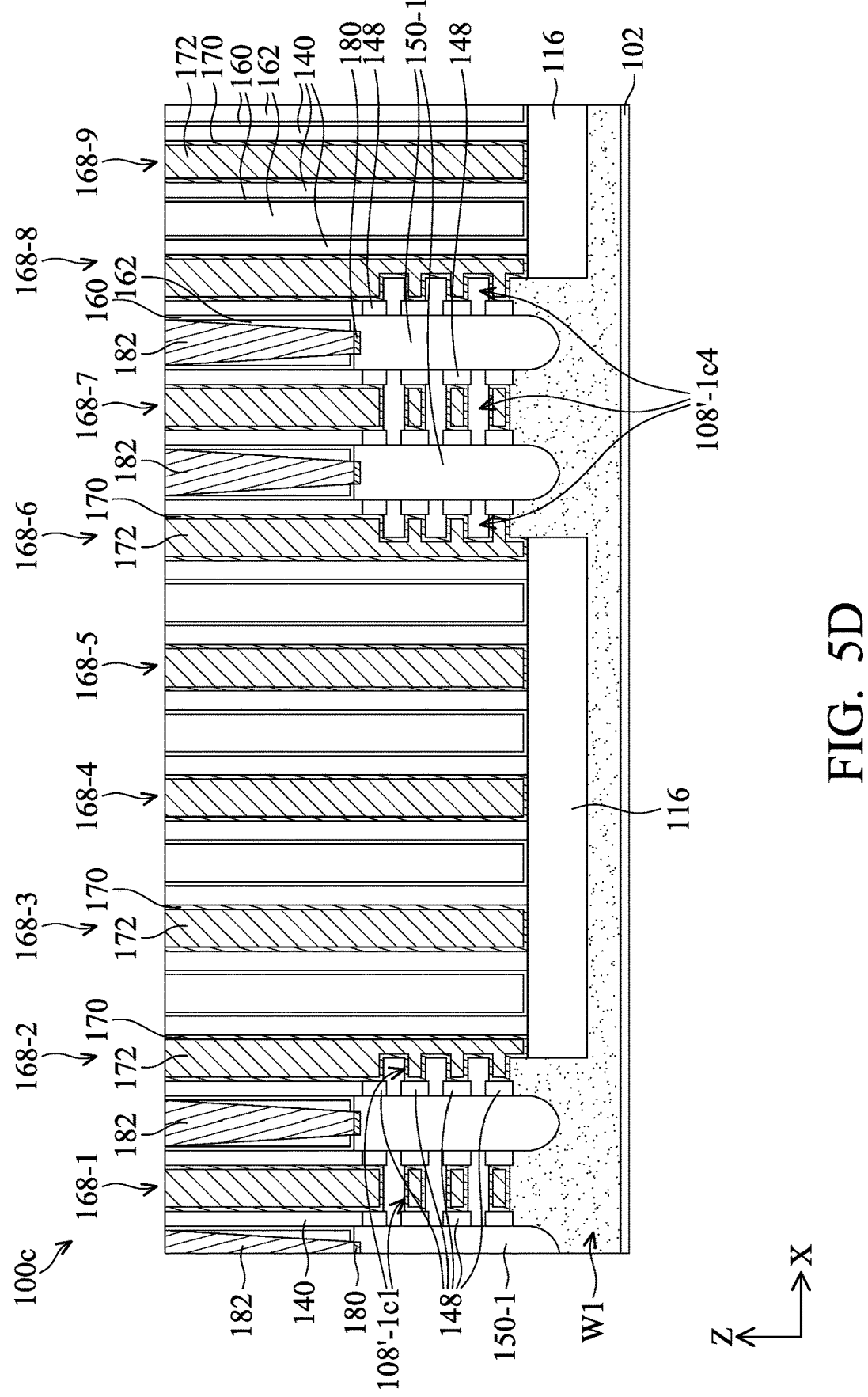
FIG. 5D illustrates the cross-sectional view of the semiconductor structure shown along lines $X_{108'-1c-2}$-$X_{108'-1c-2}$' in FIG. 5B in accordance with some embodiments.
Figure 5E:
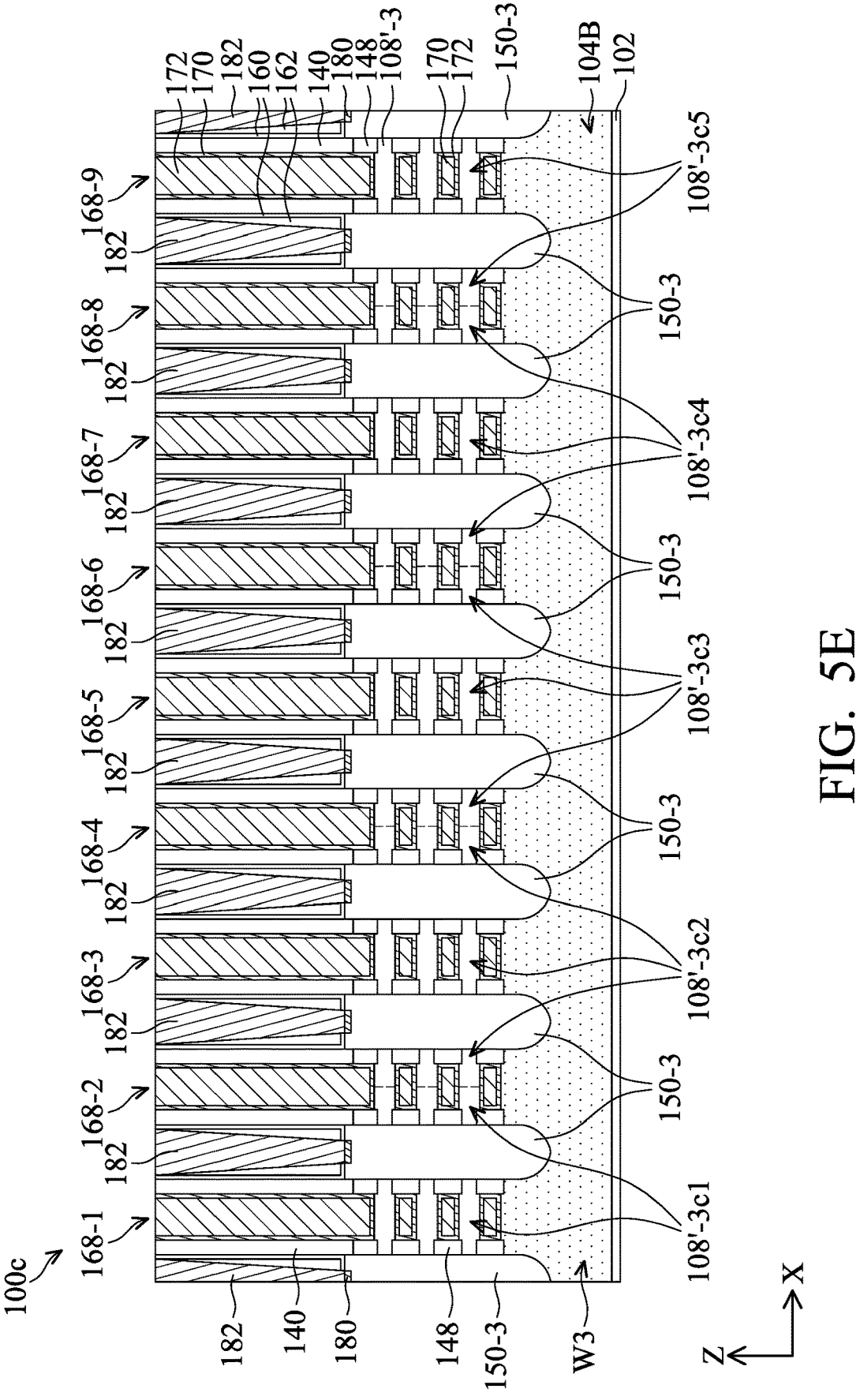
FIG. 5E illustrates the cross-sectional view of the semiconductor structure shown along lines $X_{108'-3c-1}$-$X_{108'-3c-1}$' in FIG. 5B in accordance with some embodiments.
Figure 5F:
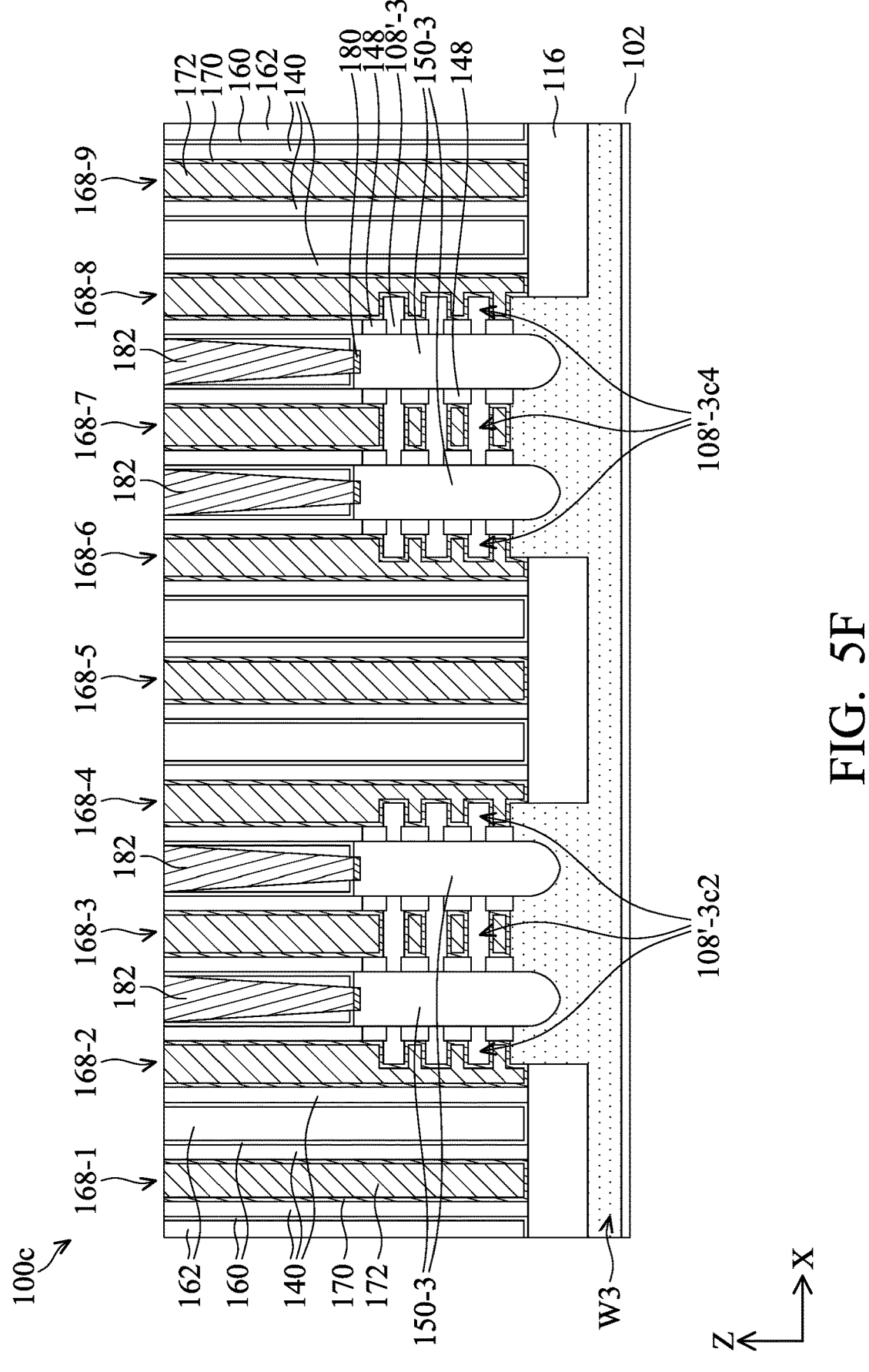
FIG. 5F illustrates the cross-sectional view of the semiconductor structure shown along lines $X_{108'-3c-2}$-$X_{108'-3c-2}$' in FIG. 5B in accordance with some embodiments.

FIG. 5A illustrates a simplified top view of a semiconductor structure 100$c$ in accordance with some embodiments. FIG. 5B illustrates the top view of the semiconductor structure 100$c$ with more elements depicted, in accordance with some embodiments. FIG. 5C illustrates the cross-sectional view of the semiconductor structure 100$c$ shown along lines $X_{108'-1c-1}$-$X_{108'-1c-1}$' (i.e. in the X direction) in FIG. 5B in accordance with some embodiments. FIG. 5D illustrates the cross-sectional view of the semiconductor structure 100$c$ shown along lines $X_{108'-1c-2}$-$X_{108'-1c-2}$' (i.e. in the X direction) in FIG. 5B in accordance with some embodiments. FIG. 5E illustrates the cross-sectional view of the semiconductor structure 100$c$ shown along lines $X_{108'-3c-1}$-$X_{108-3c-1}$' (i.e. in the X direction) in FIG. 5B in accordance with some embodiments. FIG. 5F illustrates the cross-sectional view of the semiconductor structure 100$c$ shown along lines $X_{108'-3c-2}$-$X_{108'-3c-2}$' (i.e. in the X direction) in FIG. 5B in accordance with some embodiments.

The semiconductor structure 100$c$ may include a numbers of first unit cells and second unit cells, and these unit cells may be similar to those in the semiconductor structures 100, 100$a$, and 100$b$ described previously. More specifically, the semiconductor structure 100$c$ includes first unit cells C1-1, C1-2, C1-3, C1-4, and C1-5 and second unit cells C2-1, C2-2, C2-3, C2-4, and C2-5, as shown in FIG. 5A in accordance with some embodiments. In some embodiments, the first unit cells C1-1, C1-2, C1-3, C1-4, and C1-5 are substantially aligned with each other along the X direction, and the second unit cells C2-1, C2-2, C2-3, C2-4, and C2-5 are substantially aligned with each other along the X direction.

The first unit cells C1-1, C1-2, C1-3, C1-4, and C1-5 may include forksheet structures similar to those described previously. In some embodiments, the first unit cell C1-1 includes channel structures 108'-1$c1$ and 108'-2$c1$ formed at opposite sides of the dielectric wall structure 126 in the first well region W1 and the second well region W2 respectively. In some embodiments, the width $W_{108'-1c1}$ is substantially equal to the width $W_{108'-2c1}$. In some embodiments, the first unit cell C1-2 includes channel structures 108'-1$c2$ and 108'-2$c2$ formed at opposite sides of the dielectric wall structure 126 in the first well region W1 and the second well region W2 respectively. In some embodiments, the width $W_{108'-1c2}$ is smaller than the width $W_{108'-2c2}$. In some embodiments, the first unit cell C1-3 includes channel structures 108'-1$c3$ and 108'-2$c3$ formed at opposite sides of the dielectric wall structure 126 in the first well region W1 and the second well region W2 respectively. In some embodiments, the width $W_{108'-1c3}$ is substantially equal to the width $W_{108'-2c3}$. In some embodiments, the first unit cell C1-4 includes channel structures 108'-1$c4$ and 108'-2$c4$ formed at opposite sides of the dielectric wall structure 126 in the first well region W1 and the second well region W2 respectively. In some embodiments, the width $W_{108'-1c4}$ is greater than the width $W_{108'-2c4}$. In some embodiments, the first unit cell C1-5 includes channel structures 108'-1$c5$ and 108'-2$c5$ formed at opposite sides of the dielectric wall structure 126 in the first well region W1 and the second well region W2 respectively. In some embodiments, the width $W_{108'-1c5}$ is substantially equal to the width $W_{108'-2c5}$.

The second unit cells C2-1, C2-2, C2-3, C2-4, and C2-5 may include nanosheet structures similar to those described previously. In some embodiments, the second unit cell C2-1 includes channel structures 108'-3c1 and 108'-4c1 formed in the third well region W3 and the fourth well region W4 respectively. In some embodiments, the width $W_{108'-3c1}$ is smaller than the width $W_{108'-4c1}$. In some embodiments, the second unit cell C2-2 includes channel structures 108'-3c2 and 108'-4c2 formed in the third well region W3 and the fourth well region W4 respectively. In some embodiments, the width $W_{108'-3c2}$ is substantially equal to the width $W_{108'-4c2}$. In some embodiments, the second unit cell C2-3 includes channel structures 108'-3c3 and 108'-4c3 formed in the third well region W3 and the fourth well region W4 respectively. In some embodiments, the width $W_{108'-3c3}$ is substantially equal to the width $W_{108'-4c3}$. In some embodiments, the second unit cell C2-4 includes channel structures 108'-3c4 and 108'-4c4 formed in the third well region W3 and the fourth well region W4 respectively. In some embodiments, the width $W_{108'-3c4}$ is greater than the width $W_{108'-4c4}$. In some embodiments, the second unit cell C2-5 includes channel structures 108'-3c5 and 108'-4c5 formed in the third well region W3 and the fourth well region W4 respectively. In some embodiments, the width $W_{108'-3c5}$ is substantially equal to the width $W_{108'-4c5}$.

As shown in FIG. 5A, the channel structures 108'-1c1, 108'-1c2, 108'-1c3, 108'-1c4, and 108'-1c5 formed in the first well region W1 may have various widths. In some embodiments, the sidewalls of the channel structures 108'-1c1, 108'-1c2, 108'-1c3, 108'-1c4, and 108'-1c5 attached to the dielectric wall structure 126 are substantially aligned with each other. In some embodiments, the width $W_{108'-1c1}$ is substantially equal to the width $W_{108'-1c4}$ and is greater than the width $W_{108'-1c3}$. In some embodiments, the width $W_{108'-1c2}$ is substantially equal to the width $W_{108'-1c5}$ and smaller than the width $W_{108'-1c3}$. In some embodiments, the difference between the greatest width (e.g. the width $W_{108'-1c1}$) and the smallest width (e.g. the width $W_{108'-1c2}$) in the first well region W1 is smaller than about 50 nm. Since the difference of the widths between different first unit cells are relatively small, additional isolation features between these unit cells may not be required. Therefore, the formation of the manufacturing processes may be simplified.

Similarly, the channel structures 108'-2c1, 108'-2c2, 108'-2c3, 108'-2c4, and 108'-2c5 formed in the second well region W2 may have various widths. In some embodiments, the sidewalls of the channel structures 108'-2c1, 108'-2c2, 108'-2c3, 108'-2c4, and 108'-2c5 attached to the dielectric wall structure 126 are substantially aligned with each other. In some embodiments, the width $W_{108'-2c1}$ is substantially equal to the width $W_{108'-2c2}$ and is greater than the width $W_{108'-2c3}$. In some embodiments, the width $W_{108'-2c4}$ is substantially equal to the width $W_{108'-2c5}$ and smaller than the width $W_{108'-2c3}$. In some embodiments, the difference between the greatest width (e.g. the width $W_{108'-2c1}$) and the smallest width (e.g. the width $W_{108'-2c4}$) in the second well region W2 is smaller than about 50 nm.

In addition, the channel structures 108'-3c1, 108'-3c2, 108'-3c3, 108'-3c4, and 108'-3c5 formed in the third well region W3 may have various widths. In some embodiments, the sidewalls of the channel structures 108'-3c1, 108'-3c2, 108'-3c3, 108'-3c4, and 108'-3c5 facing the first unit cells C1-1 to C1-5 are substantially aligned with each other. In some embodiments, the width $W_{108'-3c2}$ is substantially equal to the width $W_{108'-3c4}$ and is greater than the width $W_{108'-3c3}$. In some embodiments, the width $W_{108'-3c1}$ is substantially equal to the width $W_{108'-3c5}$ and smaller than the width $W_{108'-3c3}$. In some embodiments, the difference between the greatest width (e.g. the width $W_{108'-3c2}$) and the smallest width (e.g. the width $W_{108'-3c1}$) in the third well region W3 is smaller than about 50 nm.

Similarly, the channel structures 108'-4c1, 108'-4c2, 108'-4c3, 108'-4c4, and 108'-4c5 formed in the fourth well region W4 may have various widths. In some embodiments, the sidewalls of the channel structures 108'-4c1, 108'-4c2, 108'-4c3, 108'-4c4, and 108'-4c5 away from the first unit cells C1-1 to C1-5 are substantially aligned with each other. In some embodiments, the width $W_{108'-4c1}$ is substantially equal to the width $W_{108'-4c2}$ and is greater than the width $W_{108'-4c3}$. In some embodiments, the width $W_{108'-4c4}$ is substantially equal to the width $W_{108'-4c5}$ and smaller than the width $W_{108'-4c3}$. In some embodiments, the difference between the greatest width (e.g. the width $W_{108'-4c1}$) and the smallest width (e.g. the width $W_{108'-4c4}$) in the fourth well region W4 is smaller than about 50 nm. In some embodiments, the distances between the channel structures in the third well region W3 and the channel structures in the fourth well region W4 in the Y direction in the second unit cells C2-1 to C2-5 may be various.

In some embodiments, the greatest width (e.g. the width $W_{108'-1c1}$) of the channel structures in the Y direction in the first unit cells C1-1, C1-2, C1-3, C1-4, and C1-5 is greater than the greatest width (e.g. the width $W_{108'-3c2}$) of the channel structures in the Y direction in second unit cells C2-1, C2-2, C2-3, C2-4, and C2-5. In some embodiments, the smallest width (e.g. the width $W_{108'-1c2}$) of the channel structures in the Y direction in the first unit cells C1-1, C1-2, C1-3, C1-4, and C1-5 is greater than the smallest width (e.g. the width $W_{108'-3c1}$) of the channel structures in the Y direction in second unit cells C2-1, C2-2, C2-3, C2-4, and C2-5. In some embodiments, the width $W_{108'-1c1}$ is greater than the width $W_{108'-4c1}$. In some embodiments, the width $W_{108'-4c1}$ is greater than the width $W_{108'-1c3}$. In some embodiments, the width $W_{108'-1c3}$ is greater than the width $W_{108'-1c2}$. In some embodiments, the width $W_{108'-1c2}$ is greater than the width $W_{108'-3c3}$. In some embodiments, the width $W_{108'-3c3}$ is greater than the width $W_{108'-3c1}$.

In some embodiments, the difference between the greatest width (e.g. the width $W_{108'-1c1}$) and the smallest width (e.g. the width $W_{108'-3c1}$) in the semiconductor structure 100c is greater than about 50 nm. That is, the channel structures with a large range of width may be formed in the semiconductor structure 100c. However, the channel structures with smaller width's difference are grouped in the same well region, so that the channel structures may have smaller width's difference with their neighboring channel structures. Accordingly, additional isolation structures may not be needed to form at the boundaries of the unit cells, and the manufacturing processes and/or the total size of the semiconductor structure 100c may be reduced.

Although not shown in FIG. 5A, other elements formed in the semiconductor structures 100, 100a, and 100b may also be formed in the semiconductor structure 100c. For examples, gate structures 168-1, 168-2, 168-3, 168-4, 168-5, 168-6, 168-7, 168-8, and 168-9 are formed across the first well region W1 to the fourth well region W4 to wrap around the channel structures, as shown in FIGS. 5B to 5F in accordance with some embodiments. In some embodiments, the gate structures 168-2, 168-4, 168-6, and 168-8 are formed at the boundaries of the unit cells and therefore may be configures as dummy gate structures. In some embodiments, the gate structures 168-2, 168-4, 168-6, and 168-8 wraps the end portions of the channel structures, as shown in FIGS. 5B, 5D, and 5F in accordance with some embodiments. As shown in FIGS. 5D and 5F, since the channel structures in the same well region may have different widths, some portions of the gate structures are formed over the isolation structures 116 while other portions of the gate structures are formed around the channel structures in accordance with some embodiments.

Processes and materials for forming the first unit cells C1-1, C1-2, C1-3, C1-4, and C1-5 and the second unit cells C2-1, C2-2, C2-3, C2-4, and C2-5 in the semiconductor structure 100*c* may be similar to, or the same as, those for forming the first unit cells C1 and the second unit cells C2 in the semiconductor structures 100, 100*a*, and 100*b* described previously and are not repeated herein. For example, the processes and materials for forming the channel structures 108'-1*c*1 to 108'-1*c*5, 108'-2*c*1 to 108'-2*c*5, 108'-3*c*1 to 108'-3*c*5, and 108'-4*c*1 to 108'-4*c*5 and the gate structures 168-1 to 168-9 may be similar to, or the same as, those for forming the channel structures 108'-1, 108'-2, 108'-3, and 108'-4 and the gate structures 168 described previously.

Figures 1, 6A:
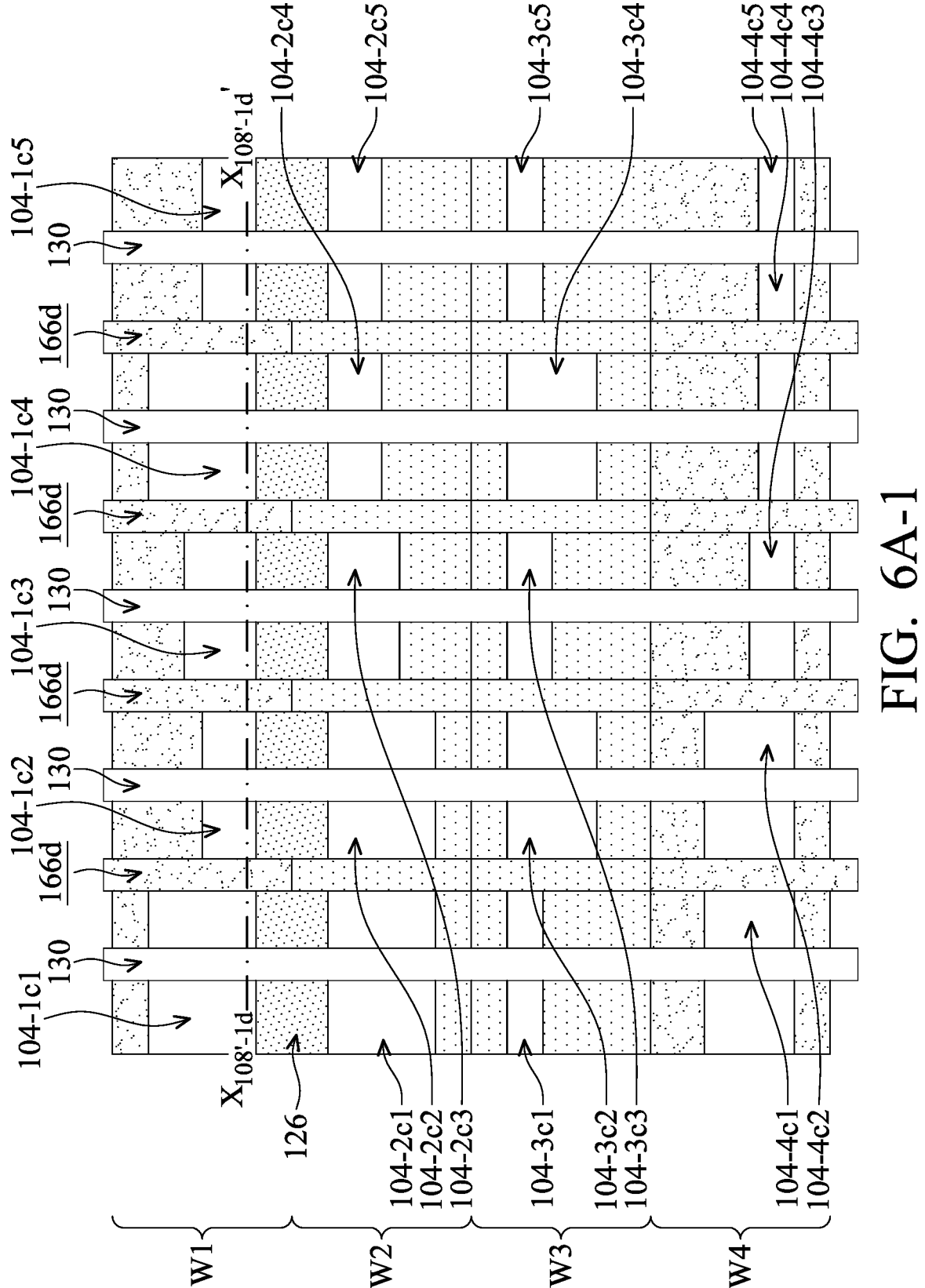
Figures 2, 6A:
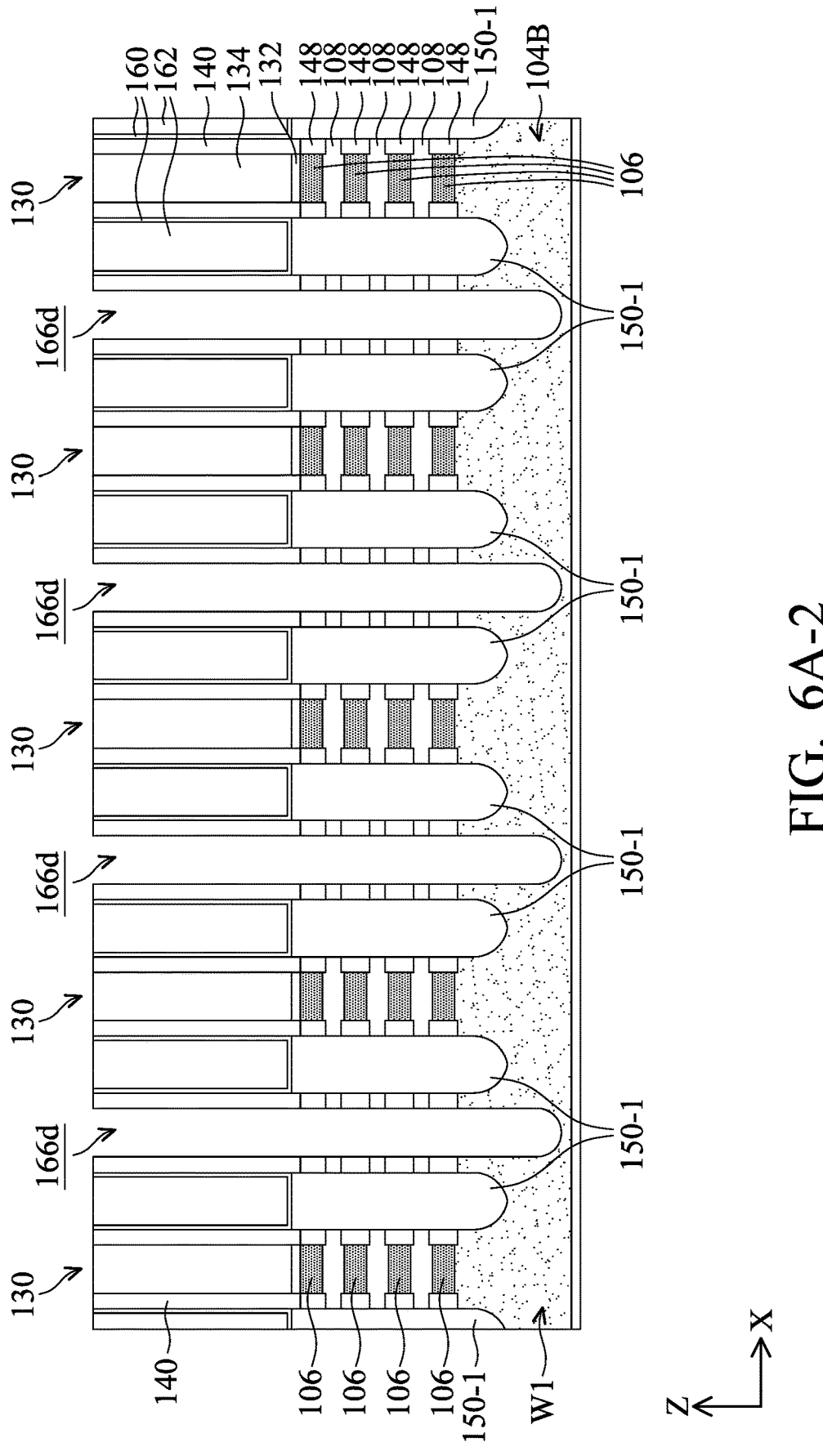
Figures 1, 6B:
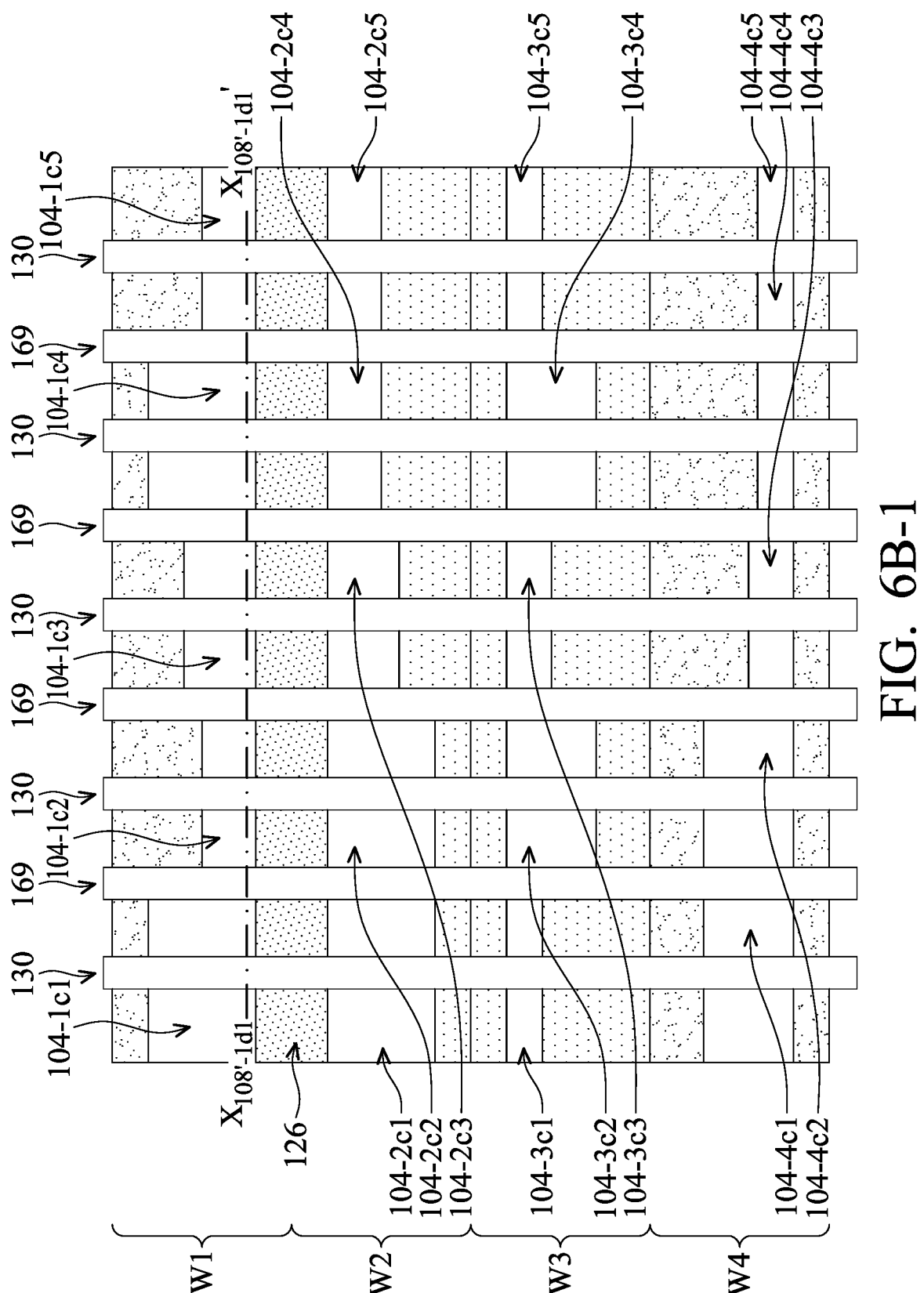
Figures 2, 6B:
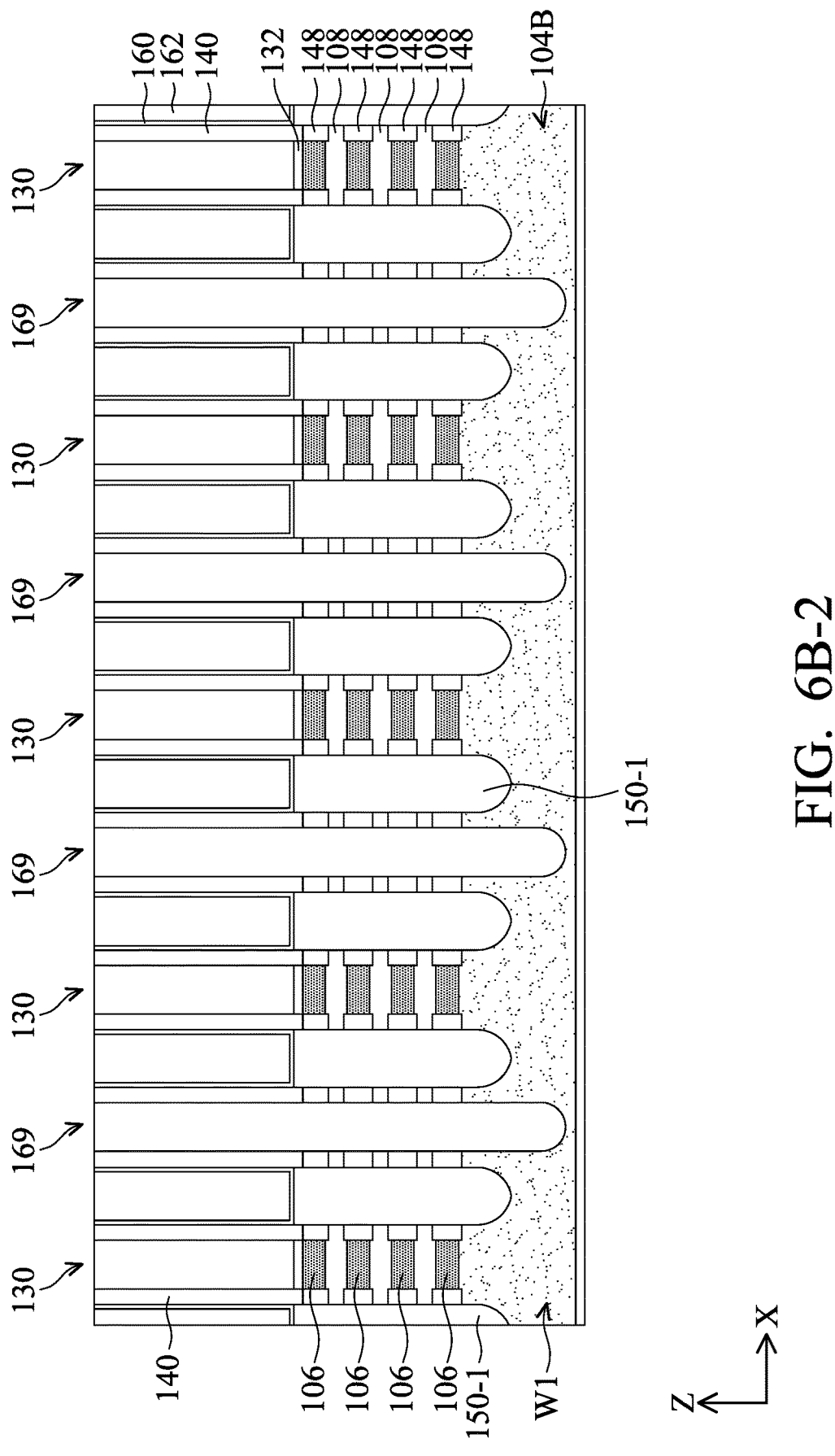
Figures 1, 6C:
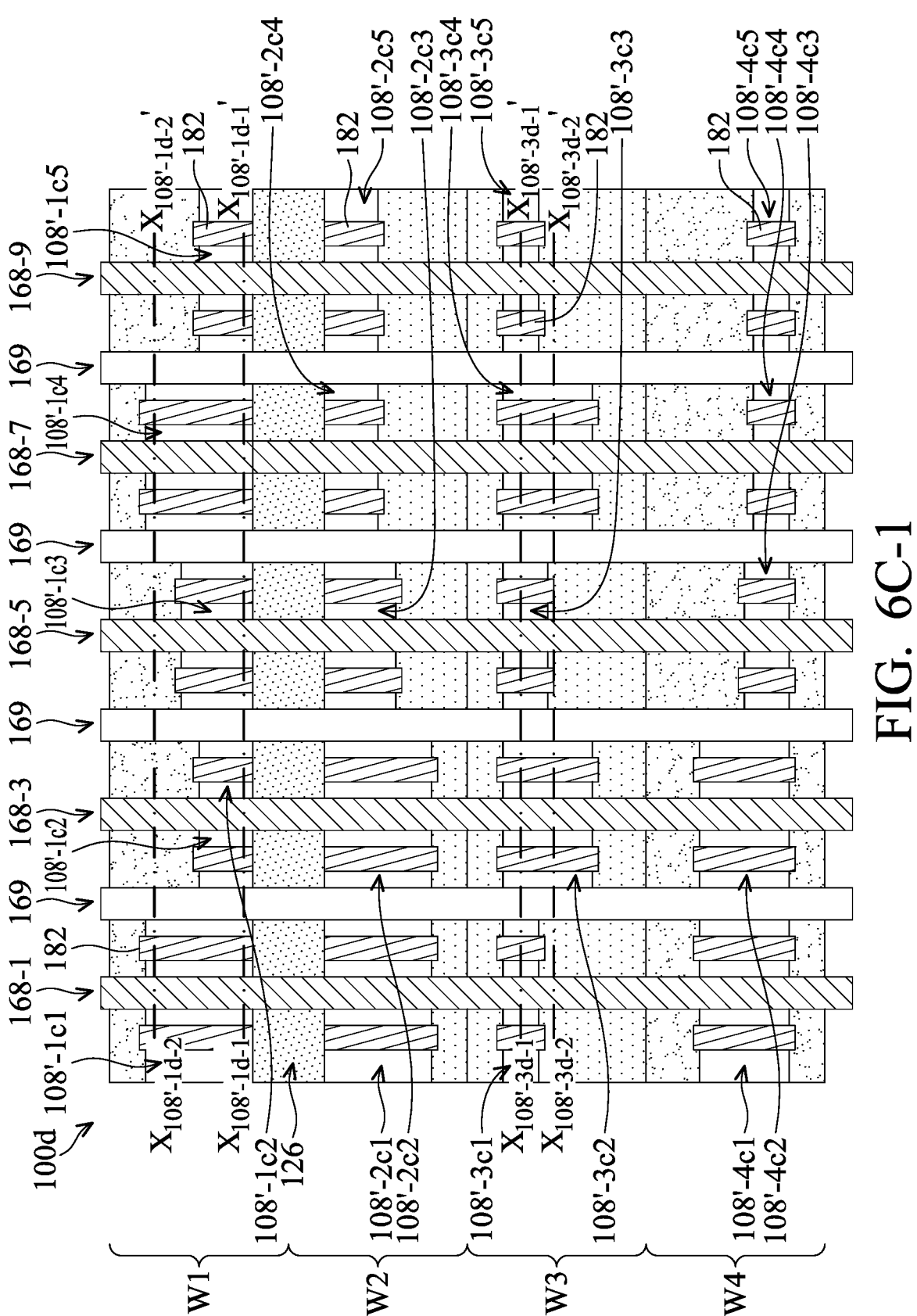
Figures 2, 6C:
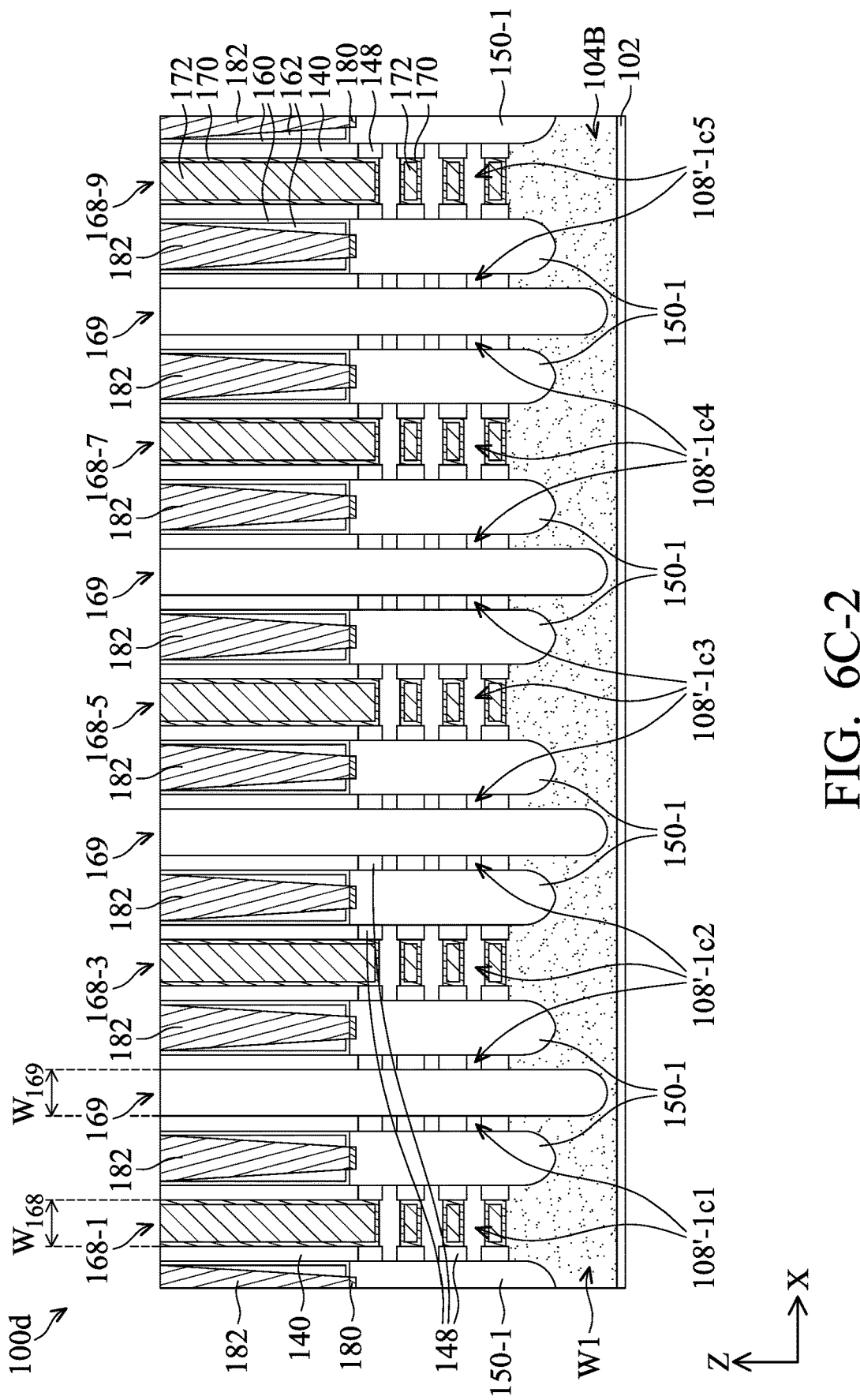
Figures 3, 6C:
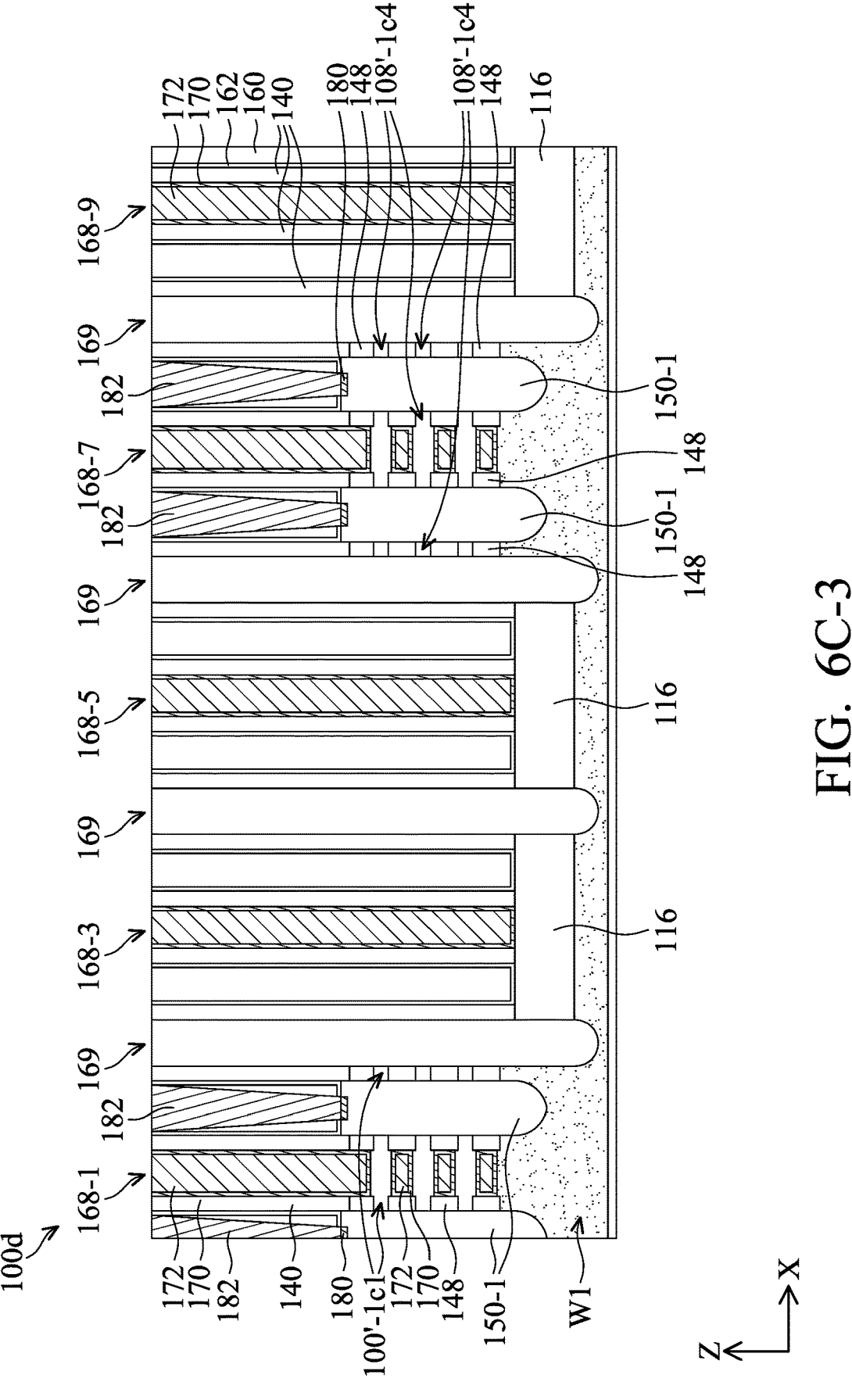
Figures 4, 6C:
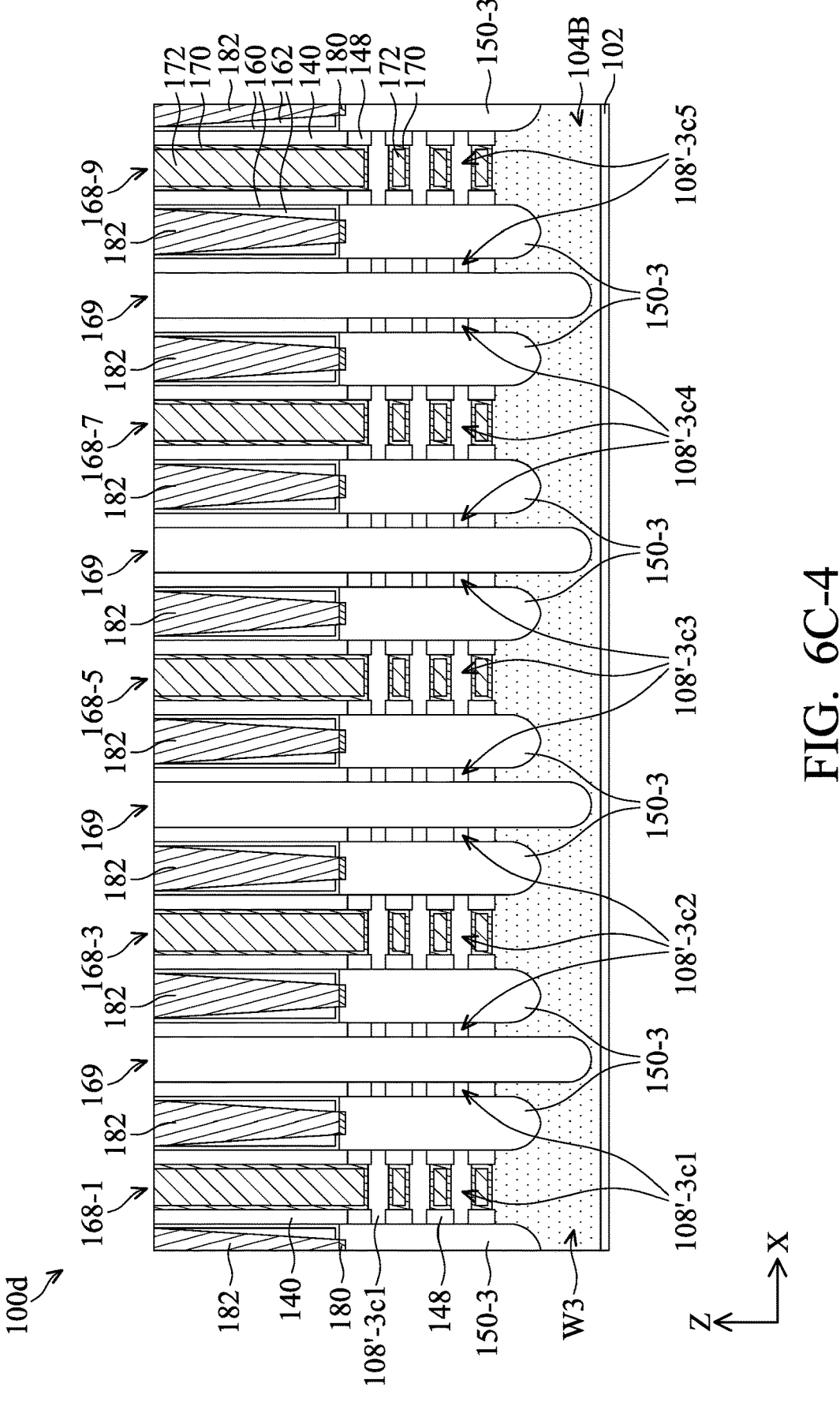

FIGS. 6A-1 to 6C-1 illustrate the top views of the intermediate stages of manufacturing a semiconductor structure 100*d* in accordance with some embodiments. FIGS. 6A-2 to 6C-2 illustrate the cross-sectional views of the intermediate stages of manufacturing the semiconductor structure 100*d* shown along lines $X_{108'-1d-1}$-$X_{108'-1d-1}$' (i.e. in the X direction) in FIGS. 6A-1 to 6C-1 in accordance with some embodiments.

The semiconductor structure 100*d* may be similar to the semiconductor structure 100*c* described previously, except some of the dummy gate structures are replaced with dielectric structures in accordance with some embodiments. Processes and materials for forming the semiconductor structure 100*d* may be similar to, or the same as, those for forming the semiconductor structure 100*c* described previously and are not repeated herein.

More specifically, the processes shown in FIGS. 2A-1 to 2J-1, 2A-2 to 2J-2, and 2A-3 to 2J-3 are performed to form dummy gate structures 130, and the dummy gate structures 130 formed over the boundaries of the unit cells are removed to form gate trenches 166*d*, as shown in FIGS. 6A-1 and 6A-2 in accordance with some embodiments. In addition, the first semiconductor material layers 106 and the second semiconductor material layers 108 and some portions of the first well region W1, the second well region W2, the third well region W3, and the fourth well region W4 under the gate trenches 166*d* are also removed in accordance with some embodiments. As shown in FIG. 6A-2, the inner spacers 148 and portions of the second semiconductor material layers 108 are exposed by the gate trenches 166*d* in accordance with some embodiments. The gate trenches 166*d* may be formed by performing multiple etching processes.

After the gate trenches 166*d* are formed, dielectric structures 169 are formed in the gate trenches 166*d*, as shown in FIGS. 6B-1 and 6B-2 in accordance with some embodiments. The dielectric structures 169 may be formed by depositing a dielectric material in the gate trenches 166*d*, and polishing the dielectric material until exposing the dummy gate structures 130. The dielectric material may be a low k material, such as $SiO_2$, SiN, SiCN, SiOC, SiOCN, or the like.

Figures 2, 2M, 3, 4:
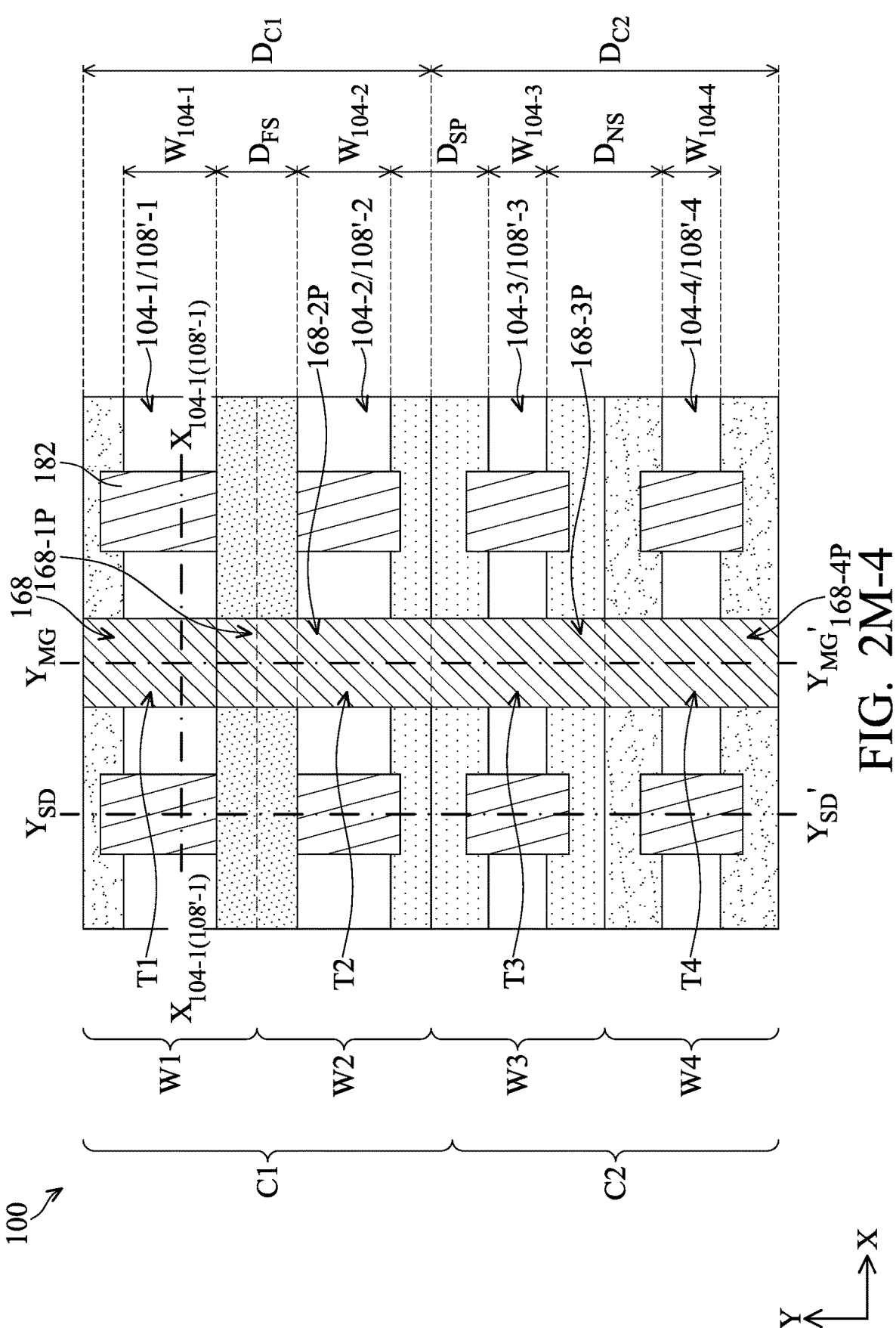
Figures 5, 6C:
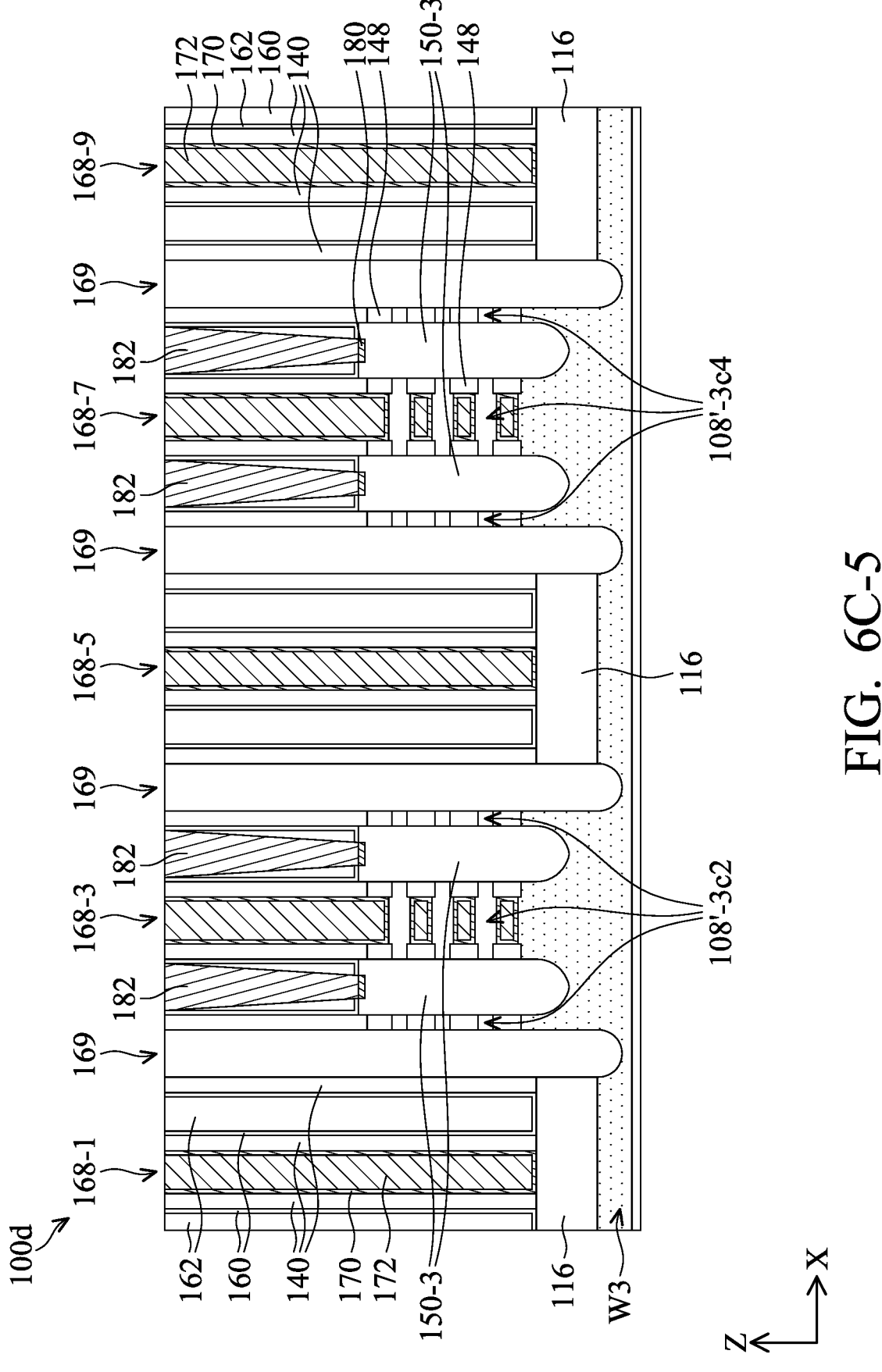

Afterwards, the processes shown in FIGS. 2K-1 to 2M-1, 2K-2 to 2M-2, and 2K-3 to 2M-3 are performed to form the semiconductor structure 100*d*, as shown in FIGS. 6C-1 and 6C-2 in accordance with some embodiments. FIG. 6C-3 illustrates the cross-sectional view of the semiconductor structure 100*d* shown along lines $X_{108'-1d-2}$-$X_{108'-1d-2}$' (i.e. in the X direction) in FIG. 6C-1 in accordance with some embodiments. FIG. 6C-4 illustrates the cross-sectional view of the semiconductor structure 100*d* shown along lines $X_{108'-3d-1}$-$X_{108'-3d-1}$' (i.e. in the X direction) in FIG. 6C-1 in accordance with some embodiments. FIG. 6C-5 illustrates the cross-sectional view of the semiconductor structure 100*d* shown along lines $X_{108'-3d-2}$-$X_{108'-3d-2}$' (i.e. in the X direction) in FIG. 6C-1 in accordance with some embodiments.

The dielectric structures 169 are configured to isolate the neighboring unit cells. That is, the dielectric structures 169 are laterally sandwiched between the neighboring channel structures (e.g. the channel structures 108'-1*c*1 and 108'-1*c*2). In some embodiments, the bottommost portions of the dielectric structures 169 are lower than the top surfaces of the first well region W1, the second well region W2, the third well region W3, and the fourth well region W4. In some embodiments, the bottommost portions of the dielectric structures 169 are higher than the bottom surfaces of the first well region W1, the second well region W2, the third well region W3, and the fourth well region W4 but is lower than the bottom surface of the isolation structure 116, as shown in FIGS. 6C-3 and 6C-5 in accordance with some embodiments. In some other embodiments, the dielectric structures 169 are higher than the bottom surface of the isolation structure 116. In some embodiments, the dielectric structures 169 and the isolation structure 116 are made of different materials.

Since the dielectric structures 169 are formed by replacing the dummy gate structures, the width $W_{169}$ of the dielectric structures 169 in the X direction is substantially equal to the widths $W_{168}$ of the gate structures 168-1, 168-3, 168-5, 168-7, and 168-9 in the X direction in accordance with some embodiments. In addition, the top surfaces of the dielectric structures 169 and the gate structures 168-1, 168-3, 168-5, 168-7, and 168-9 are substantially level with each other, while the bottom surfaces of the dielectric structures 169 are lower than the bottom surfaces of the gate structures 168-1, 168-3, 168-5, 168-7, and 168-9.

Figure 7:
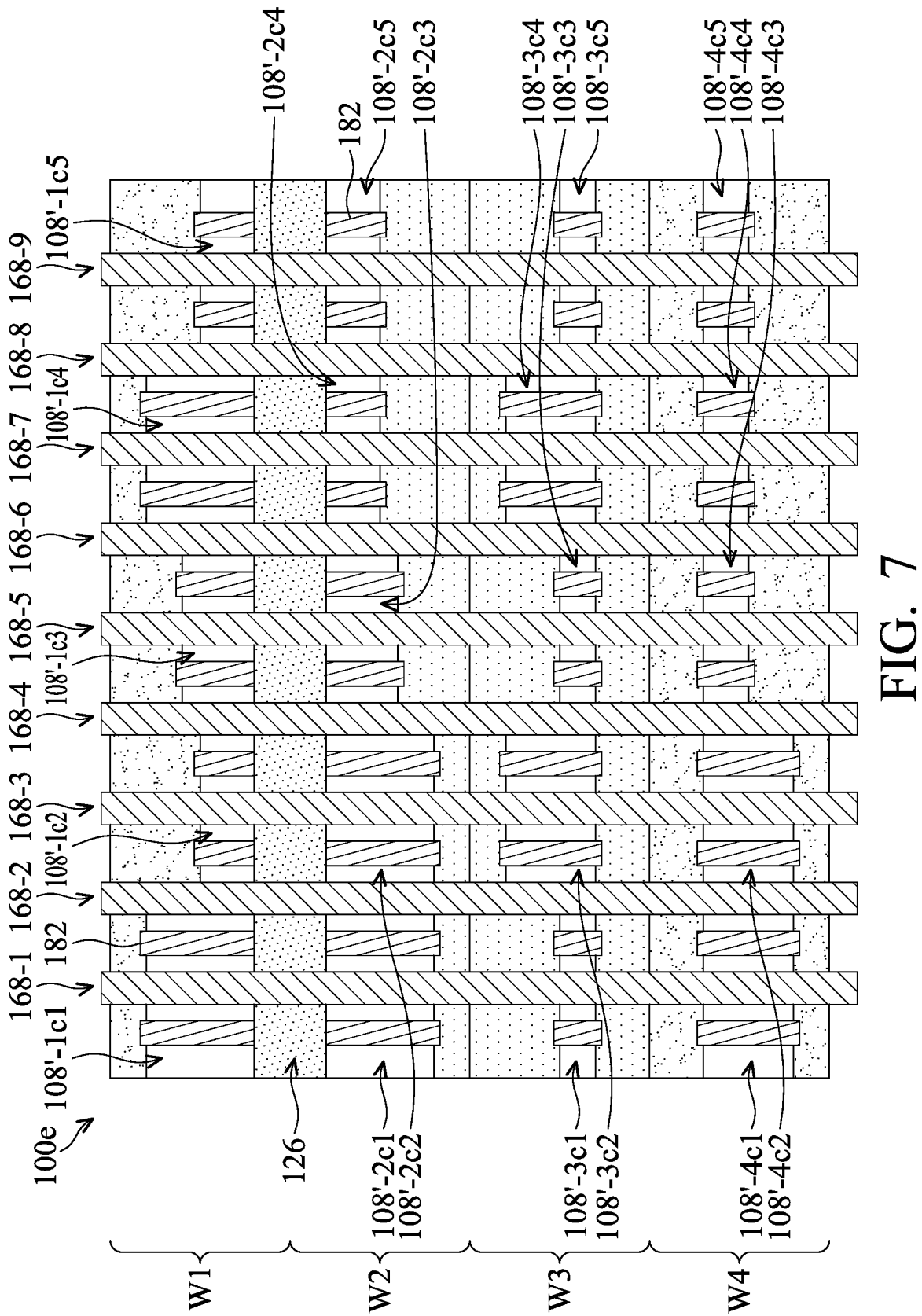
FIG. 7 illustrates a top view of a semiconductor structure in accordance with some embodiments.

FIG. 7 illustrates a top view of a semiconductor structure 100*e* in accordance with some embodiments. The semiconductor structure 100*e* may be similar to the semiconductor structure 100*c* described previously, except some of the location of the channel structures are different in accordance with some embodiments. Processes and materials for forming the semiconductor structure 100*e* may be similar to, or the same as, those for forming the semiconductor structure 100*c* described previously and are not repeated herein.

More specifically, structures in the first well region W1 and the second well region W2 in the semiconductor structure 100*e* may be the same as those in the semiconductor structures 100*c*. Meanwhile, the sidewalls of the channel structures 108'-3*c*1, 108'-3*c*2, 108'-3*c*3, 108'-3*c*4, and 108'-3*c*5 facing the four well region W4 are substantially aligned with each other in accordance with some embodiments. In addition, the sidewalls of the channel structures 108'-4*c*1, 108'-4*c*2, 108'-4*c*3, 108'-4*c*4, and 108'-4*c*5 facing the third well region W3 are substantially aligned with each other. That is, the distances between the channel structures in the third well region W3 and the channel structures in the fourth well region W4 in the Y direction in the second unit cells C2-1 to C2-5 are substantially the same in accordance with some embodiments.

Figure 8:
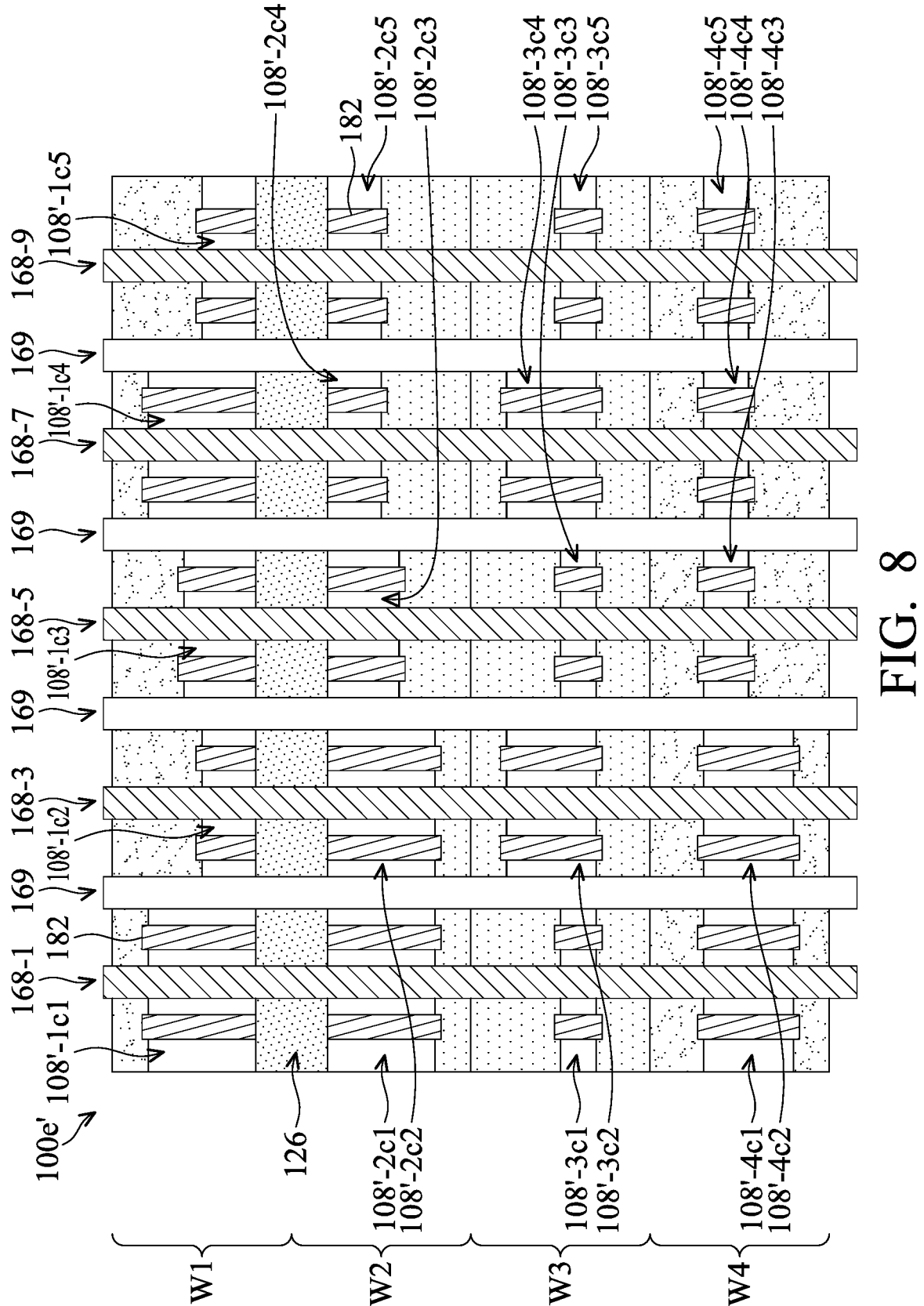
FIG. 8 illustrates a top view of a semiconductor structure in accordance with some embodiments.

FIG. 8 illustrates a top view of a semiconductor structure 100*e*' in accordance with some embodiments. The semiconductor structure 100*e*' may be similar to the semiconductor structure 100e described previously, except the dielectric structures 169 similar to those shown in FIGS. 6C-1, 6C-2, 6C-3, 6C-4, and 6C-5 are formed. Processes and materials for forming the semiconductor structure 100e' may be similar to, or the same as, those for forming the semiconductor structures 100e and 100d described previously and are not repeated herein.

Figures 9A, 9B, 9C, 9D:
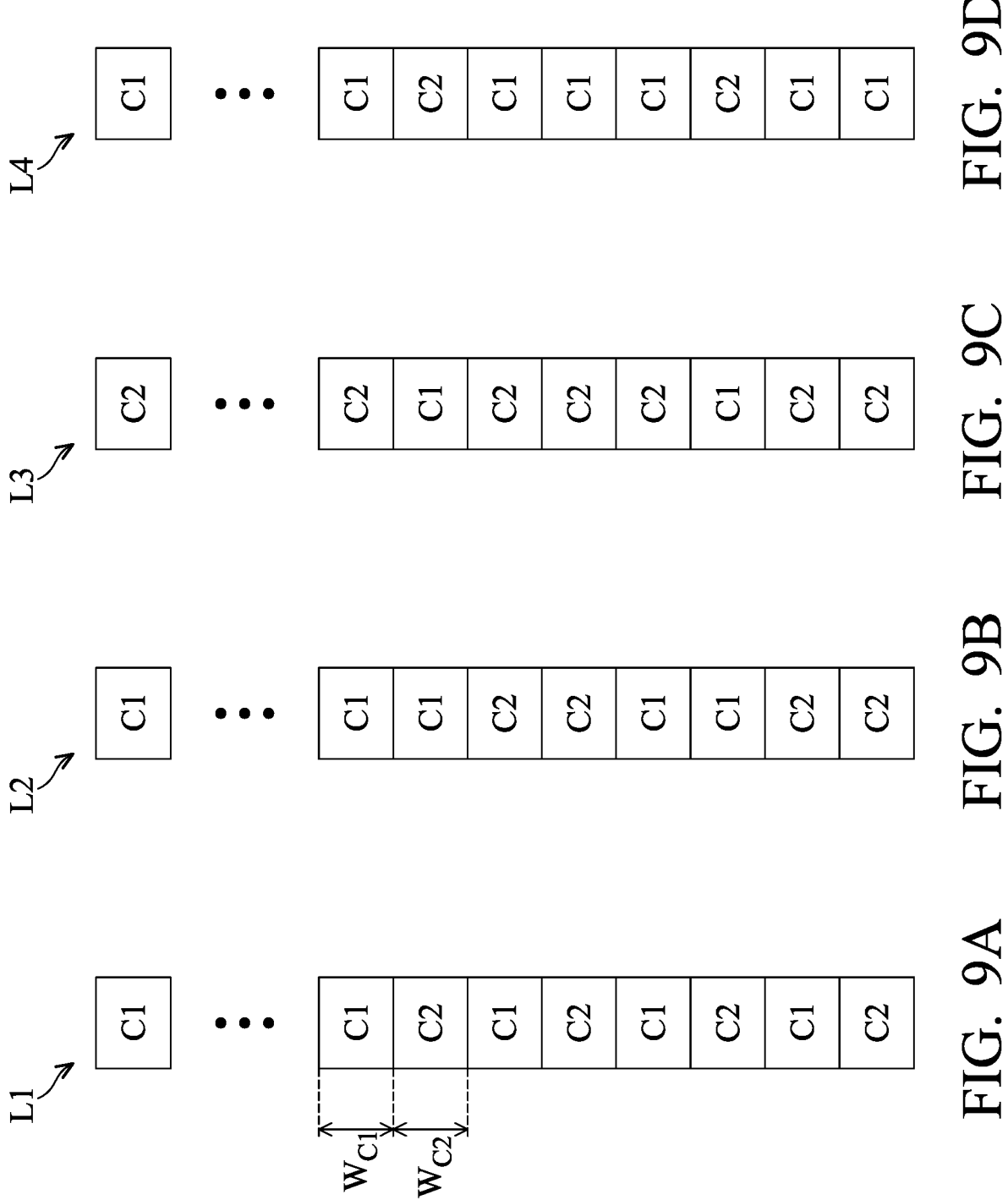
FIGS. 9A to 9D illustrate the layouts of the respective semiconductor devices, in accordance with some embodiments.

The first unit cells C1 and the second unit cells C2 described above may be arranged in various ways. FIGS. 9A to 9D illustrate layouts L1, L2, L3, and L4 of semiconductor devices respectively in accordance with some embodiments. In layout L1, one first unit cell C1 and one second unit cell C2 are alternately arranged along the Y direction, as shown in FIG. 9A in accordance with some embodiments. That is, each of the first unit cells C1 is sandwiched between two second unit cells C2 in layout L1 in accordance with some embodiments.

In layout L2, two first unit cells C1 and two second unit cells C2 are alternately arranged along the Y direction, as shown in FIG. 9B in accordance with some embodiments. That is, each of the first unit cells C1 is sandwiched between one second unit cell C2 and one first unit cell C1 in layout L2 in accordance with some embodiments.

In layout L3, one second unit cell C2, one first unit cell C1, and then two second unit cells C2 form a sequence that repeats in the Y direction, as shown in FIG. 9C in accordance with some embodiments. That is, each of the first unit cells C1 is sandwiched between two second unit cells C2 in layout L3 in accordance with some embodiments. In addition, the second unit cell C2 may be sandwiched between two second unit cells C2 or between one second unit cell C2 and one first unit cell C1 in layout L3 in accordance with some embodiments.

In layout L4, one first unit cell C1, one second unit cell C2, and then two first unit cells C1 form a sequence that repeats in the Y direction, as shown in FIG. 9D in accordance with some embodiments. That is, each of the second unit cells C2 is sandwiched between two first unit cells C1 in layout L4 in accordance with some embodiments. In addition, the first unit cell C1 may be sandwiched between two first unit cells C1 or between one second unit cell C2 and one first unit cell C1 in layout L4 in accordance with some embodiments.

The width $W_{C1}$ of the first unit cell C1 may be substantially equal to the width $W_{C2}$ of the second unit cell C2. Processes and materials for forming the first unit cells C1 and the second unit cells C2 shown in FIGS. 9A to 9D may be similar to, or the same as, those in semiconductor structures 100, 100a to 100e, and 100e' and are not repeated herein.

Figure 10:
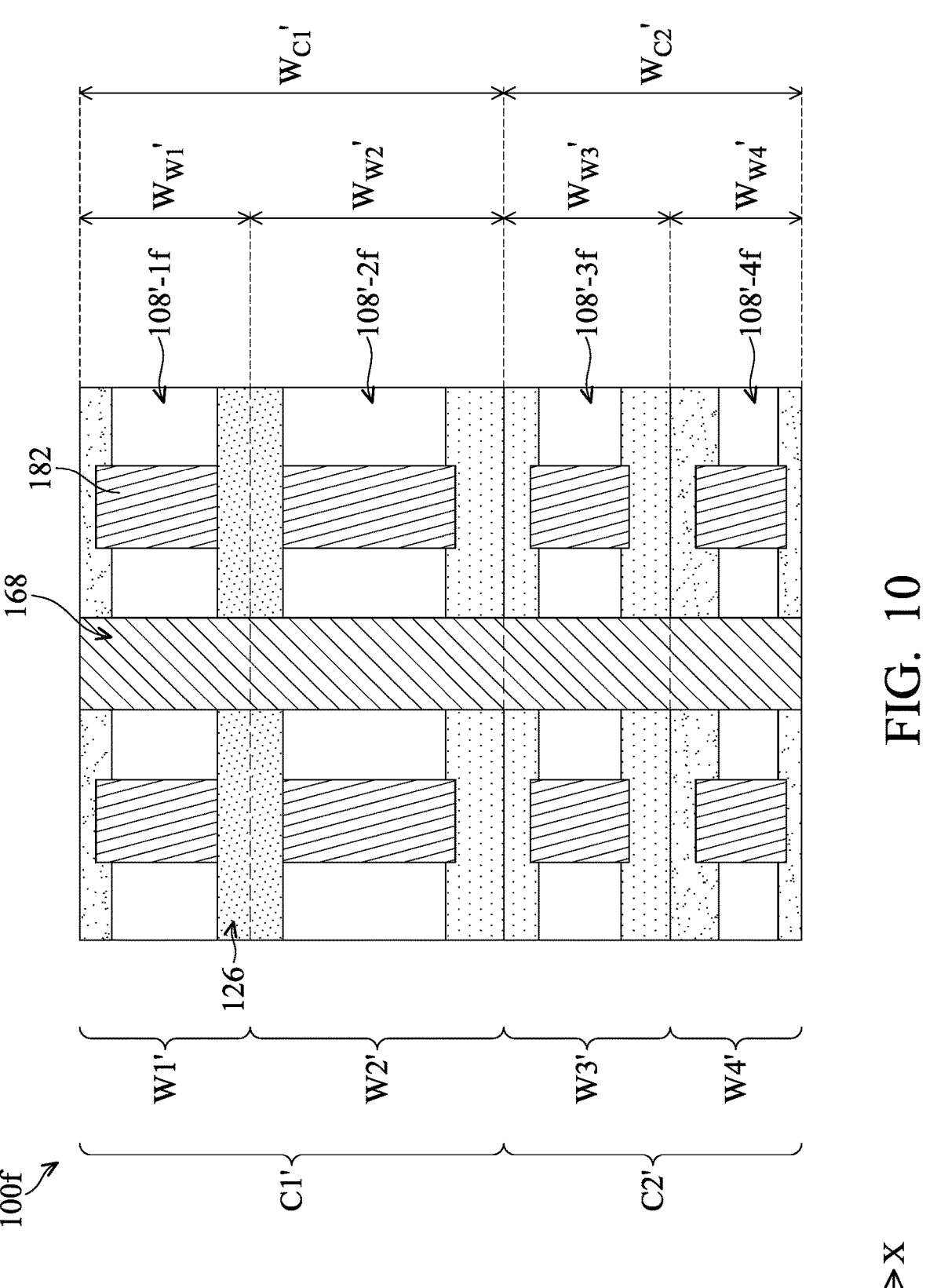
FIG. 10 illustrates a semiconductor structure in accordance with some embodiments.

The first unit cells C1 and the second unit cells C2 described above may have different widths in Y direction. FIG. 10 illustrates a semiconductor structure 100f in accordance with some embodiments. The semiconductor structure 100f may be similar to the semiconductor structure 100a described previously, except its first unit cell C1' is wider than its second unit cell C2' in accordance with some embodiments. More specifically, the semiconductor structure 100f includes a first well region W1', a second well region W2', a third well region W3', and a fourth well region W4' in accordance with some embodiments. In some embodiments, the width $W_{W2}$' of the second well region W2' is greater than the width $W_{W1}$' of the first well region W1'. In some embodiments, the width $W_{W1}$' of the first well region W1' is greater than the width $W_{W3}$' of the third well region W3'. In some embodiments, the width $W_{W3}$' of the third well region W3' is greater than the width $W_{W4}$' of the fourth well region W4'. In some embodiments, the first unit cell C1' has a width $W_{C1}$', which is equal to the sum of the width $W_{W1}$' of the first well region W1' and the width $W_{W2}$' of the second well region W2'. In some embodiments, the second unit cell C2' has a width $W_{C2}$' which is equal to the sum of the width $W_{W3}$' of the third well region W3' and the width $W_{W4}$' of the fourth well region W4'. In some embodiments, the width $W_{C1}$' is greater than the width $W_{C2}$' in accordance with some embodiments.

Processes and materials for forming the semiconductor structure 100f may be similar to, or the same as, those for forming the semiconductor structure 100a described previously and are not repeated herein. For example, the processes and materials for forming the first well region W1', the second well region W2', the third well region W3', the fourth well region W4', and the channel structures 108'-1f, 108'-2f, 108'-3f, and 108'-4f may be similar to, or the same as, those for forming the first well region W1, the second well region W2, the third well region W3, the fourth well region W4, and the channel structures 108'-1, 108'-2, 108'-3, and 108'-4 described previously.

Figures 11A, 11B, 11C, 11D:
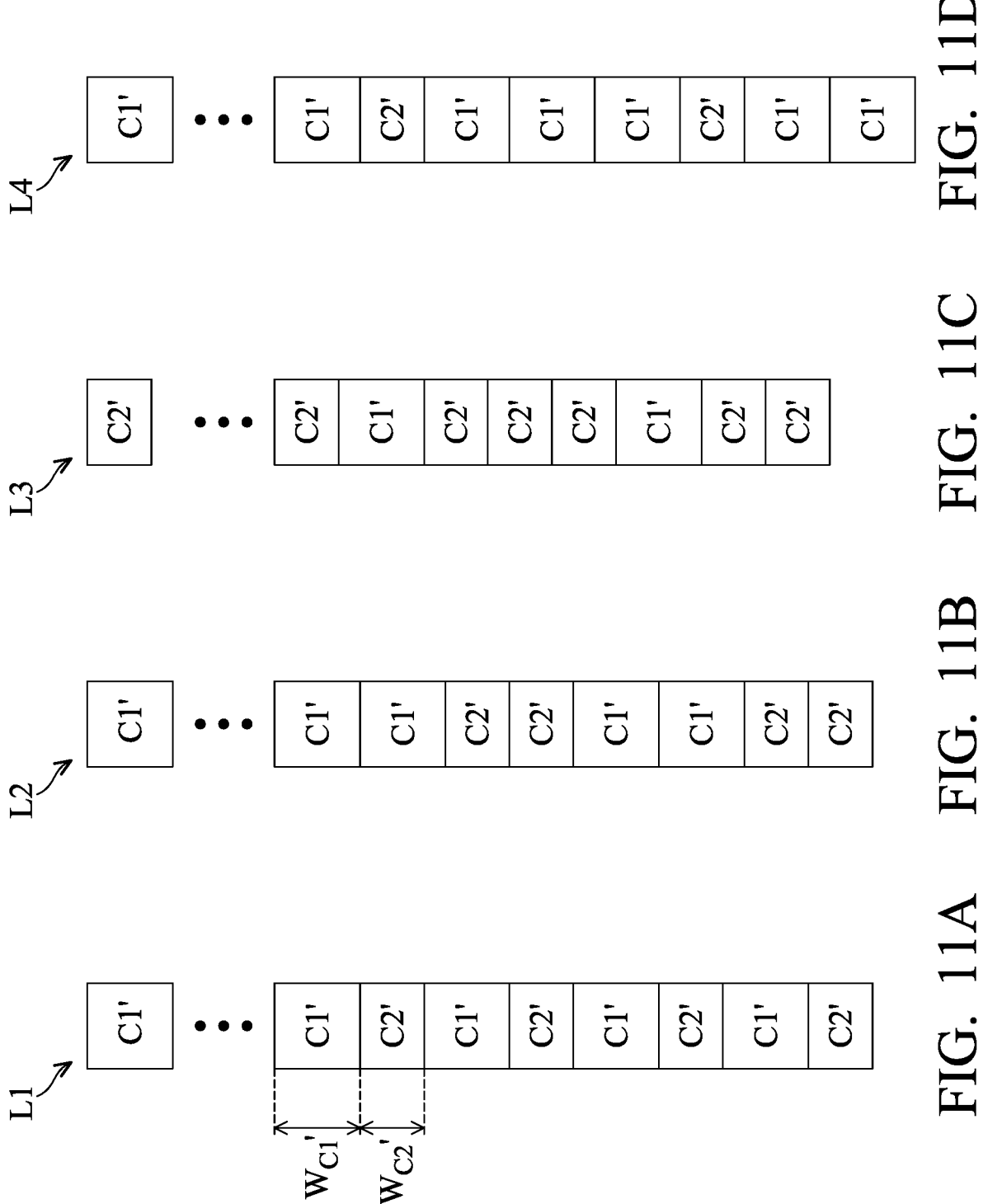
FIGS. 11A to 11D illustrate the respective layouts of the semiconductor devices, in accordance with some embodiments.

FIGS. 11A to 11D illustrate layouts L1', L2', L3', and L4' of semiconductor devices respectively in accordance with some embodiments. In layout L1', one first unit cell C1' and one second unit cell C2' are alternately arranged along the Y direction, as shown in FIG. 11A in accordance with some embodiments. In layout L2', two first unit cells C1' and two second unit cells C2' are alternately arranged along the Y direction, as shown in FIG. 11B in accordance with some embodiments. In layout L3', one second unit cell C2', one first unit cell C1', and then two second unit cells C2' form a sequence that repeats in the Y direction, as shown in FIG. 11C in accordance with some embodiments. In layout L4', one first unit cell C1', one second unit cell C2', and then two first unit cells C1' form a sequence that repeats in the Y direction, as shown in FIG. 9D in accordance with some embodiments. As described above, the width $W_{C1}$' of the first unit cell C1' is greater than the width $W_{C2}$' of the second unit cell C2' in accordance with some embodiments. Processes and materials for forming the first unit cells C1' and the second unit cells C2' shown in FIGS. 11A to 11D may be similar to, or the same as, those in semiconductor structures 100, 100a to 100e, and 100e' and are not repeated herein.

As described above, a semiconductor structure (e.g. the semiconductor structures 100, 100a, 100b, 100c, 100d, 100e, 100e', and 100f) may include a first type of channel structures (e.g. the channel structures 108'-1 and 108'-2) and a second type of channel structures (e.g. the channel structures 108'-3 and 108'-4) in accordance with some embodiments. The transistors requiring a lower power may be formed to have the first type of the channel structures, while the transistor requiring a higher speed may be formed to have the second type of the channel structures. That is, transistors having different performances may be formed in the same substrate.

In addition, the transistors may be grouped by their widths. For examples, the transistors with channel structures with relatively greater widths may be formed in the same well regions (e.g. in the first well region W1 and/or the second well region W2), while the transistors with channel structures with relatively smaller widths may be formed in the same well regions (e.g. in the third well region W3 and/or the fourth well region W4). Accordingly, the difference of the widths in a single well region may be limited to a relatively small value (e.g. smaller than 50 nm), so that addition isolation structures may not be required in the boundaries of the unit cells. Therefore, the complexity of the manufacturing processes may be reduced, and the total size of the resulting devices may also be reduced.

It should be noted that same elements in FIGS. 1A to 11D may be designated by the same numerals and may include materials that are the same or similar and may be formed by processes that are the same or similar; therefore such redundant details are omitted in the interests of brevity. In addition, although FIGS. 1A to 11D are described in relation to the method, it will be appreciated that the structures disclosed in FIGS. 1A to 11D are not limited to the method but may stand alone as structures independent of the method. Similarly, the methods shown in FIGS. 1A to 11D are not limited to the disclosed structures but may stand alone independent of the structures. Furthermore, the channel structures described above may include nanostructures such as nanowires, nanosheets, or other applicable nanostructures in accordance with some embodiments.

Also, while the disclosed methods are illustrated and described below as a series of acts or events, it should be appreciated that the illustrated ordering of such acts or events may be altered in some other embodiments. For example, some acts may occur in a different order and/or concurrently with other acts or events apart from those illustrated and/or described above. In addition, not all illustrated acts may be required to implement one or more aspects or embodiments of the description above. Furthermore, one or more of the acts depicted above may be carried out as one or more separate acts and/or phases.

Furthermore, the terms "approximately," "substantially," "substantial" and "about" used above account for small variations and may be varied in different technologies and be within the deviation range understood by the skilled in the art. For example, when used in conjunction with an event or circumstance, the terms can refer to instances in which the event or circumstance occurs precisely as well as instances in which the event or circumstance occurs in a close approximation.

Embodiments for forming semiconductor structures may be provided. The semiconductor structures may include first channel structures, second channel structures, the third channel structures, the fourth channel structures and a dielectric wall structure sandwiched between the first channel structures and the second channel structures, so that the distance between the first channel structures and the second channel structure may be smaller than the distance between the third channel structures and the fourth channel structures. The first channel structures and second channel structures may be wider than the third channel structures and the fourth channel structures. The transistor formed of the first channel structures and the second channel structures may have a higher speed, and the transistor formed of the third channel structures and the fourth channel structures may have a lower power consumption.

In some embodiments, a semiconductor structure is provided. The semiconductor structure includes a first well region, a second well region, a third well region, and a fourth well region formed in a substrate. In addition, the first well region and the fourth well region include first dopants, and the second well region and the third well region include second dopants different from the first dopants. The semiconductor structure includes a dielectric wall structure formed over a boundary of the first well region and the second well region and longitudinally oriented along a first direction and first channel structures, second channel structures, third channel structures, and fourth channel structures vertically suspended over the first well region, the second well region, the third well region, and the fourth well region respectively. In addition, the first channel structures are attached to a first sidewall surface of the dielectric wall structure, and the second channel structures are attached to a second sidewall surface of the dielectric wall structure. The semiconductor structure includes a first gate structure longitudinally oriented along a second direction being substantially orthogonal to the first direction. In addition, the first gate structure is in contact with three side surfaces of the first channel structures and three side surfaces of the second channel structures and is in contact with four side surfaces of the third channel structures and four side surfaces of the fourth channel structures from a cross-sectional view shown in the second direction. Furthermore, the second channel structures have a second width in the second direction, the third channel structures have a third width in the second direction, and the second width is greater than the third width.

In some embodiments, a semiconductor structure is provided. The semiconductor structure includes first unit cells. In addition, each of the first unit cells includes a dielectric wall structure longitudinally oriented along a first direction, first channel structures attached to a first sidewall surface of the dielectric wall structure, second channel structures attached to a second sidewall surface of the dielectric wall structure, and a first portion of a gate structure wrapping around the first channel structures, the dielectric wall structure, and the second channel structure and longitudinally oriented along a second direction different from the first direction. In addition, a top surface of the dielectric wall structure is higher than a topmost surface of the first channel structures. The semiconductor structure includes second unit cells aligned with the first unit cells in the second direction. Each of the second unit cells includes third channel structures, fourth channel structures spaced apart from the third channel structure in the second direction, and a second portion of the gate structure wrapping around the third channel structures and the fourth channel structures and longitudinally oriented along the second direction. In addition, the second channel structures are wider than the third channel structures in the second direction.

In some embodiments, a method for manufacturing a semiconductor structure is provided. The method for manufacturing the semiconductor structure includes forming a first well region, a second well region, a third well region, and a fourth well region in a substrate and stacking first semiconductor material layers and second semiconductor material layers to form a semiconductor stack over the substrate. The method for manufacturing the semiconductor structure also includes patterning the semiconductor stack and the substrate to form a first fin structure, a second fin structure, a third fin structure, and a fourth fin structure in the first well region, the second well region, the third well region, and the fourth well region, respectively. In addition, the first fin structure, the second fin structure, the third fin structure, and the fourth fin structure are longitudinally oriented along a first direction and are sequentially arranged in a second direction different from the first direction, and the second fin structure is wider than the third fin structure in the second direction. The method for manufacturing the semiconductor structure also includes forming a dielectric wall structure sandwiched between the first fin structure and the second fin structure over a boundary between the first well region and the second well region and removing the first semiconductor material layers of the first fin structure, the second fin structure, the third fin structure, and the fourth fin structure to form first channel structures, second channel structures, third channel structures, and fourth channel structures, respectively. The method for manufacturing the semiconductor structure also includes forming a gate structure wrapping around the first channel structures, the second channel structures, the third channel structures, and the fourth channel structures. In addition, a distance between the third channel structures and the fourth channel structures is greater than a width of the dielectric wall structure in the second direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first well region, a second well region, a third well region, and a fourth well region formed in a substrate, wherein the first well region and the fourth well region comprise first dopants, and the second well region and the third well region comprise second dopants different from the first dopants;
a dielectric wall structure formed over a boundary of the first well region and the second well region and longitudinally oriented along a first direction;
first channel structures, second channel structures, third channel structures, and fourth channel structures vertically suspended over the first well region, the second well region, the third well region, and the fourth well region respectively, wherein the first channel structures are attached to a first sidewall surface of the dielectric wall structure, and the second channel structures are attached to a second sidewall surface of the dielectric wall structure; and
a first gate structure longitudinally oriented along a second direction being substantially orthogonal to the first direction,
wherein the first channel structures have a first width in the second direction the second channel structures have a second width in the second direction, the third channel structures have a third width in the second direction, the second width is greater than the third width, and the first width is greater than the third width and smaller than the second width.

2. The semiconductor structure as claimed in claim 1, further comprising:
fifth channel structures attached to the first sidewall surface of the dielectric wall structure over the first well region; and
sixth channel structures attached to the second sidewall surface of the dielectric wall structure over the second well region,
wherein the sixth channel structures have a sixth width in the second direction, and the sixth width is different from the second width.

3. The semiconductor structure as claimed in claim 2, wherein a difference between the sixth width and the second width is smaller than 50 nm.

4. The semiconductor structure as claimed in claim 2, further comprising:

a second gate structure longitudinally oriented along the second direction and wrapping around the fifth channel structures and the sixth channel structures; and
a dielectric structure located between the first gate structure and the second gate structure and longitudinally oriented along the second direction,
wherein the dielectric structure is sandwiched between the first channel structures and the fifth channel structures.

5. The semiconductor structure as claimed in claim 4, wherein a top surface of the dielectric structure is substantially level with a top surface of the first gate structure and a top surface of the second gate structure.

6. The semiconductor structure as claimed in claim 1, further comprising:
a first isolation structure formed between the first channel structures and the second channel structures in the second direction in a top view;
a second isolation structure formed between the second channel structures and the third channel structures in the second direction in the top view; and
a third isolation structure formed between the third channel structures and the fourth channel structures in the second direction in the top view,
wherein a dimension of the first isolation structure in the second direction is smaller than a dimension of the second isolation structure in the second direction.

7. The semiconductor structure as claimed in claim 6, wherein the dimension of the first isolation structure in the second direction is smaller than a dimension of the third isolation structure in the second direction.

8. A method for manufacturing a semiconductor structure, comprising:
forming a first well region, a second well region, a third well region, and a fourth well region in a substrate;
stacking first semiconductor material layers and second semiconductor material layers to form a semiconductor stack over the substrate;
patterning the semiconductor stack and the substrate to form a first fin structure, a second fin structure, a third fin structure, and a fourth fin structure in the first well region, the second well region, the third well region, and the fourth well region, respectively, wherein the first fin structure, the second fin structure, the third fin structure, and the fourth fin structure are longitudinally oriented along a first direction and are sequentially arranged in a second direction different from the first direction, and the second fin structure is wider than the third fin structure in the second direction;
forming a dielectric wall structure sandwiched between the first fin structure and the second fin structure over a boundary between the first well region and the second well region;
removing the first semiconductor material layers of the first fin structure, the second fin structure, the third fin structure, and the fourth fin structure to form first channel structures, second channel structures, third channel structures, and fourth channel structures, respectively; and
forming a gate structure wrapping around the first channel structures, the second channel structures, the third channel structures, and the fourth channel structures,
wherein a distance between the third channel structures and the fourth channel structures is greater than a width of the dielectric wall structure in the second direction.

9. The method for manufacturing the semiconductor structure as claimed in claim 8, further comprising:

forming a first dummy gate structure and a second dummy gate structure across the first fin structure, the second fin structure, the third fin structure, and the fourth fin structure;

removing the second dummy gate structure to form a second gate trench;

removing the first semiconductor material layers and the second semiconductor material layers directly under the second gate trench;

filling a dielectric material in the second gate trench to form a dielectric structure; and replacing the first dummy gate structure with the gate structure.

10. The method for manufacturing the semiconductor structure as claimed in claim 8, further comprising:

forming a first isolation structure between the first fin structure and the second fin structure and a second isolation structure between the second fin structure and the third fin structure, wherein a dimension of a top surface of the second isolation structure is greater than the width of the dielectric wall structure in the second direction.

11. The method for manufacturing the semiconductor structure as claimed in claim 10, wherein a top surface of the dielectric wall structure is higher than a top surface of the first fin structure and a top surface of the second fin structure, and a bottom surface of the dielectric wall structure is in contact with a top surface of the first isolation structure.

12. The method for manufacturing the semiconductor structure as claimed in claim 8, further comprising:

doping first dopants in the substrate to form the first well region and the fourth well region; and doping second dopants in the substrate to form the second well region and the third well region, wherein the first dopants are different from the second dopants, and a sum of a first width of the first well region and a second width of the second well region is greater than a sum of a third width of the third well region and a fourth width of the fourth well region.

13. A semiconductor structure, comprising:

a first well region, a second well region, a third well region, and a fourth well region formed in a substrate, wherein the first well region and the fourth well region comprise first dopants, and the second well region and the third well region comprise second dopants different from the first dopants;

a dielectric wall structure formed over a boundary of the first well region and the second well region and longitudinally oriented along a first direction;

first channel structures, second channel structures, third channel structures, and fourth channel structures vertically suspended over the first well region, the second well region, the third well region, and the fourth well region respectively, wherein the first channel structures are attached to a first sidewall surface of the dielectric wall structure, and the second channel structures are attached to a second sidewall surface of the dielectric wall structure; and a first gate structure longitudinally oriented along a second direction being substantially orthogonal to the first direction, wherein the first channel structures have a first width in the second direction the second channel structures have a second width in the second direction, the third channel structures have a third width in the second direction, the fourth channel structures have a fourth width in the second direction, the second width is greater than the third width, and the first width is greater than the fourth width and smaller than the third width.

14. The semiconductor structure as claimed in claim 13, further comprising:

fifth channel structures attached to the second sidewall surface of the dielectric wall structure over the second well region, wherein the fifth channel structures have a fifth width in the second direction, and the fifth width is different from the second width.

15. The semiconductor structure as claimed in claim 14, wherein a difference between the fifth width and the second width is smaller than 50 nm.

16. The semiconductor structure as claimed in claim 14, further comprising:

sixth channel structures attached to the first sidewall surface of the dielectric wall structure over the first well region;

a second gate structure longitudinally oriented along the second direction and wrapping around the fifth channel structures and the sixth channel structures; and a dielectric structure located between the first gate structure and the second gate structure and longitudinally oriented along the second direction, wherein the dielectric structure is sandwiched between the first channel structures and the sixth channel structures.

17. The semiconductor structure as claimed in claim 16, wherein a top surface of the dielectric structure is substantially level with a top surface of the first gate structure and a top surface of the second gate structure.

18. The semiconductor structure as claimed in claim 14, further comprising:

a second gate structure longitudinally oriented along the second direction and wrapping around the fifth channel structures; and a dielectric structure located between the first gate structure and the second gate structure and longitudinally oriented along the second direction.

19. The semiconductor structure as claimed in claim 13, further comprising:

a first isolation structure formed between the first channel structures and the second channel structures in the second direction in a top view; and a second isolation structure formed between the second channel structures and the third channel structures in the second direction in the top view, wherein a dimension of the first isolation structure in the second direction is smaller than a dimension of the second isolation structure in the second direction.

20. The semiconductor structure as claimed in claim 19, further comprising:

a third isolation structure formed between the third channel structures and the fourth channel structures in the second direction in the top view, wherein the dimension of the first isolation structure in the second direction is smaller than a dimension of the third isolation structure in the second direction.

* * * * *